United States Patent
Koplow

(10) Patent No.: US 8,988,881 B2
(45) Date of Patent: Mar. 24, 2015

(54) HEAT EXCHANGER DEVICE AND METHOD FOR HEAT REMOVAL OR TRANSFER

(75) Inventor: Jeffrey P. Koplow, San Ramon, CA (US)

(73) Assignee: Sandia Corporation, Albuquerque, NM (US)

(*) Notice: Subject to any disclaimer, the term of this patent is extended or adjusted under 35 U.S.C. 154(b) by 0 days.

(21) Appl. No.: 12/856,440

(22) Filed: Aug. 13, 2010

(65) Prior Publication Data

US 2011/0103011 A1 May 5, 2011

Related U.S. Application Data

(63) Continuation-in-part of application No. 12/732,662, filed on Mar. 26, 2010, which is a continuation of application No. PCT/US2009/044550, filed on May 19, 2009, which is a continuation-in-part of application No. 12/185,570, filed on Aug. 4, 2008.

(60) Provisional application No. 61/164,188, filed on Mar. 27, 2009, provisional application No. 61/008,271, filed on Dec. 18, 2007.

(51) Int. Cl.
| | |
|---|---|
| H05K 7/20 | (2006.01) |
| F04D 25/06 | (2006.01) |
| F04D 29/58 | (2006.01) |
| F28F 3/02 | (2006.01) |
| F28F 13/12 | (2006.01) |
| H01L 23/467 | (2006.01) |
| F28D 21/00 | (2006.01) |

(52) U.S. Cl.
CPC ........ *F04D 25/0606* (2013.01); *F04D 25/0613* (2013.01); *F04D 25/066* (2013.01); *F04D 29/582* (2013.01); *F04D 29/5853* (2013.01); *F28F 3/02* (2013.01); *F28F 13/125* (2013.01); *H01L 23/467* (2013.01); *H05K 7/20163* (2013.01); *F28D 2021/0029* (2013.01); *H01L 2924/0002* (2013.01)
USPC ...... 361/707; 361/691; 361/701; 165/104.33; 165/122

(58) Field of Classification Search
USPC ........................ 361/676–678, 679.46–679.54, 361/688–722, 726, 728, 732, 760–761, 829, 361/831
See application file for complete search history.

(56) References Cited

U.S. PATENT DOCUMENTS

| | | | |
|---|---|---|---|
| 3,376,083 A | | 4/1968 | Albertus |
| 3,844,341 A | * | 10/1974 | Bimshas et al. ................ 165/86 |

(Continued)

FOREIGN PATENT DOCUMENTS

| | | |
|---|---|---|
| CN | 1987661 A | 6/2007 |
| EP | 0 029 667 A1 | 6/1981 |

(Continued)

OTHER PUBLICATIONS

PCT/US2009/044550; Written Opinion.
Satomi, et al., "Design Optimization of Spirally Grooved Thrust Air Bearings for Polygon Mirror Laser Scanners", The Japan Society of Mechanical Engineers, Series C, Sep. 15, 1993, pp. 393-399, vol. 36 No. 3.

(Continued)

*Primary Examiner* — Courtney Smith
(74) *Attorney, Agent, or Firm* — Dorsey & Whitney LLP

(57) ABSTRACT

Systems and methods for a forced-convection heat exchanger are provided. In one embodiment, heat is transferred to or from a thermal load in thermal contact with a heat conducting structure, across a narrow air gap, to a rotating heat transfer structure immersed in a surrounding medium such as air.

24 Claims, 23 Drawing Sheets

(56) References Cited

U.S. PATENT DOCUMENTS

| | | | |
|---|---|---|---|
| 4,125,375 A | 11/1978 | Hunter | |
| 4,156,570 A | 5/1979 | Wardlaw | |
| 4,164,690 A | 8/1979 | Muller et al. | |
| 4,282,464 A | 8/1981 | Uzuka | |
| 4,380,355 A * | 4/1983 | Beardmore | 384/123 |
| 4,683,579 A | 7/1987 | Wardlaw | |
| 5,000,254 A | 3/1991 | Williams | 165/85 |
| 5,197,858 A | 3/1993 | Cheng | |
| 5,296,775 A | 3/1994 | Cronin et al. | |
| 5,297,623 A | 3/1994 | Ogushi et al. | |
| 5,335,143 A | 8/1994 | Maling, Jr. et al. | 361/694 |
| 5,422,787 A | 6/1995 | Gourdine | |
| 5,583,746 A | 12/1996 | Wang | |
| 5,616,974 A | 4/1997 | Yamada | |
| 5,635,362 A | 6/1997 | Levine et al. | |
| 5,727,928 A | 3/1998 | Brown | |
| 5,736,787 A | 4/1998 | Larimer | 257/732 |
| 5,794,687 A * | 8/1998 | Webster et al. | 165/121 |
| 5,957,659 A | 9/1999 | Amou et al. | |
| 5,963,887 A | 10/1999 | Giorgio | |
| 5,979,541 A | 11/1999 | Saito | |
| 6,050,326 A | 4/2000 | Evans et al. | |
| 6,078,468 A | 6/2000 | Fiske | 360/104 |
| 6,153,579 A | 11/2000 | Kim et al. | |
| 6,175,495 B1 | 1/2001 | Batchelder | |
| 6,194,798 B1 | 2/2001 | Lopatinsky | |
| 6,249,071 B1 | 6/2001 | Lopatinsky et al. | |
| 6,319,469 B1 | 11/2001 | Mian et al. | |
| 6,356,435 B1 | 3/2002 | Davis et al. | 361/678 |
| 6,379,974 B1 | 4/2002 | Parce et al. | |
| 6,392,720 B1 | 5/2002 | Kim | |
| 6,457,955 B1 | 10/2002 | Cheng | |
| 6,502,989 B1 * | 1/2003 | Takeuchi et al. | 384/100 |
| 6,525,938 B1 | 2/2003 | Chen | |
| 6,545,438 B1 | 4/2003 | Mays, II | |
| 6,619,385 B2 | 9/2003 | Watanabe et al. | |
| 6,623,860 B2 | 9/2003 | Hu et al. | |
| 6,638,408 B1 | 10/2003 | Speicher et al. | |
| 6,659,169 B1 | 12/2003 | Lopatinsky et al. | |
| 6,664,673 B2 | 12/2003 | Lopatinsky et al. | |
| 6,685,809 B1 | 2/2004 | Jacobson et al. | |
| 6,860,323 B2 | 3/2005 | Cheng | 165/121 |
| 6,873,069 B1 | 3/2005 | Odagiri et al. | |
| 6,876,550 B2 | 4/2005 | Sri-Jayantha et al. | 361/699 |
| 6,879,120 B2 | 4/2005 | Xi | |
| 6,885,555 B2 | 4/2005 | Greco | |
| 6,887,384 B1 | 5/2005 | Frechet et al. | |
| 6,955,215 B2 * | 10/2005 | Al-Garni et al. | 165/185 |
| 6,960,449 B2 | 11/2005 | Wang et al. | |
| 6,966,357 B1 | 11/2005 | Herbert | |
| 7,021,894 B2 | 4/2006 | Lopatinsky et al. | |
| 7,033,747 B2 | 4/2006 | Gordon et al. | |
| 7,035,102 B2 | 4/2006 | Holmes et al. | 361/695 |
| 7,044,202 B2 * | 5/2006 | Lopatinsky et al. | 165/122 |
| 7,055,581 B1 * | 6/2006 | Roy | 165/104.33 |
| 7,071,587 B2 | 7/2006 | Lopatinsky et al. | |
| 7,100,677 B2 | 9/2006 | Lee et al. | |
| 7,134,839 B2 | 11/2006 | Horng et al. | |
| 7,136,285 B1 | 11/2006 | Herbert | |
| 7,157,049 B2 | 1/2007 | Valencia et al. | |
| 7,165,938 B2 | 1/2007 | Lee et al. | |
| 7,265,975 B2 | 9/2007 | Tsai | 361/698 |
| 7,267,526 B2 | 9/2007 | Hsu et al. | |
| 7,273,091 B2 | 9/2007 | Bahl et al. | |
| 7,301,771 B2 * | 11/2007 | Hata et al. | 361/699 |
| 7,304,845 B2 | 12/2007 | Xia et al. | 361/697 |
| 7,312,085 B2 | 12/2007 | Chou et al. | |
| 7,324,339 B2 | 1/2008 | Foster, Sr. et al. | 361/697 |
| 7,349,212 B2 | 3/2008 | Xia et al. | 361/697 |
| 7,381,027 B2 | 6/2008 | Kaneko et al. | |
| 7,455,501 B2 | 11/2008 | Horng et al. | |
| 7,458,413 B2 * | 12/2008 | Mok | 165/11.1 |
| 7,481,263 B2 | 1/2009 | Breier et al. | |
| 7,520,314 B2 | 4/2009 | Hwang | |
| 7,667,969 B2 | 2/2010 | Khanna | |
| 7,670,102 B2 | 3/2010 | Chang et al. | |
| 7,695,256 B2 | 4/2010 | Horng et al. | |
| 7,758,810 B2 | 7/2010 | Lee et al. | |
| 7,836,939 B2 | 11/2010 | Zimmerman et al. | |
| 7,896,611 B2 | 3/2011 | Khanna et al. | |
| 7,900,690 B2 | 3/2011 | Hawwa et al. | |
| 7,905,712 B2 | 3/2011 | Huang | |
| 8,337,775 B2 | 12/2012 | Pugia et al. | |
| 2001/0055812 A1 | 12/2001 | Mian et al. | |
| 2002/0090307 A1 | 7/2002 | Cheng | |
| 2002/0098535 A1 | 7/2002 | Wang et al. | |
| 2002/0153251 A1 | 10/2002 | Sassi et al. | |
| 2002/0164659 A1 | 11/2002 | Rao et al. | |
| 2002/0170825 A1 | 11/2002 | Lee et al. | |
| 2003/0013203 A1 | 1/2003 | Jedrzejewski et al. | |
| 2003/0124719 A1 | 7/2003 | Woodside | |
| 2003/0203504 A1 | 10/2003 | Hefti | |
| 2003/0221963 A1 | 12/2003 | Bjellqvist et al. | |
| 2004/0035556 A1 | 2/2004 | Jean | |
| 2004/0072278 A1 | 4/2004 | Chou et al. | |
| 2004/0109291 A1 | 6/2004 | Kannmacher et al. | 361/704 |
| 2004/0114327 A1 | 6/2004 | Sri-Jayantha et al. | |
| 2004/0119354 A1 | 6/2004 | Takada et al. | |
| 2005/0002163 A1 | 1/2005 | Lopatinsky et al. | |
| 2005/0054978 A1 | 3/2005 | Setal et al. | |
| 2005/0087445 A1 | 4/2005 | Speicher et al. | |
| 2005/0117298 A1 * | 6/2005 | Koga et al. | 361/699 |
| 2005/0195573 A1 | 9/2005 | Huang | 361/709 |
| 2005/0274490 A1 * | 12/2005 | Larson | 165/80.3 |
| 2006/0007656 A1 * | 1/2006 | Symons | 361/699 |
| 2006/0021735 A1 | 2/2006 | Lopatinsky et al. | |
| 2006/0171654 A1 | 8/2006 | Hawkins et al. | |
| 2006/0191792 A1 | 8/2006 | Herr et al. | |
| 2007/0000268 A1 * | 1/2007 | Crocker et al. | 62/259.2 |
| 2007/0041158 A1 | 2/2007 | Hornung | 361/695 |
| 2007/0196203 A1 * | 8/2007 | Chang et al. | 415/122.1 |
| 2007/0231419 A1 | 10/2007 | Pelcz et al. | |
| 2008/0069706 A1 | 3/2008 | Huang | |
| 2008/0149484 A1 | 6/2008 | Tolley et al. | |
| 2009/0145584 A1 | 6/2009 | Walsh et al. | |
| 2009/0166004 A1 | 7/2009 | Lai et al. | |
| 2010/0068754 A1 | 3/2010 | Kirakossian | |
| 2010/0151560 A1 | 6/2010 | Wo et al. | |
| 2010/0177480 A1 * | 7/2010 | Koplow | 361/697 |
| 2010/0328887 A1 * | 12/2010 | Refai-Ahmed et al. | 361/697 |
| 2011/0103011 A1 | 5/2011 | Koplow | |

FOREIGN PATENT DOCUMENTS

| | | |
|---|---|---|
| JP | 0407169887 A | 7/1995 |
| JP | 2000-054978 | 2/2000 |
| JP | 02000341902 A | 12/2000 |
| JP | 2003-317745 A | 1/2003 |
| JP | 2006-037918 | 2/2006 |
| WO | WO01/68225 A1 | 9/2001 |
| WO | WO 2006117578 A1 | 11/2006 |
| WO | 2009/098237 A1 | 8/2009 |
| WO | 2010/016963 A1 | 2/2010 |

OTHER PUBLICATIONS

Abi-Samira, K. et al., "Infrared Controlled Waxes for Liquid-Handling and Storage on a CD-Microfluidic Platform", The Royal Society of Chemistry, Lab Chip, 2011, pp. 723-726.

Agrawal, G., "Foil Air/Gas Bearing Technology—An Overview", American Society of Mechanical Engineers, 1997, Publication 97-GT-347, pp. 1-11.

Air Bearing Application and Design Guide, Rev. D, 2003, New Way Precision—Porous Media Air Bearing Solutions, www.newwayprecision.com, pp. 1-63.

Albrecht, J W. et al., "Micro Free-Flow IEF Enhanced by Active Cooling and Functionalized Gels", Electrophoresis, 2006, pp. 4960-4969, vol. 27.

Amersham, M. "Percoll: Methodology and Applications", 2001, pp. 1-84.

Baldwin, Robert L., "How Hofmeister Ion Interactions Affect Protein Stability," Biophysical Journal, vol. 71, Oct. 1996, pp. 2056-2063.

(56) References Cited

OTHER PUBLICATIONS

Boyko, M. et al., "Cell-Free DNA—A Marker to Predict Ischemic Brain Damage in a Rat Stroke Experimental Model," J. Neurosurg. Anesthesiol. vol. 23, No. 3, Jul. 2011, pp. 222-228.
Cabrera, C R. et al., "Formation of Natural pH Gradients in a Microfluidic Device under Flow Conditions: Model and Experimental Validation", Analytical Chemistry, 2001, pp. 658-666, vol. 73.
Carney, J. "Rapid Diagnostic Testws Employing Latex Particles," Analytical Proceedings, Apr. 1990, pp. 27:99-100.
Cobb and Saunders., "Heat transfer from a rotating disk", Proceedings of the Royal Society of London, Series A, Mathmatical and Physical Sciences, 1956, 236 (1206), pp. 124-130.
Cui, Huanchun et al., "Multistage Isoelectric Focusing in a Polymeric Microfluidic Chip", Analytical Chemistry, Dec. 15, 2005, pp. 7878-7886, vol. 77, No. 24.
Curtis, R.A. et al., "A Molecular Approach to Bioseparations: Protein-Protein and Protein-Salt Interactions," Chemical Engineering Science, 2006, vol. 61, pp. 907-923.
Czeiger, D. et al., "Measurement of Circulating Cell-Free DNA Levels by a New Simple Fluorescent Test in Patients with Primary Colorectal Cancer," Am. J. Clin. Pathol., 2011, vol. 135, pp. 264-270.
Das, C., et al. "Effects of Separation Length and Voltage on Isoelectric Focusing in a Plastic Microfluidic Device", Electrophoresis, 2006, pp. 3619-3626, vol. 27.
Folgea, D. et al., "Detecting Single Stranded DNA with a Solid State Nanopore", Nano Letters, 2005, vol. 5, No. 10, pp. 1905-1909.
Fuller, D., "A Review of the State-of-the-Art for the Design of Self-Acting Gas-Lubricated Bearings", Journal of Lubrication Technology, 1969, 91, pp. 1-16.
Glorikian, H. et al., "Overview of Microfluidic Applications IN IVDS", DX Direction 1, 2010, pp. 12-16.
Goldshtein, H., et al., "A Rapid Direct Fluorescent Assay for Cell-Free DNA Quantification in Biological Fluids," Annals of Clinical Biochemistry, 209, vol. 46, pp. 488-494.
Golorkian, H. et al., "Smart-Consumables Product Development Strategy: Implications for Molecular Diagnostics", DX Direction, 2010, 12-16.
Gorg, A. et al., "Recent Developments in Two-Dimensional Gel Electrophoresis with Immobilized pH Gradients: Wide pH Gradients Up To pH 12, Longer Separation Distances and Simplified Procedures", Electrophoresis, vol. 20, 1999, pp. 712-717.
Gorg, A. et al., "The Current State of Two-Dimensional Electrophoresis with Immobilized pH Gradients", Electrophoresis, vol. 21, 2000, pp. 1037-1053.
Gusev, I. et al., "Capillary columns with in situ formed porous monolithic packing for micro high-performance liquid chromatography and capillary electrochromatography," J. Chrom. A, 855, 1999, pp. 273-290.
Hatch, A V. et al., "Integrated Preconcentration SDS-PAGE of Proteins in Microchips Using Photopatterned Cross-Linked Polyacrylamide Gels", Analytical Chemistry, vol. 78, 2006, pp. 4976-4984.
Herr, A E. et al., "Microfluidic Immunoassays as Rapid Saliva-Based Clinical Diagnostics", PNAS, vol. 104, No. 13, 2007, pp. 5268-5273.
Herr, A E. et al., "On-Chip Coupling of Isoelectric Focusing and Free Solution Electrophoresis for Multidimensional Separations", Analytical Chemistry, vol. 75, 2003, pp. 1180-1187.
Holmes, D., et al., "Leukocyte Analysis and Differntiation Using High Speed Microfluidic Singe Cell Impedance Cytometry", Lab Chip 9, 2009, pp. 2881-2889.
Huang, T et al., "Microfabrication of a Tapered Channel for Isoelectric Focusing with Thermally Generated pH Gradient", Electrophoresis, vol. 23, 2002, pp. 3504-3510.
International Search Report dated Dec. 24, 2009 for PCT/US2009/044550.
International Search Report dated Mar. 1, 2012 for PCT/US2012/027299.
Invitrogen Life Technologies, Instructional Manual, ZOOM IEF Fractionator, Cat. Nos. ZF10001 & ZF10002, Version C, Jul. 2004, pp. 1-64.
Lee, B.S., et al., "A Fully Automated Immunoassay From Whole Bloon n a Disc"; Lab Chip 9, 2009, pp. 1548-1555.
Lim, C.T. and Zhang, Y., "Bead-Based Microfluidic Immunoassays: The Next Generation", Biosens. Bioelectron. 22, 2007I, pp. 1197-1204.
Lim, P., et al., "Rapid isoelectric trapping in a micropreparative-scale multicompartment electrolyzer", Electrophoresis, 2007. vol. 28, pp. 1851-1859.
Lo, C T. et al., "Photoploymerized Diffusion-Defined Ployacrylamide Gradient Gels for On-Chip Protein Sizing", The Royal Society of Chemistry, Lab on a Chip, vol. 8, No. 8, 2008, pp. 1273-1279.
Lo, Y. et al., "Plasma DNA as a Prognostic Marker in Trauma Patients", Clinical Chemistry 46:3, 2009, pp. 319-323.
Long, et al., "Integration of nanoporous membranes for sample filtration/preconcentration in microchip electrophoresis", Electrophoresis, 2004, pp. 4927-4934, vol. 27.
Madou, M., et al., "Lab on a CD"; Annu. Rev. Biomed. Eng. 8, 2006, pp. 601-628.
Maes, M., et al., "Comparison of Sample Fixation and the Use of LDS-751 or Anti-CD45 for Leukocyte Identification in Mouse Whole Blood for Flow Cytometry", Journal of Immunogical Methods, 2007, p. 1-13.
Min, J. et al., "Functional Integration of DNA Purification and Concentration into a Real Time Micro-PCR Chip," The Royal Society of Chemistry; Lab Chip, 2011, pp. 259-265.
O'Farrell, P. H., "High Resolution Two-Dimensional Electrophoresis of Proteins", The Journal of Biological Chemistry, vol. 250, No. 9, 1975, pp. 4007-4021.
Ogle, et al., "Preparative-scale isoelectric trapping separations using a modified Gradiflow Unit", Journal of Chromatorgraphy A, 2002, vol. 979, pp. 155-161.
Price, C.P., et al., "Light-Scattering Immunoassay," Principles and Practice Immunoassay (Second Edition), 1997, Chap. 18, pp. 445-480.
Rhodes, A., et al., "Plasma DNA Concentration as a Predictor of Mortality and Sepsis in Critically Ill Patients," Critical Care, 2006, pp. 1-7.
Rider, T, et al., "AB Cell-Based Sensor for Rapid Identification of Pathogens"; wwwsciencemag.org; Science vol. 301; 2003, pp. 213-215.
Riegger, L., et al., "Read-Out Concepts for Multiplexed Bead-Based Flourescence Immunoassays on Centrifugal Microfluidic Platforms," Sensors and Actuators A 125, 2006, pp. 455-462.
Righetti, P G. "The Alpher, Bethe, and Gamow of IEF, the Alpha-Centaury of Electrokinetic Methodologies, Part II: Immobilized pH Gradients", Electrophoresis, 2007, pp. 545-555, vol. 28.
Righetti, P G. "The Alpher, Bethe, Gamow of Isoelectric Focusing, the Alpha-Centaury of Electrokinetic Methodologies. Part 1", Electrophoresis, 2006, pp. 923-938, vol. 27.
Schaff, U.Y., et al., "Whole Blood Immunoassay Based on Centrifugal Bead Sedimentation," Clinical Chemistry, 2011, Vol, 57:5, pp. 753-761.
Schlichting, H., "Boundary-layer Theory", McGraw-Hill, NY, 1979.
Sommer, G J. et al., "On-Chip Isoelectric Focusing Using Photopolymerized Immobilized pH Gradients", Analytical Chemistry, 2008, pp. 3327-3333, vol. 80.
Tan, W et al., "Miniaturized Capillary Isoelectric Focusing in Plastic Microfluidic Devices", Electrophoresis, 2002, pp. 3638-3645, vol. 23.
Tennekes, H and Lumley, J., "A First Course in Turbulence", The MIT Press, Cambridge, MA, 1972.
Whitney, W., "Theory of the Air-Supported Puck", American Journal of Physicists, 1964, 4, pp. 306-312.
Zhang, L., et al., "A New Biodosimetric Method: Branched DNA-Based Quantitative Detection of B1 DNA in Mouse Plasma," The British Journal of Radiology, Aug. 3, 2010, pp. 694-701.
Ziegler, A. et al., "Circulating DNA: A New Diagnostic Gold Mine?" Cancer Treatment Reviews, 2002, vol. 28, pp. 255-271.
Zilberstein, G et al., "Parallel Isoelectric Focusing Chip", Proteomics, 2004, pp. 2533-2540, vol. 4.
Zilberstein, G. et al., "Parallel isoelectric focusing II", Electrophoresis 2004, vol. 25, pp. 3643-3651.

(56) References Cited

OTHER PUBLICATIONS

Zilberstein, G. et al., "Parallel processing in the isoelectric focusing chip", Electrophoresis, 2003, vol. 24, pp. 3735-3744.
Zuo, X; Speicher, D.W.; "A Method for Global Analysis of Complex Proteoms Using Sample Prefactionation by Solution Isoelectrofocusing Prior to Two-Dimensional Electrophoresis", Analytical Biochemistry, 2000, vol. 284, pp. 266-278.

Gorkin et al., "Centrifugal microfluidics for biomedical applications", www.rsc.org/loc, Lab on a Chip, 2010, pp. 1758-1773.
International Search Report and Written Opinion of PCT App. No. PCT/US2013/032349; Jun. 28, 2013.
Supplementary European Search Report for Application No. 09805311.9—1959/2329337 (PCT/US2009044550), dated Mar. 14, 2007 (Sandia National Laboratories, Applicant).

* cited by examiner

HEAT EXCHANGER DEVICE AND METHOD FOR HEAT REMOVAL OR TRANSFER

CROSS REFERENCE TO RELATED APPLICATIONS

This application is a continuation-in-part of application Ser. No. 12/732,662, filed Mar. 26, 2010, which is a continuation of International Application No. PCT/US2009/044550, filed May 19, 2009, entitled "HEAT EXCHANGER DEVICE AND METHOD FOR HEAT REMOVAL OR TRANSFER", which is a continuation-in-part of U.S. patent application Ser. No. 12/185,570, filed Aug. 4, 2008, entitled "HEAT EXCHANGER DEVICE AND METHOD FOR HEAT REMOVAL OR TRANSFER", and U.S. Provisional Patent Application Ser. No. 61/164,188, filed Mar. 27, 2009, entitled "HEAT EXCHANGER AND METHOD FOR HEAT REMOVAL OR TRANSFER".

This application and the application Ser. No. 12/732,662 are also continuation-in-parts of U.S. patent application Ser. No. 12/185,570, filed Aug. 4, 2008, entitled "HEAT EXCHANGER DEVICE AND METHOD FOR HEAT REMOVAL OR TRANSFER," which application claims the benefit of U.S. Provisional Patent Application Ser. No. 61/008,271, filed Dec. 18, 2007, entitled "COOLING DEVICE".

The application Ser. No. 12/732,662 also claims the benefit of U.S. Provisional Patent Application Ser. No. 61/164,188 filed Mar. 27, 2009, entitled "HEAT EXCHANGER AND METHOD FOR HEAT REMOVAL OR TRANSFER".

The above applications are each incorporated herein by reference.

STATEMENT OF GOVERNMENT SUPPORT

The United States Government has a paid-up license in this technology and the right in limited circumstances to require the patent owner to license others on reasonable terms as provided for by the terms of contract No. DE-AC04-94AL85000 awarded by the U.S. Department of Energy to Sandia Corporation.

FIELD

This application includes embodiments related to devices, methods and systems for a new type of forced-air heat exchanger designed to overcome several limitations of the prior art.

BACKGROUND

To illustrate the problem of thermal management, reference is made to the computer and microelectronics industry. Progress in VLSI (Very Large Scale Integration) semiconductor technology is often discussed in terms of Moore's Law, which in its most common definition predicts a doubling of the number of transistors per CPU (Central Processing Unit) every 18 months. In 1971, Intel introduced the "4004" processor, which contained 2,300 transistors and ran at a clock speed of 740 kHz. By 2006, processors with over a billion transistors and clock speeds in excess of 3 GHz had become commercially available. Many such modern CPUs generate well in excess of 100 W of waste heat. Continued progress in advancing CPU capability is now seriously hampered by the problem of thermal management. The limitations of state-of-the-art thermal management technology fall well short of what is required to continue along the growth curve of Moore's Law, a situation that has been termed the "thermal brick wall" problem.

An example of a current state of the art CPU cooler is shown in FIG. 1, which includes a finned metal heat sink 1 with a flat bottom surface (to facilitate making a low thermal-resistance connection to a thermal load), and an axial fan 2 for generating an airflow that impinges on the heat sink fins. The heat sink 1 has a plurality of fins to increase the heat-exchanging surface area and is made from a material with high thermal conductivity, such as aluminum. The choice of material used for the metal heat sink may also reflect other requirements, such as the need to make the heat sink light-weight, low-cost, easy to manufacture (e.g., the use of an alloy with good mechanical forming properties), etc. Also included are fastening means 3 and 4 for securing fan 2 to heat sink 1.

In the vast majority of desktop and laptop computers, the CPU is mounted in direct thermal contact with a CPU cooler such as that shown in FIG. 1, or connected indirectly through a heat extraction device such as a heat pipe. The state of the art for electronics thermal management technology may be further illustrated with reference to art covered by U.S. Patent Classification Classes and Subclasses 165/121, 165/104.33 and 361/697 and particularly to U.S. Pat. Nos. 7,349,212, 7,304,845, 7,265,975, 7,035,102, 6,860,323, 6,356,435 and published U.S. Patent Publication Numbers 2004/0109291, 2005/0195573 and 2007/0041158.

Early on in the semiconductor industry, component designers realized that many devices such as power transistors required some form of thermal management in order to maintain adequate device temperature operating margins (cf. U.S. Pat. No. 5,736,787). To solve this problem, such components were typically mounted in direct contact with a finned metal heat sink. Such finned heat sinks relied primarily on natural convection to circulate air through the cooling fins. Eventually it became routine to use a fan for assisting air movement over and around the heat sink to improve the rate and efficiency of heat extraction from the heat sink Over time, heat sinks for electronics cooling grew larger in size, incorporated larger numbers of fins, and used ever more elaborate fin geometries in an attempt to further improve heat exchange between the heat sink and surrounding air. This "heat-sink-plus-fan" architecture (see FIG. 1) still represents the state of the art in air-cooled heat exchanger technology (cf. Incropera F. P., Dewitt D. P., Bergman, T. L. and Levine, A. S., *Fundamentals of Heat and Mass Transfer*, 6th Edition, John Wiley & Sons, New York, 2007).

Until the mid 1990s, relatively little attention was paid to the performance of the air-cooled heat exchangers used for CPU cooling. The cooling capacity of such "heat-sink-plus-fan" (HSPF) devices was more than adequate for the vast majority of CPU applications, and the electrical power consumption of early HSPF devices was relatively low (typically on the order of 1 Watt). But eventually, increased transistor densities and higher clock speeds began to create a demand for better thermal management technology. This lead to the development of greatly improved technology for waste heat extraction, primarily practical heat pipe technology and improved thermal-interface materials. On the other hand, nearly all of the performance improvements in waste heat disposal were achieved by scaling up the size of devices based on the standard HSPF architecture; to address the problem of escalating CPU power dissipation, both the fan and the finned metal heat sink were simply made larger.

Note the distinction between "waste heat extraction" and "waste heat disposal". As mentioned above, prior to the mid-1990s, the cooling capacity of HSPF devices was more than adequate for the vast majority of CPU applications. Typically, the main concern was creating and maintaining a low-thermal-resistance joint, which presented a challenge because the amount of surface area available for such a thermally conductive joint may be relatively small, and because the joint may be subjected to repeated thermal cycling. For this reason, the problem of thermal management has long been regarded by many as primarily a process of waste heat extraction, where in fact, thermal management also comprises a second step of waste heat disposal. In the heat extraction step, heat is removed from a high-thermal-density region such as a CPU chip and redistributed over a larger area to facilitate the second step of heat disposal, in which the waste heat is transferred to the surrounding air. The distinction between heat extraction and heat disposal, however, is often a source of confusion. For example, heat pipes, such as those used in laptop computers, may not provide any functionality with regard to heat disposal. The purpose of a heat pipe may be to extract a large quantity of heat through a small area of contact and to convey that heat to a heat exchanger, such as a finned heat sink used in conjunction with a fan, or a passive heat sink such as the metal chassis of a laptop computer. The same may be said of the thermoelectric "coolers" based on the Peltier effect, which are electrically powered heat pumps that may be used to enhance the transport of heat between a thermal load and a heat exchanger; it is the heat exchanger that ultimately performs the function of exporting substantially all of the waste heat to the surrounding air (or other thermal reservoir capable of absorbing large quantities of heat).

Of course, heat disposal may also involve transfer to water or another coolant, but for the vast majority of practical applications, the goal is to transfer waste heat to the large thermal reservoir provided by the surrounding atmosphere. With the exception of heat pipes, which can be implemented in the form of a hermetically sealed metal enclosure, there has been a great deal of reluctance to adopt cooling methodologies that entail any kind of liquid handling and/or containment. In fact, it has long been known that the thermal brick wall problem can, to a large extent, be addressed by resorting to the use of heat conducting liquids because of their superior thermal transport properties. Nonetheless, cooling systems that entail the use of liquids have not penetrated applications such as mass-marketed personal computers because of practical, rather than performance, considerations.

In recent years, the greatly increased size, weight and power consumption of air-cooled heat exchangers used for CPU cooling have begun to reach the limits of practicality for most commercial applications (most notably, mass produced personal computers for use in home and office environments). The high level of audible noise generated by the larger, more powerful fans used in high-capacity CPU coolers has also proved a deterrent to further scaling of HSPF devices (cf. Thompson, R. J. and Thompson B. F., *Building the Perfect PC*, O'Reilly Media, Inc., Sebastapol, Calif., 2004).

Meanwhile, progress in VLSI technology has continued. In many real-world applications, the performance of air-cooled heat exchanger technology is now the primary limiting factor to further improvements in CPU performance. Continued progress along the growth curve of Moore's Law is no longer dictated solely by improvements in VLSI technology. Because of thermal limitations, VLSI advances such as higher transistor density and the ability to operate at higher clock speeds can no longer be readily exploited.

The cooling capacity of a heat exchanger can be defined in terms of its thermal conductance, $G=dP/dT$, where P is the power dissipation of the thermal load, and T is the temperature of the heat exchanger at the interface between the heat exchanger and the thermal load, such that the SI unit for thermal conductance is $W\ K^{-1}$. By convention, however, nearly all of the data sheets for CPU coolers specify performance in terms of thermal resistance, R ($K\ W^{-1}$), the reciprocal of thermal conductance. Note that in addition to the above IUPAC (International Union of Pure and Applied Chemistry) definitions for thermal resistance and thermal conductance (cf. www.iupac.org), other names and symbols are sometimes used in the prior art to represent the same quantities (e.g., the use of the symbol "θ" for thermal resistance).

The thermal resistance of a mid-sized CPU cooler such as that shown in FIG. 1 is typically on the order of 1 $K\ W^{-1}$. Several much larger and heavier high-capacity CPU coolers are commercially available that provide thermal resistances as low as 0.3 $K\ W^{-1}$. But to the extent that further increases in the size, weight, and electrical power consumption of air-cooled heat sinks have become prohibitive for applications such as personal computers, efforts must now be directed at improving the three specific cooling capacity metrics for heat exchangers: cooling capacity per unit volume ($W\ K^{-1}\ m^{-3}$), cooling capacity per unit weight ($W\ K^{-1}\ kg^{-1}$), and cooling capacity per unit power consumption ($K^{-1}$).

The essence of the "thermal brick wall" problem is that all practical options for increasing the specific capacity of devices such as CPU coolers appear to have already been exhausted. For example, steady progress over the past two decades has increased the electrical-to-mechanical efficiency of the brushless motors used in many cooling fans to a typical value of 95%. This leaves very little room for improvement. Similarly, there are thousands of references in the scientific and engineering literature on the subject of heat sink fin geometry, and optimization of the air-flow-to-heat-sink interaction. This work has resulted in a better understanding of the flow-field-heat-sink interaction, but this better understanding of the flow-field-heat-sink interaction has only led to incremental refinements in device architecture and performance.

The current state of electronics thermal management technology was summarized by DARPA (the Defense Advanced Research Projects Agency) in a January 2008 call for research proposals on new ideas for air-cooled heat exchanger technology:

"Over the past 40 years, CMOS, telecommunications, active sensing and imaging and other technologies have undergone tremendous technological innovation. Over this same historical period the technologies, designs and performance of air-cooled heat exchangers have remained unchanged. The performance data for today's state of the art heat exchangers and blowers is, in many cases, based on measurements performed in the 1960s."

DARPA, perhaps most well known for initiating development of the Internet in the 1970s, has now decided that considerable resources must be directed towards solving the air-cooling problem (cf. www.darpa.mil/baa, DARPA Broad Agency Announcement 08-15, Jan. 8, 2008).

This technology stagnation might seem unlikely given that advances in VLSI technology have created tremendous economic incentive for improvement of air-cooled heat exchanger technology; the current market for electronics thermal management technology is ~$5 B/yr. Part of the explanation for the lack of progress despite such large economic incentive is related to the fundamental nature of the physical effects that limit the performance of the HSPF architecture, which are discussed at length below.

The other significant contributor to technology stagnation appears to be a trend towards optimizing specific aspects of thermal management technology, rather than reconsideration of the problem as a whole. The operation of a device such a conventional CPU cooler is governed by physical processes spanning multiple engineering disciplines. As a result, an individual working on refinements to fan technology may regard a finned metal heat sink as a standardized building block that can be considered for all intents and purposes a "black box". Likewise, an individual focused on improvement of extruded aluminum heat sink technology may regard a fan as a black box that consumes electrical power and provides airflow. Specialization in a particular area can make it very difficult to appreciate the question of optimized thermal management in its entirety. For example, one interesting observation is that the data sheets for commercially available fans used for CPU cooling rarely, if ever, provide any specification for the mechanical efficiency of the fan (i.e., the efficiency for conversion of rotary mechanical power to air flow). This is unfortunate, because as discussed below, the mechanical efficiency of the fan used in a device such as a CPU cooler turns out to have profound implications with regard to the question of overall device architecture. More generally, rethinking the problem of forced air cooling requires a reexamination of the assumptions that underlie the traditional HSPF architecture and the associated stagnation in air-cooled heat exchanger technology.

Because heat transfer is an area of fundamental technological importance, the application area for embodiments described herein is extremely broad. The preceding discussion has emphasized applications in the area of electronics cooling, where thermal management may be applied to one or more active and/or passive electronic components, including but not limited to a resistor, capacitor, inductor, transformer, diode, rectifier, thyristor, transistor, amplifier, integrated circuit, display driver, line driver, buffer, microprocessor, central processing unit, graphics processing unit, coprocessor, transducer, sensor, actuator, power supply, A.C. to D.C. converter, D.C. to A.C. converter, D.C. to D.C. converter, A.C. to A.C. converter, or printed circuit assembly. But it should be understood that embodiments described herein may be applicable to a wide variety of other technology areas (e.g., in the energy sector). Clearly, any device comprising one or more forced-air heat exchangers may benefit significantly from a reduction in the size, weight, energy consumption, and/or noise of such a heat exchanger. But in addition, the energy efficiency of such a device as a whole may be improved significantly by lowering the thermal resistance of the heat exchanger.

For example, in the energy sector, a wide variety of devices used to interconvert heat and mechanical work take the form of a heat engine sandwiched between two heat exchangers. Such a heat engine may be used to generate mechanical work from the spontaneous flow of heat from a high temperature source (hereafter referred to as a "thermal source") to a low temperature sink (hereafter referred to as a "thermal sink"). For example, a steam turbine may generate mechanical work from spontaneous flow of heat from a thermal source, such as the combustion of fuel, to a thermal sink, such as the surrounding atmosphere. The maximum theoretical efficiency of such a heat engine is known as the Carnot efficiency, which may be expressed:

$$\varepsilon_{Carnot} = \frac{\Delta T}{T_{source}}$$

where T is absolute temperature, and $\Delta T$ is the difference in temperature between the thermal source and the thermal sink.

FIG. 2 illustrates a heat engine that comprises an input shaft 5 for input or output of mechanical work, a first heat exchanger 6 in thermal contact with a thermal source, and a second, identical heat exchanger 7 in thermal contact with a thermal sink. In an ideal heat engine, all of the heat that flows between the thermal source and thermal sink flows through the heat engine, there are no losses such as friction in the mechanical portion of the heat engine, the flow of heat is carried out as a reversible process, and the heat engine is thermally coupled to the thermal source and thermal sink with zero thermal resistance. In a real-world version of the heat engine shown in FIG. 2, some portion of heat transferred between the thermal source and thermal sink flows through thermal leakage paths, there are non-zero frictional losses inside the heat engine, the flow of heat must to some extent be carried out as an irreversible process to provide a reasonable rate of conversion between heat and work, and the heat exchangers that thermally couple the heat engine to the thermal source and thermal sink have finite thermal resistance. These four non-ideal effects make the actual efficiency that can be achieved in such a heat engine less than the Carnot efficiency (cf. Kittel, C. and Kroemer, H., Thermal Physics, 2nd Edition, W. H. Freeman & Company, New York, 1997). Methods by which any of these four sources of inefficiency can be substantially reduced relative to the prior art are of great technological and economic importance.

Such a heat engine may also be used as a "heat pump", in which mechanical work is used to generate non-spontaneous flow of heat from a low temperature sink to a high temperature source. For example, a refrigerator may use mechanical work supplied by an electric motor to generate non-spontaneous flow of heat from a low temperature sink (e.g., the air inside a refrigerator) to a high temperature source (e.g., the air outside a refrigerator). The ratio of heat transferred to mechanical work supplied has a maximum theoretical value known as the Carnot coefficient of refrigerator performance:

$$\gamma_{Carnot} = \frac{T_{sink}}{\Delta T}$$

To illustrate the importance of heat exchanger performance, we may consider a device such as a window-mounted air conditioner. Such a device may consist of a heat pump sandwiched between two forced-air heat exchangers. The thermal sink may be the interior room air (e.g., $T_{SINK}$=300 K), and the thermal source may be the outside air on a hot summer day (e.g., $T_{SOURCE}$=320 K). The two heat exchangers have a non-zero, and in this example equal, thermal resistance. During operation, a quantity of heat (q) flowing through the finite thermal resistance (R) of the two heat exchangers results in a temperature drop of qR across each heat exchanger. Under such conditions, the maximum efficiency of the heat engine is reduced to:

$$\gamma_{Carnot} = \frac{T_{sink} - qR}{\Delta T + 2qR}$$

where q (units: W) is the heat flux through the air conditioner and R (units: K W$^{-1}$) is the heat exchanger thermal resistance. For $T_{SINK}$=300 K and $T_{SOURCE}$=320 K, a temperature drop of 10 K across each heat exchanger reduces the Carnot coefficient of refrigerator performance by a factor of ~2, and may therefore increase electrical power consumption by a factor of ~2. Accordingly, in applications such as air conditioning, where the difference in temperature between the thermal source and the thermal sink is relatively small, lowering the thermal resistance of such an air-cooled heat exchanger can reduce electrical power consumption considerably (or, for a given coefficient of performance, increase cooling capacity). Lastly, in addition to air conditioning, any such improved heat exchanger may be used for applications such as heaters, refrigerators, freezers, absorption chillers, evaporative coolers, thermal reservoirs, condensers, radiators, heat pumps, heat engines, motors, or generators.

BRIEF DESCRIPTION OF THE DRAWINGS

The accompanying drawings, which are incorporated into and form a part of the specification, illustrate one or more embodiments of the present application and, together with the description, serve to explain the principles of various embodiments. The drawings are only for the purpose of illustrating various embodiments, and are not to be construed as limiting. In the drawings.

DETAILED DESCRIPTION OF EMBODIMENTS

In the following detailed description, reference is made to the accompanying drawings which form a part hereof and in which is shown, by way of illustration, specific embodiments and the manner in which they may be practiced. These embodiments are described in sufficient detail to enable those skilled in the art to practice such embodiments, and it is to be understood that other embodiments may be utilized and that structural changes may be made without departing from the spirit and scope of the embodiments described herein. Therefore, the following detailed description is not to be taken in a limiting sense, and the scope of this application is defined by appended claims.

As discussed above, progress in forced-air heat exchanger technology is hampered by the fundamental physical limitations of the traditional "heat-sink-plus-fan" (HSPF) device architecture. In particular, it is well known that boundary layer effects impose fundamental limitations on HSPF device performance (cf. Kutz, M., *Heat Transfer Calculations*, McGraw-Hill, New York, 2005). In qualitative terms, a "boundary layer" can be considered a stationary layer of "dead air" that clings to the surface of a structure (e.g., a finned heat sink) and acts like an insulating blanket. In conventional HSPF devices, the difference in temperature between the base of the finned heat sink and ambient air may be almost entirely accounted for by the temperature drop across such a boundary layer. Within such a boundary layer, molecular diffusion is typically the primary transport mechanism for conduction of heat, resulting in very poor heat transfer.

Figure 1:
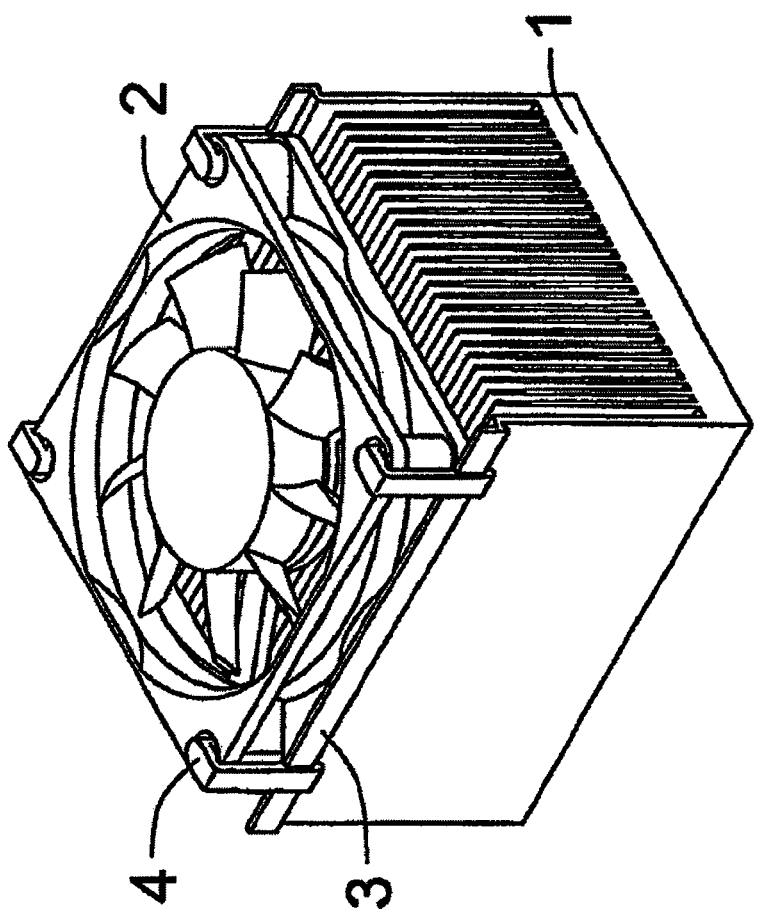
FIG. 1 illustrates an example of a prior art, a forced-air heat exchanger based on the traditional heat-sink-plus-fan (HSPF) device architecture.
Figure 2:
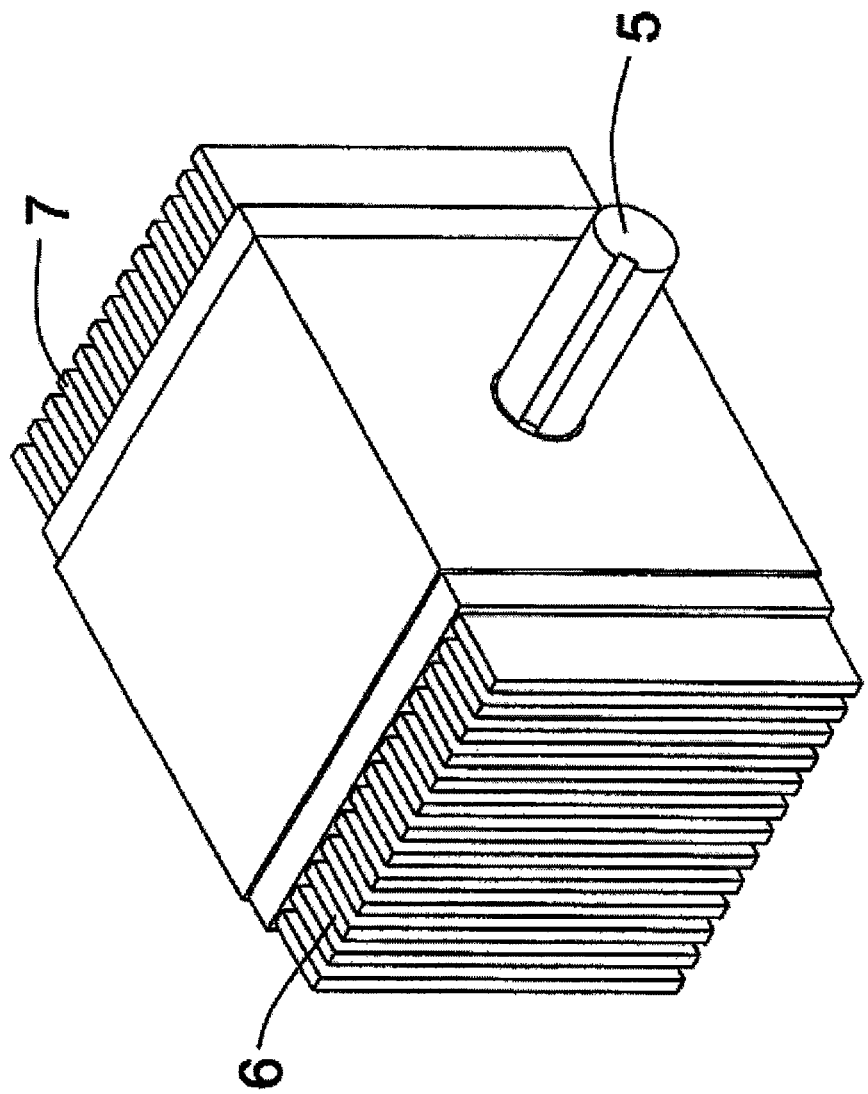
FIG. 2 illustrates a heat engine.

Accordingly, the designs of many high-performance air-cooling devices place a great deal of emphasis on boundary layer disruption. For example, air-jet-impingement cooling, in which a high-pressure pump generates a jet of compressed air that is directed at a heat sink surface, is very effective at reducing the thickness of the boundary layer. But the electrical power consumption and cost of air-jet-impingement cooling is prohibitive for most applications. In devices such as the CPU cooler shown in FIG. 1, although the fan generates a large amount of turbulence, only a modest reduction in the effective boundary layer thickness is observed relative to the case of laminar flow. This boundary-layer disruption effect can be increased somewhat by running the fan at higher speed, but the tradeoff with respect to electrical power consumption quickly becomes very unfavorable.

The efficiency of the heat exchange process ($\epsilon_G$) can be quantified by considering a maximum theoretical value of thermal conductance (G) for an ideal heat exchanger, in which heat transfer is limited only by the heat capacity of the flowing air stream:

$$\varepsilon_G = \frac{G}{G_{ideal}} = \frac{G}{C_p \rho \Phi} = \frac{1}{RC_p \rho \Phi},$$

where G and R are the thermal conductance and resistance, respectively (defined earlier), $C_p$ is the heat capacity of air at constant pressure, $\rho$ is the density of air, and $\Phi$ is the volumetric flow rate of air through the finned heat sink. For the prior art device shown in FIG. 1, $\varepsilon_G$ is about 10%, for example:

$$\varepsilon_G = \frac{1}{(0.92 \text{ K W}^{-1})(1.0 \times 10^3 \text{ J kg}^{-1} K^{-1})} = 0.10.$$
$$(1.2 \text{ kg m}^{-3})(9.5 \times 10^{-3} \text{ m}^3 \text{ s}^{-1})$$

Accordingly, the temperature of the air discharged by the CPU cooler may only be slightly greater than the temperature of the surrounding ambient air, even if the CPU is running very hot. The above calculation is informative because it suggests a great deal of room for improvement in the efficiency of the air-heat-sink interaction. To address this issue, what is needed is a method for substantially reducing the thickness of the heat sink boundary layer without incurring substantial penalties in electrical power consumption, size, weight, cost, complexity, etc.

In addition to improving the efficiency of the air-heat-sink interaction, particular embodiments are directed to increasing the volumetric flow rate of air through the heat exchanger. For devices based on the standard HSPF architecture, the flow rate of air may be limited by the electrical power consumption of the fan. In principle, the flow rate can always be increased by increasing the speed of the fan, but as before, running the fan at high rpm involves a tradeoff with respect to electrical power consumption that quickly becomes very unfavorable (cf. Bleier, F. P., *Fan Handbook, Selection, Application and Design*, McGraw-Hill, New York, 1997).

Figure 3:
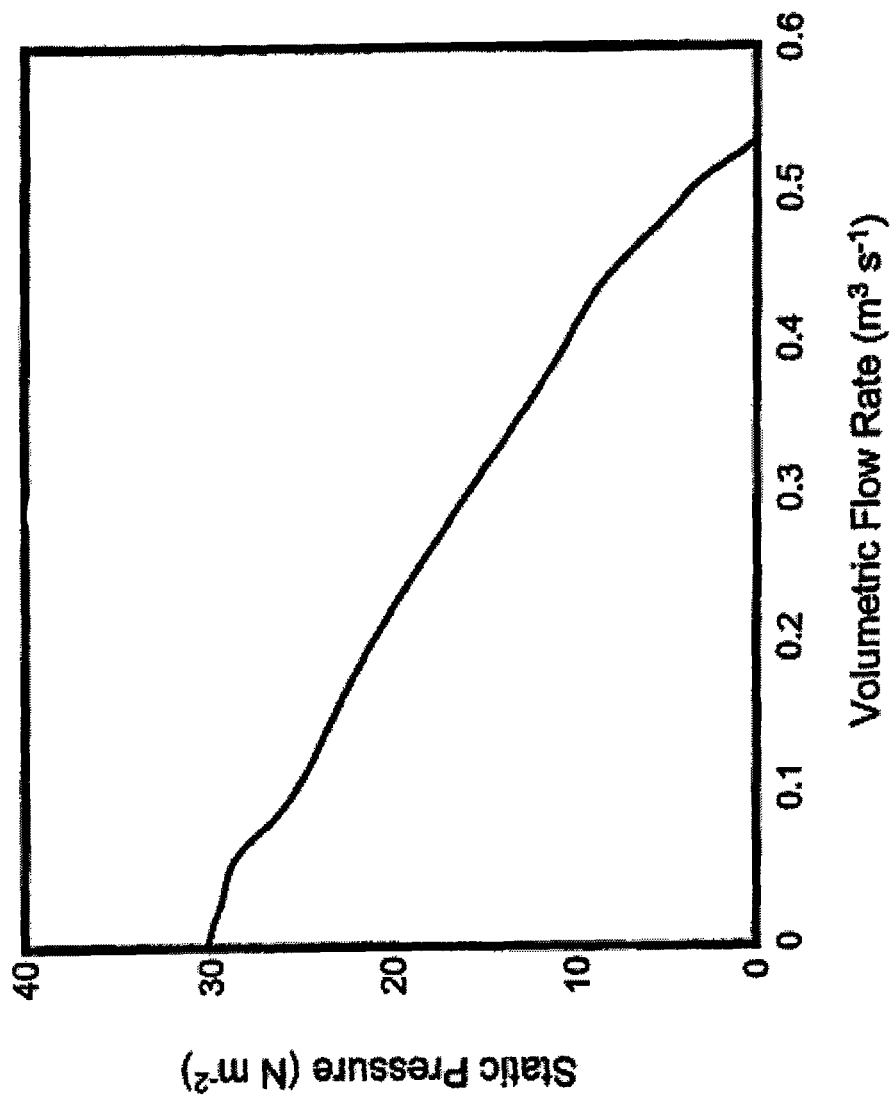
FIG. 3 shows the pressure-flow curve of a 60-mm-diameter, 4800 rpm, cooling fan typical of those used for cooling the CPU of a personal computer.

To better understand the role of fan performance, it can be informative to consider, in absolute terms, the mechanical efficiency of a fan. Here, mechanical efficiency of a fan may be expressed as the kinetic energy imparted to the airflow per unit time, divided by the mechanical energy delivered to the fan rotor per unit time. The power required to force air through a flow restriction is determined by the pressure drop across the flow restriction and the volumetric flow rate. Using the concept of "p-V work" we can think of the fan's output in terms of "p-$\Phi$ power", where p is the pressure delivered by the fan, and $\Phi$ is the volumetric flow rate delivered by the fan (cf. Fox, R. W. and McDonald, A. T., *Introduction to Fluid Dynamics*, 4th edition, John Wiley & Sons, New York, 1992). The mechanical efficiency of a fan may thus be expressed as:

$$\varepsilon_{mech,fan} = \frac{P_{mech,flow}}{P_{mech,motor}} = \frac{p_{fan}\Phi_{fan}}{\varepsilon_{motor}P_{elec,motor}} = \frac{p_{fan}\Phi_{fan}}{\varepsilon_{motor}V_{motor}I_{motor}},$$

where $P_{mech, flow}$ is the mechanical power contained in the flowing air stream generated by the fan, $P_{mech, motor}$ is the mechanical power available at the motor shaft, $\varepsilon_{motor}$ is the electrical-to mechanical conversion efficiency of the motor, $P_{elec, motor}$ is the electrical power delivered to the motor, $V_{motor}$ is the D.C. or rms voltage delivered to the motor, and $I_{motor}$ is the D.C. or rms electrical current delivered to the motor. FIG. 3 shows a pressure/flow curve for a 60-mm-diameter axial fan typical of those used in CPU cooling applications. The pressure/flow curve of such fans is typically an approximately straight line of the form:

$$P(\Phi) = p_{max}\left(1 - \frac{\Phi}{\Phi_{max}}\right).$$

The p($\Phi$) curve has a maximum efficiency operating point at which the product of $\Phi$ of p is maximized:

$$p = \frac{1}{2}p_{max} \text{ and } \Phi = \frac{1}{2}\Phi_{max}.$$

An estimate of the maximum efficiency is therefore:

$$\varepsilon_{mech,fan} = \frac{p_{fan}\Phi_{fan}}{4\varepsilon_{motor}V_{motor}I_{motor}}.$$

For the 60-mm-diameter, 4800-rpm, cooling fan represented in FIG. 3, under typical operating conditions, the mechanical efficiency of the fan is, therefore, about 2.0%:

$$\varepsilon_{max} = \frac{(30 \text{ N m}^{-2})(0.53 \text{ m}^2 \text{ min}^{-1})}{4(0.95)(12 \text{ V})(0.30 \text{ A})(60 \text{ s min}^{-1})} = 0.020.$$

Figure 4:
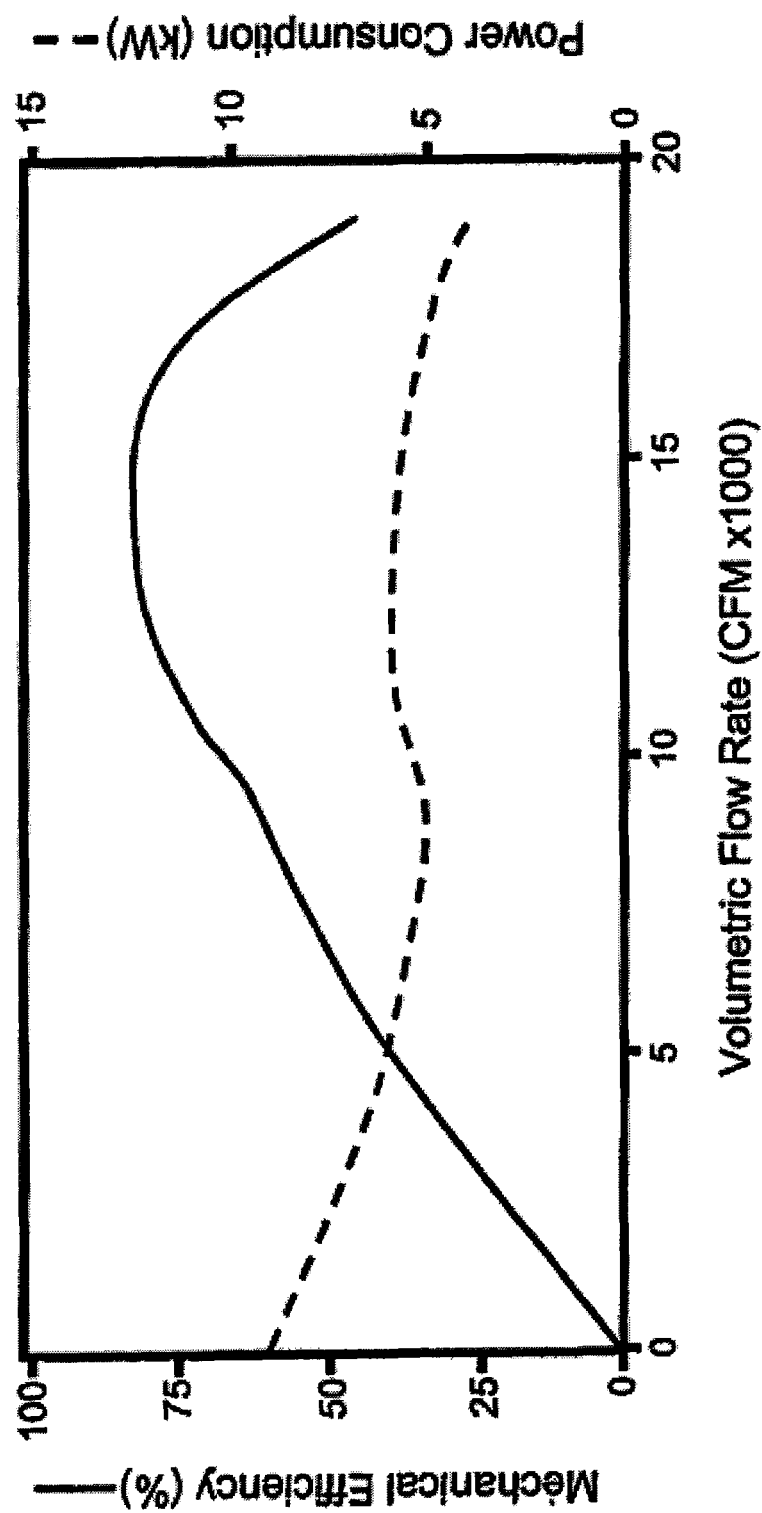
FIG. 4 shows a plot of mechanical efficiency and power consumption as a function of the volumetric flow rate capacity of a vane-axial fan.

This is characteristic of the small-area, high-speed fans used for cooling of electronics and other small devices. Of the mechanical power available at the motor shaft, only 2% is typically imparted to the airflow generated by the fan; the other 98% of the mechanical power generated by the electric motor is wasted on fan-blade viscous drag (at operating speed, the mechanical resistance of the fan motor bearings is negligible compared to the total drag force exerted on the fan blades). This large unproductive expenditure of mechanical energy is also the primary source of fan noise. As shown in FIG. 4 (reproduced from R. Jorgensen, *Fan Engineering*, 7th edition, Buffalo Forge Company, Buffalo, N.Y., 1970), much larger, lower-rpm fans achieve far better mechanical efficiency, as high as 80% for large industrial fans that consume in excess of 5 kW of electrical power. But these much larger fans greatly exceed the size, weight and power consumption constraints of many applications (e.g., thermal management of a CPU in a desktop personal computer).

An important implication of the above calculation is that the specific cooling capacity of the CPU cooler falls far short of what is physically possible. A mechanical efficiency of 2.0% implies that in principle, there is as much as a factor of 50 to be gained through design improvements. We therefore conclude that in addition to boundary layer effects, the performance limitations of the HSPF device architecture derive from the intrinsically low efficiency of small, high-speed fans (as does the substantial amount of audible noise generated by such devices). Because of these limitations an improvement in this technical area would seem to be needed.

Further progress in forced air heat exchanger technology could be achieved by the development of a new device architecture with far less intrinsic vulnerability to these two physical effects. In particular, some of the embodiments described herein seek to provide an efficient means for removing waste heat from a thermal load by significantly reducing the boundary layer effects associated with conventional HSPF technology, and by mitigating the problem of low efficiency associated with small, high-speed turbo-machinery.

Figure 5:
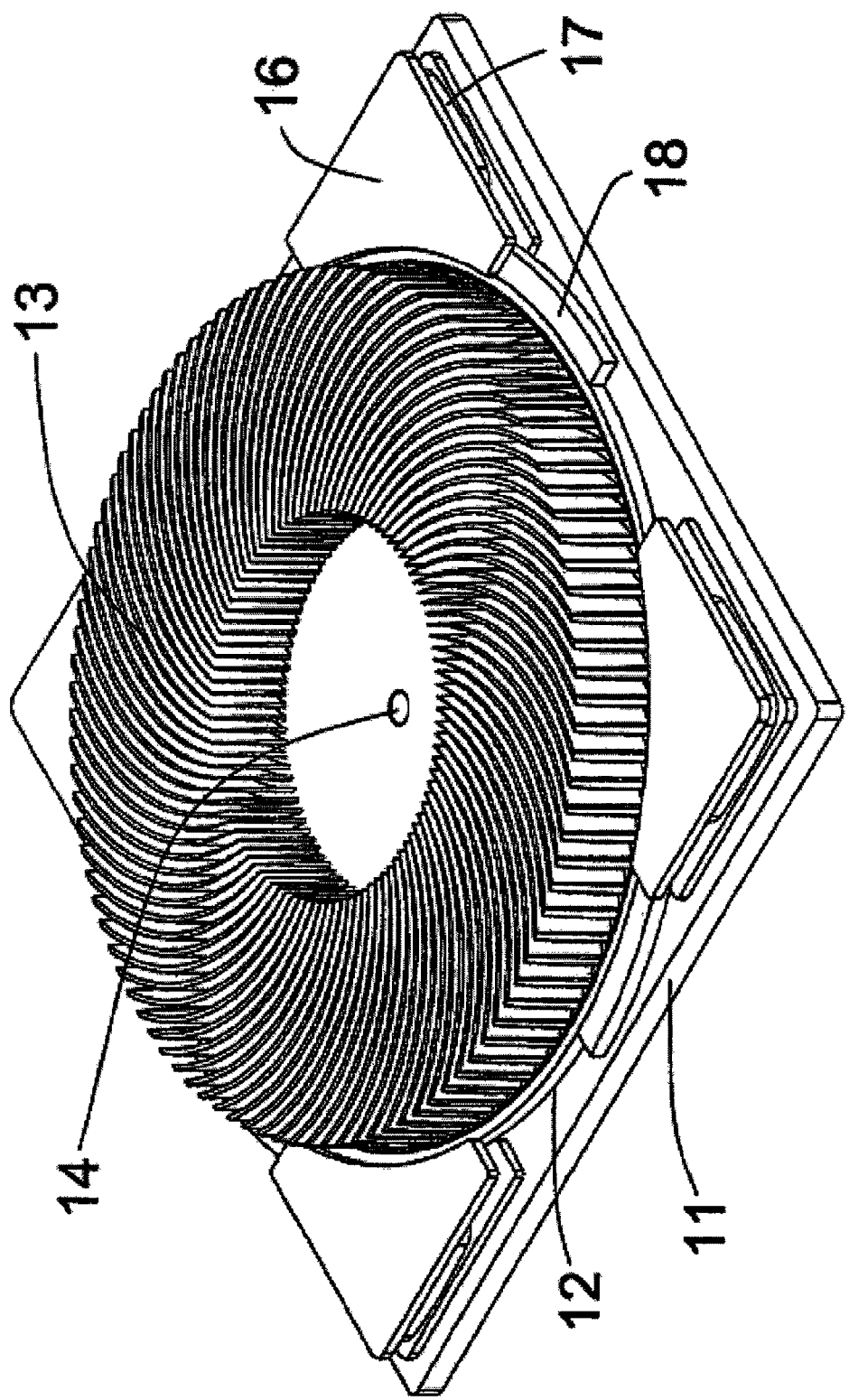
FIG. 5 shows a representative embodiment in the form of an isometric line drawing.
Figure 6:
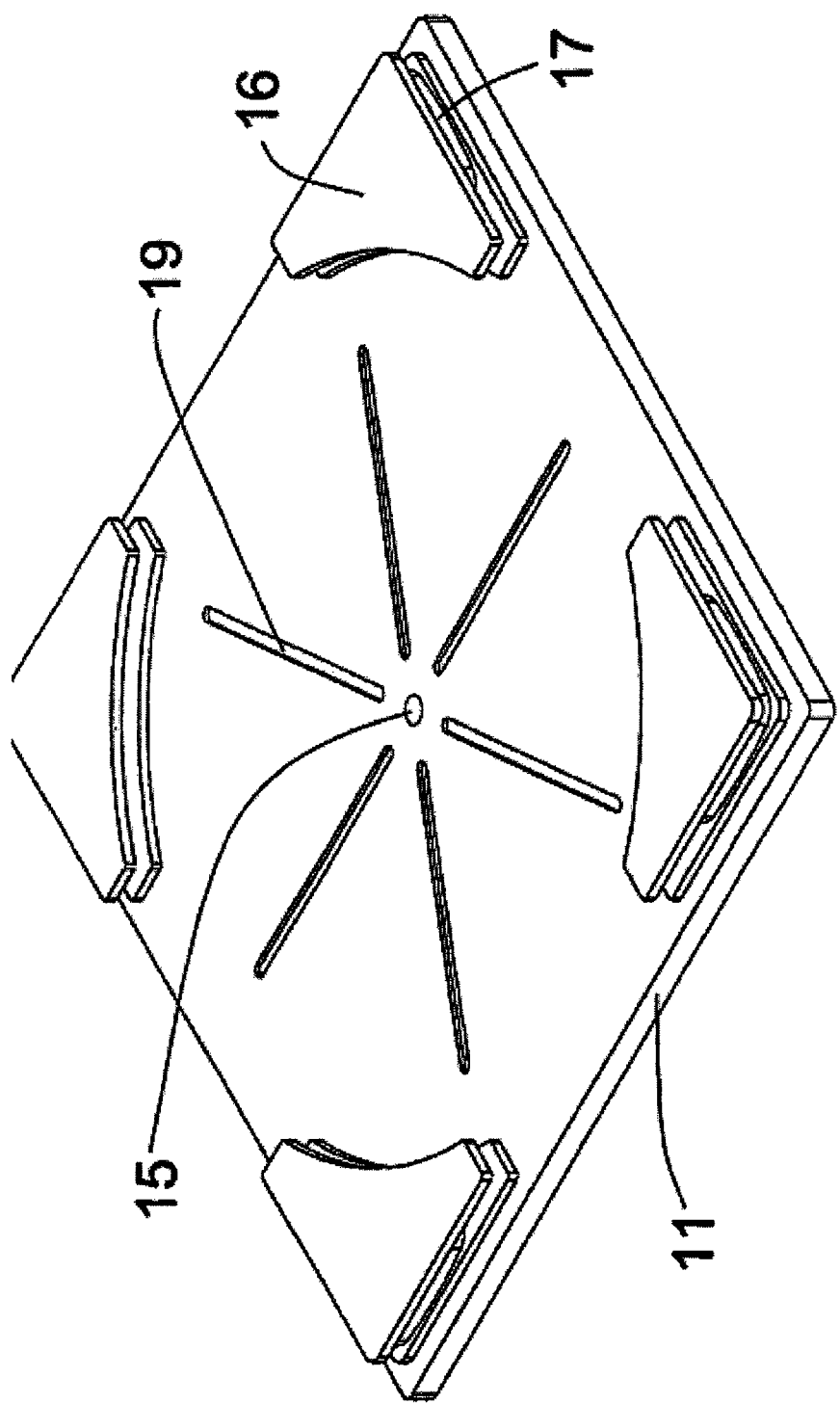
FIG. 6 shows the representative embodiment of FIG. 5 with the heat-sink-impeller omitted, in the form of an isometric line drawing.

Disclosed herein is a new architecture for an air-cooled heat exchanger that uses an efficient scheme for circulating air through heat exchanger fins and also incorporates an effective mechanism for reducing the boundary layer thickness. One representative embodiment of this new device architecture is illustrated in FIGS. 5 and 6. Various other objects and advantages will be more readily understood from the description when read in conjunction with the appended drawings. The following description is intended to be exemplary and explanatory only to provide further explanation of the embodiments and principles described in this application. The accompanying drawings are included to illustrate and provide a further understanding of the embodiments described herein, and are incorporated in and constitute part of this specification. The scope of the embodiments should be determined by appended claims and their legal equivalents, rather than by the examples given.

Referring to FIG. 5, throughout the discussion that follows, the term "z-axis" will be used to refer to an axis of rotation of the heat-sink-impeller-structure 13, the term "x-y plane" will be used to denote any plane substantially parallel to the plane of the base plate 11, and the term "azimuthal" will be used to refer to circular motion about the z-axis and parallel to the x-y plane. Terms such as the "bottom" and "top" surfaces of the base plate and heat-sink-impeller structure correspond to the device orientation shown FIGS. 5 and 6.

Herein, the term "thermal load" may be interpreted to mean any object or objects to which, or from which, heat may be transferred. Examples of thermal loads include a device that may generate waste heat (such as a CPU), a device that may be used to transfer heat to or from such a device (such as a heat pipe), a "cold side" or "hot side" of a heat pump or heat engine, and any combination and/or plurality of such thermal loads. Herein, the term "thermal contact" shall be interpreted to mean that two objects are in thermal contact with each other if heat can flow readily between the two objects. For example, if the mechanism of heat flow is conduction, "thermal contact" indicates that there is a path for conductive heat flow between the two objects with substantially low thermal resistance. However, this is merely an example of two objects in thermal contact, and claimed subject matter is not limited in this respect. Note that thermal contact between two objects does not require that the two objects be in physical contact (i.e. touching). For example, a thermal load and heat sink separated by a layer of high-thermal-conductivity heat sink paste are in thermal contact, even though they are not in physical contact. Herein, two objects in thermal contact may also be referred to as "thermally coupled". Throughout this discussion herein, unless otherwise defined, the term "heat sink" should be interpreted to mean a structure providing substantially high internal thermal conductivity and a surface area for transfer of heat to or from a surrounding medium (e.g., air, mixtures of gases other than air, pure gases, fluids, etc.).

Referring to the particular implementation of FIGS. 5 and 6, heat from a thermal load enters a base plate 11 through a surface facing the thermal load, flows through the interior region of base plate, across an air gap 12 between abutting surfaces of the base plate 11 and heat-sink-impeller structure 13, into an interior region of the rotating heat-sink-impeller structure, and is then deposited into the air that circulates through the impeller fins. Base plate 11 may also act as a heat spreader in applications in which a thermal load is concentrated in a small area and/or is otherwise distributed unevenly. The heat-sink-impeller structure 13 may rotate at high speed and function as both a heat sink and a centrifugal pump. There is no need for a fan in this particular embodiment. Here, air is drawn in the downward direction near the center of rotation and then expelled radially through impeller blades.

As illustrated in FIGS. 5 and 6, a rotating heat sink structure is supported by an air bearing that prevents the structure from coming into physical contact with the base plate during operation. The heat-sink-impeller structure may be kept centered on the base plate by the attractive interaction of a rare earth magnet 14 incorporated into the heat-sink-impeller structure, and a second rare earth magnet 15 (visible in FIG. 6) embedded in the base plate. These magnets may also allow the device to be operated upside down, or in an arbitrary orientation. The rotation mechanism comprises a variable reluctance motor in which stator cores 16, stator core windings 17, and rotor teeth 18 may be incorporated directly into the base-plate-impeller assembly.

Figure 7:
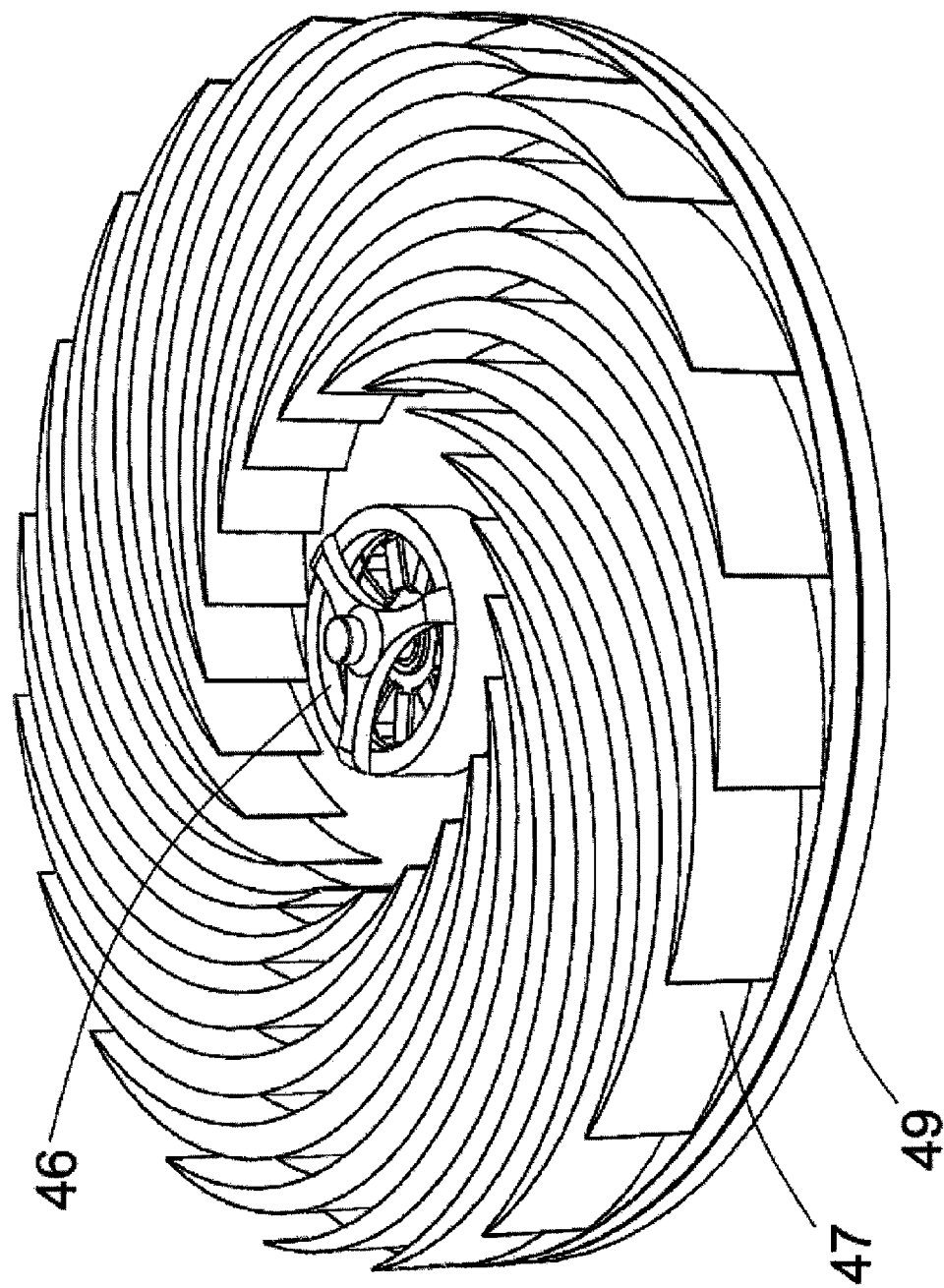
FIG. 7 shows another representative embodiment in the form of an isometric line drawing.

FIG. 7 shows an isometric line drawing of another embodiment. The motor assembly 46 of FIG. 7 may be located inside, rather than peripheral to, the heat sink structure 47. In other embodiments, the motor assembly may be positioned in other locations. Generally, a stator of the motor assembly 46 may be affixed to a base plate 49 and a rotor of the motor assembly 46 may be coupled to the heat sink structure 47 to cause rotation or other movement of the heat sink structure relative to the base plate.

Figure 8:
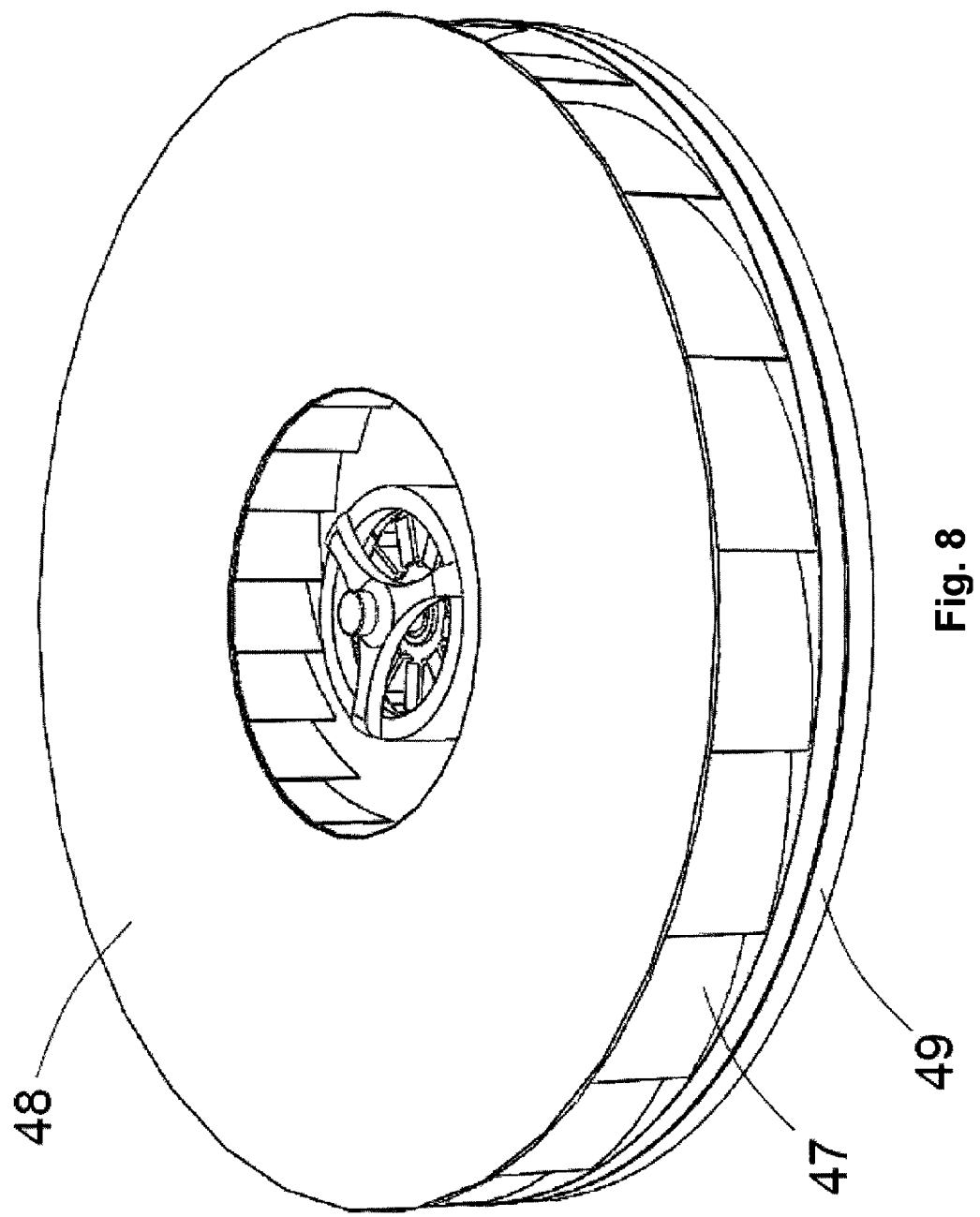
FIG. 8 shows another representative embodiment in the form of an isometric line drawing.

FIG. 8 shows an isometric line drawing of the assembly of FIG. 7 including a shroud 48. The shroud 48 may be positioned to direct air flow in and around the heat sink structure 47. So, for example, the shroud 48, positioned as shown in FIG. 8 may reduce airflow in an upward direction as shown, while allowing air flow through fins of the heat sink structure 47. The shroud 48 may be coupled directly to the heat sink structure 47 and may rotate or otherwise move during operation in a similar manner as the heat sink structure 47. In other embodiments, however, the shroud may resemble more of a cover, and may not be directly attached to the heat sink structure 47 and may not move during operation. In embodiments where the shroud 48 is thermally coupled to the heat sink structure 47, it may advantageously provide additional surfaces for heat transfer to a surrounding environment.

Figure 9:
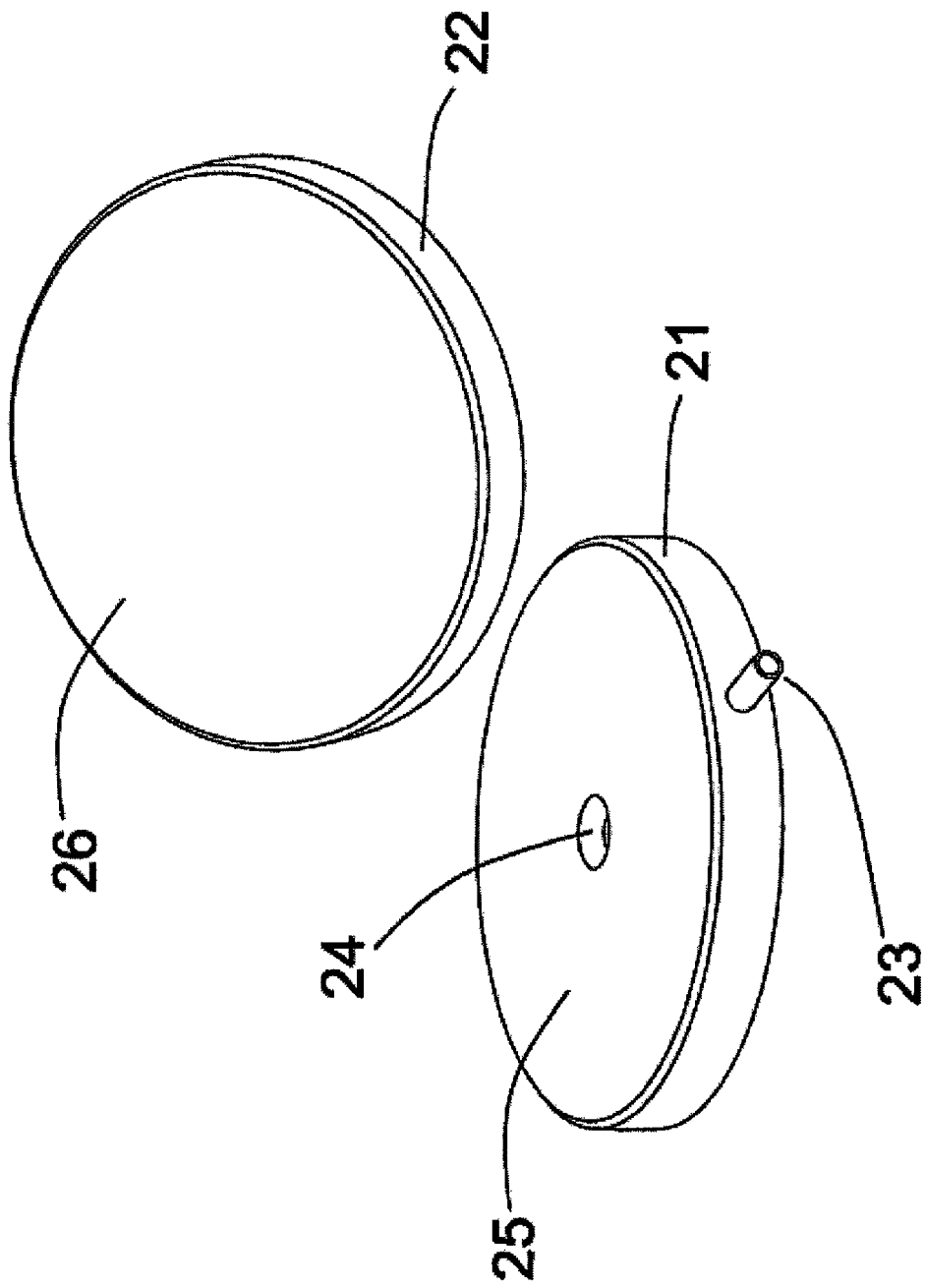
FIG. 9 shows an example of a commercially available air bearing.

FIG. 9 shows a type of air bearing that may be used in a particular implementation. Such a hydrostatic (externally pressurized) air bearing may comprise one of several air bearing assemblies such as those sold by New Way Air Bearings (Ashton, Pa., www.newwayairbearings.com). At lower left in FIG. 9 is the air bearing "pad" 21, and at upper right in FIG. 9 is the air bearing "puck" 22. An input port 23 delivers compressed air to an output orifice 24. During operation, the mating surface of the air bearing pad and the mating surface of the air bearing puck (25 and 26, respectively) are separated by a thin cushion of compressed air. The compressed air flows from the orifice 24, in the radial direction through the narrow air gap region defined by surfaces 25 and 26, and is then discharged at the perimeter of the air bearing assembly. In the representative embodiment illustrated in FIGS. 5 and 6, base plate 11 serves as the air bearing pad and the rotating, finned heat sink 13 serves as the air-bearing puck. An ultra-low-friction interface between the rotating heat-sink-impeller structure and base plate is analogous to that of an air hockey puck and air hockey table. During operation, the thickness of the air layer 12 that separates the stationary base plate and the rotating heat-sink-impeller structure is on the order of 5 μm, comparable to that of commercial air bearings.

In the representative embodiment illustrated in FIGS. 5 and 6, a hydrodynamic (sometimes referred to as a "self-pressurizing air bearing"), rather than a hydrostatic, air bearing is used. The use of a hydrodynamic air bearing can eliminate the need for an external source of compressed air. In such a hydrodynamic bearing, a small portion of mechanical power transmitted to the rotating structure may be used to generate the required film of air between the rotating and stationary surfaces (cf. G. W. Stachowick and A. W. Batchelor, *Engineering Tribology*, 3rd edition, Elsevier Butterworth-Heinmann, Burlington, Mass., 2005).

Operation of a hydrodynamic bearing may be considered analogous to hydroplaning of a car tire on wet pavement when a vehicle is traveling at high speed. At low speed, hydroplaning does not occur because the water that accumulates in front of the tire as it travels in the forward direction is excluded from the region of contact between the pavement and the tire; a portion of the water flows around the tire, and a portion of the water flows through the grooves of the tire tread. If the vehicle is traveling fast enough, however, the flow rate of water impinging on the front of the tire exceeds the amount of water that can flow around the tire and through the grooves of the tire tread. Under these conditions, a wedge-like film of water builds up underneath the tire tread, and lifts the tire off of the surface of the road. With the pavement and tire tread no longer in physical contact, traction drops precipitously. In a conventional hydrodynamic bearing, a similar effect may be exploited to create a low-friction bearing between two surfaces that move relative to each other.

The type of hydrodynamic air bearing used in the representative embodiment illustrated in FIGS. 5 and 6 is sometimes referred to as a "Rayleigh Step Bearing", and comprises a series of radial grooves 19 (visible in FIG. 6) inscribed into the top surface of the base plate 11. During operation, air is pumped in the azimuthal direction between successive grooves by viscous interaction with the bottom surface of the rotating heat-sink-impeller structure 13. Air flow in the azimuthal direction between successive grooves 19 may enable separation of the stationary and rotating surfaces; if the speed of rotation is high enough, static air pressure generated by the series of radial grooves may be sufficient to lift the heat-sink-impeller structure and cause separation of the stationary and rotating surfaces.

The presence of radial grooves in the top surface of the base plate results in a small reduction in the area for the narrow air gap region. Although this may increase the thermal resistance of the air gap region, it is a very small effect. It is also important to note that turbulence generated in the grooved hydrodynamic air bearing structure is expected to enhance convective heat transfer between base plate 11 and heat transfer structure 13.

One property of air bearings is that the air gap distance, while very small, is self-regulating. If we consider operation of the device shown in FIGS. 5 and 6 in the "right-side-up" orientation, the upward force exerted by the air bearing may be balanced by the downward force exerted by the magnetic field, and to a much lesser extent, the force of gravity (even for the very small cylindrical rare earth magnets used for the device shown in FIGS. 5 and 6, which are 0.125" in diameter and 0.100" in length, magnetic force may be approximately a factor of ten larger than the gravitational force). An equilibrium air gap distance is determined by the flow rate of air through the air gap region and the strength of the magnetic force. Instead of attempting to maintain a ~5 µm air gap by holding extremely tight mechanical tolerances, particular embodiments rely on built-in negative feedback between the air gap distance and the air gap pressure force.

In qualitative terms, the manner in which an air gap may be automatically stabilized by negative feedback may be readily explained. A more subtle point is that in quantitative terms, air bearings may provide extremely high stiffness. The effective "spring constant" of an air bearing may be very large because the equilibrium air gap pressure is an extremely sensitive function of air gap distance; the spring constant may be defined as dF/dh, where F is the pressure force acting on the bottom surface of the heat-sink-impeller structure and h is the air gap distance. For the device shown in FIGS. 5 and 6, in particular, the embodiments comprising rare earth magnets 14 and 15 may make the effective weight of the 100 gm heat-sink-impeller structure 13 1.0 kg. The magnetic force may be considered approximately constant for a small displacement in the z direction if the air gap distance is orders of magnitude smaller than the extent of the magnetic field in the x-y plane.

However, there is an approximately third-order relationship between air gap distance and pressure force. This may imply that a variation in displacement over a range 5±1 µm should result in a change in pressure force of roughly ±50%. For the device shown in FIGS. 5 and 6, this may translate to a spring constant of approximately 5 N/µm. The force of 1 g acceleration acting on a 100 gm heat-sink-impeller structure is approximately 1 N. It is therefore expected that an acceleration of 10 g along the z-axis may only result in a displacement of order 2 µm. Although it is well known that air bearings may provide ultralow friction performance, the very high mechanical stiffness that may be realized with air bearings plays an important role in many applications.

Another quantitative assessment that may be made regarding the use of an air bearing concerns power that may be expended to levitate a heat-sink-impeller structure. For a hydrostatic air bearing, the power expended to force air through the flow restriction of the gap region may be the product of the pressure drop across this flow restriction and the volumetric flow rate. Equations for pressure and volumetric flow rate for a hydrostatic air bearing such as that shown in FIG. 9 are (cf. Whitney, W. M., *Theory of the Air-Supported Puck*, Amer. J. Physics, Vol. 32, No. 4, pp. 306-312, 1964):

$$p = \frac{m_{eff} g}{\pi(b^2 - a^2)} \ln\left(\frac{b}{a}\right)$$

$$\Phi = \frac{m_{eff} g h^3}{3\mu(b^2 - a^2)},$$

where p is pressure, $\Phi$ is volumetric flow rate, $m_{eff}$ is the effective mass of the puck (associated with the combined magnetic and gravitational forces), g is the gravitational acceleration constant, b is the outer radius of the heat sink puck, a is the radius of the approximately isobaric region defined by the orifice, $\rho$ is the density of air, h is the air gap distance, and $\mu$ is the dynamic (or absolute) viscosity of air. For the device shown in FIGS. 5 and 6, we calculate a pressure and volumetric flow rate of:

$$p = \frac{(1.0 \text{ kg})(9.8 \text{ N kg}^{-1})}{\pi[(4.6 \times 10^{-2} \text{ m})^2 - (5.0 \times 10^{-3} \text{ m})^2]} \ln\left(\frac{4.6 \times 10^{-2} \text{ m}}{5.0 \times 10^{-3} \text{ m}}\right)$$

$$= 3.3 \times 10^3 \text{ N m}^{-2},$$

and:

-continued $$\Phi = \frac{(1.0 \text{ kg})(9.8 \text{ N kg}^{-1})(5.0 \times 10^{-6} \text{ m})^3}{3(1.8 \times 10^{-5} \text{ N m}^{-2} \text{ s})[(4.6 \times 10^{-2} \text{ m})^2 - (5.0 \times 10^{-3} \text{ m})^2]}$$
$$= 1.1 \times 10^{-8} \text{ m}^3 \text{ s}^{-1}.$$

The power required to operate the air bearing, therefore, is negligible (e.g., compared to the power consumption of even the smallest commercially available brushless motor fans):

$$P = p\Phi = (3.3 \times 10^3 \text{ Nm}^{-2})(1.1 \times 10^{-8} \text{ m}^{-3}\text{s}^{-1}) = 3.6 \times 10^{-5} \text{ W}.$$

This small number results from the fact that the air gap distance is extremely small compared to the distance over which the air must flow to escape from underneath the heat-sink-impeller structure, and the fact that the upward pressure force exerted by the air acts over a relatively large area.

In the case of a hydrodynamic air bearing, an estimate of the power consumption can be determined directly from a bearing coefficient of friction, which may be calculated theoretically, but which may be more accurately measured experimentally. Such experimentally measured coefficients of friction for a wide variety of hydrodynamic air bearings are typically extremely low compared to the coefficients of friction for comparably sized ball bearing assemblies (cf. Fuller, D. D., "A Review of the State-of-the-Art for the Design of Self-Acting Gas-Lubricated Bearings," *Journal of Lubrication Technology*, Vol. 91, pp. 1-16, 1969). Accordingly, the power consumption of implementation of such hydrodynamic air bearings may be extremely low.

In particular implementations, a hydrodynamic air bearing may include a provision for startup and shutdown since a hydrodynamic lifting force may only be generated if the heat-sink-impeller is rotating. In one implementation, sliding contact between surfaces of a base plate and heat-sink-impeller structure may be allowed for a few seconds while a motor is turned "on" or "off". This technique may be applicable to hydrodynamic air bearings that have a large surface area and carry a light load, especially if the particular application does not require a motor to be repeatedly switched on and off during normal operation. The use of an anti-friction coating and/or lubricant film may be provided in such air bearing systems.

If cumulative wear associated with occasional sliding contact between surfaces of a base plate and heat-sink-impeller structure is deemed objectionable, a mechanism may be introduced that may be used to provide an auxiliary levitation force during startup and shutdown. For example, in the representative embodiment illustrated in FIGS. 5 and 6, one approach would be to configure the stator/rotor tooth geometry to provide a magnetic force component perpendicular to the plane of rotation. During startup and shutdown a large D.C. bias current may be applied to the stator coils to generate a lifting force. Such a D.C. bias current may be made much larger than the normal rms operating current of the motor without overheating the stator windings because it may only be applied for a brief interval.

From the standpoint of the prior art, the idea of intentionally introducing an air gap between a thermal load and heat sink structure would appear to be ill-advised; much of the prior art is concerned with materials and techniques for bonding the thermal load and metal heat sink together in a manner that creates a solid, low-thermal-resistance joint, completely free of voids. Such thermal interface technology continues to be an active area of research. Moreover, it is well known that the thermal bottleneck for heat flow in conventional HSPF devices is the thin insulating film of boundary-layer air that envelopes the surfaces of the finned heat sink. Thus in qualitative terms, the argument that the introduction of an air gap would be counter-productive due to the very poor thermal transport properties of air may be considered convincing and/or obvious. But particular embodiments described herein employ unique properties of gas bearings and lead to an entirely different conclusion, especially if a quantitative analysis of heat transfer in a gas bearing structure is undertaken.

For example, for the particular embodiment illustrated in FIGS. 5 and 6, the thermal resistance across the planar air gap 12 may be made very small, ≤0.03 K W$^{-1}$. An absolute upper limit for the thermal resistance of the air gap region can be calculated by assuming that the air residing in the gap region is completely motionless. In the system shown in FIGS. 5 and 6, according to a particular embodiment, the diameter of the heat-sink-impeller structure is 3.6" (0.092 m) and the air gap distance is 5.0 μm. For an air gap of these dimensions, a worst-case value of the thermal resistance ($R_{air\ gap}$) may be given by:

$$R_{air\ gap}(\text{worst case}) = \frac{d_{air\ gap}}{k_{air} A_{air\ gap}} = \frac{(5.0 \times 10^{-6} \text{ m})}{\pi(0.025 \text{ W m}^{-1}\text{K}^{-1})(0.046 \text{ m})^2} = 0.030 \text{ K W}^{-1}.$$

This is about a factor of ten lower than the thermal resistance of the high-performance commercially available CPU coolers discussed earlier. It should be understood that this illustration with specific dimensions and measurements is merely an example of a particular implementation and that claimed subject matter is not limited in this respect.

Moreover, the thermal resistance of such an air gap region may actually be considerably lower (e.g. <0.01 K/W) due to violent shearing of the air flow between the top surface of the stationary base plate and the bottom surface of the rapidly rotating heat-sink-impeller structure (cf. Tennekes, H. and Lumley, J. L., *A First Course in Turbulence*, The MIT Press, Cambridge, Mass., 1972), due to the convective flow generated by the radial grooves of the hydrodynamic air bearing (cf. Faria, M. T. C. and Andres, L. S., "On the Numerical Modeling of High-Speed Hydrodynamic Gas Bearings", *Journal of Tribology*, Vol. 122, No. 1, pp. 124-130, 2000), and/or additional structures such as surface protuberances adapted to generate turbulence and/or convection in the air gap region.

The prior art in the field of thermal management technology teaches away from the use of air gaps and other such equivalent structures to provide a low-thermal resistance joint (e.g., between a heat sink and a thermal load). As alluded to earlier, one reason for this may be considered obvious; commonly available fluids such as water or oil have thermal transport properties that are far superior to gaseous media (e.g., higher thermal conductivity by a factor of 100). Such fluid media may therefore be assumed suitable for an application such as the transport of heat from a stationary heat conducting structure to a rotating heat transfer structure. Moreover, the prior art does not anticipate the extent to which the obvious disadvantage of low thermal conductivity might be offset by the numerous other advantages conferred by use of a gaseous medium in such an application (e.g., extremely low frictional losses at high rotational speed).

An objective of the embodiments described herein is to avoid the numerous and very serious drawbacks that may be associated with the use of a liquid heat transfer interface.

Some of the most serious drawbacks are related to the fact that the absolute viscosities of such liquids are typically on the order of 1,000 to 10,000 times that of air (cf. Fox, R. W. and McDonald, A. T., *Introduction to Fluid Dynamics*, 4$^{th}$ edition, John Wiley & Sons, New York, 1992). As a result, viscous shearing of a heat transfer fluid may generate a substantial quantity of heat. These frictional losses may be especially large when attempting to rotate a heat transfer structure at high speed, which may be critical to obtaining low thermal resistance between such a rotating heat transfer structure and a surrounding medium, such as air. High frictional losses may also be very undesirable from the standpoint of electrical power consumption.

The use of any such heat transfer liquid may also present several practical problems. The first of these is fluid containment. Centrifugal pumping force acting on the fluid in the radial direction, the need to operate and/or store such a cooling device in an arbitrary orientation (e.g., up-side-down), and issues related to thermal cycling (i.e., repeated expansion and contraction) of the fluid all can contribute to the problem of fluid containment. Possible approaches to mitigating fluid leakage may include increasing the viscosity of the heat transfer fluid and/or incorporating one or more rotary seals. Increasing the viscosity of the heat transfer fluid may be undesirable from the standpoint of frictional heating and electrical power consumption. The incorporation of rotary seals may be undesirable from the standpoint of cost, complexity, reliability, operating lifetime, and further frictional losses. In addition, the implementation of rotary seals may be complicated by the need to operate over a wide range in temperature. A further difficulty may be the tendency for such fluids to degrade over time, due to thermal decomposition, the introduction of contaminants, oxidation, etc. Finally, the steep temperature dependence of the viscosity for such liquids may also present serious practical problems; for example, very high starting torque requirements or seizure of the fluid joint at low temperature.

As noted earlier, a key drawback of the HSPF device architecture is the problem of high electrical power consumption. In a traditional forced-air heat exchanger, the purpose of the fan is to force air to flow through the fins of the heat exchanger. Relative to the power consumption of the fan motor, the amount of power (pressure times volumetric flow rate) required to force the air to flow through the fins of the heat exchanger may be very small. As demonstrated earlier, in a typical CPU cooler only 2% of the mechanical power generated by fan motor may be used for this purpose. The remaining 98% of the mechanical power generated by the fan motor may be expended unproductively on fan-blade viscous drag. In particular embodiments, this unproductive expenditure of power is substantially reduced or eliminated altogether. Moving a finned heat sink structure through the air, rather than moving air through a finned heat sink structure, allows substantially more or substantially all of the mechanical power delivered by the motor to be used for the purpose of generating relative motion between the heat sink fins and the surrounding air. The very low mechanical efficiency of the fans used in devices such as conventional CPU coolers suggests that such a particular device architecture according to an embodiment may allow markedly reduced electrical power consumption, reduced noise, and/or operation at much higher volumetric flow rates. Hereafter, we will refer to such aspects of embodiments described herein (by which the problem of low fan mechanical efficiency is substantially mitigated) as the "direct-drive advantage".

Another key objective of certain embodiments is to mitigate problems associated with boundary layer effects inherent to the HSPF device architecture. In a conventional HSPF device, for example, the Navier-Stokes equations for flow are governed by the pressure-gradient and viscous-drag force terms and conservation of mass (cf. Schlichting H., *Boundary Layer Theory*, McGraw-Hill, New York, 1979). As mentioned earlier, such a boundary layer can be modeled as an insulating layer of air that clings to the surface of the heat sink fins. In particular embodiments, heat sink fins and an envelope of boundary layer air that adheres to the heat sink fins may be placed in an accelerating (rapidly rotating) frame of reference. In the non-inertial, rotating frame of reference of such a heat sink-impeller structure, a volume element of air (dV) residing in the boundary layer may be subjected to an outward centrifugal force of $dF = \rho \omega^2 r dV$, where dF is the force acting on the volume element of air, $\rho$ is the density of air, $\omega$ is the angular velocity of the heat-sink-impeller structure, and r is radial position. This centrifugal pumping force distorts the flow field relative to the case of a non-rotating frame of reference, and in a manner that may reduce the thickness of the boundary layer considerably (e.g., by a factor of ten).

The ramifications of this boundary-layer thinning effect may be very substantial with regard to heat transfer. As discussed earlier, in conventional HSPF devices the difference in temperature between the finned heat sink and ambient air may be almost entirely accounted for by the temperature drop across the boundary layer. In other words, the boundary layer may act as a thermal bottleneck in the series of steps required to transport heat from the thermal load to the surrounding air. The thermal resistance of the boundary layer may be approximately proportional to the boundary layer thickness. A centrifugal pumping effect such as that described above may therefore provide approximately a factor of ten reduction in the thermal resistance of such a boundary layer. Hereafter, we will refer to such aspects of embodiments described herein (in which placement of a boundary layer in an accelerating frame of reference may mitigate the longstanding problem of boundary layer thermal resistance) as the "boundary-layer-thinning effect".

An additional effect that may be of significance at high rotational and/or translational speed concerns a transition from laminar to turbulent flow (e.g., for flow of air between adjacent heat-sink-impeller fins). For example, if the angular velocity of such a heat transfer structure is high enough to induce turbulence over a portion of a flow field proximate to such a heat transfer structure, a reduction in thermal resistance between such a heat transfer structure and a surrounding medium may be realized. Such turbulence effects may result in a reduction in thermal resistance between a heat transfer structure and a heat conducting structure as well. In particular embodiments, such turbulence effects may be adapted to provide enhanced performance of a heat exchanger comprising embodiments described herein. Hereafter, we will refer to such aspects of embodiments described herein (wherein operation of a heat transfer structure, or a portion of such a heat transfer structure, in the turbulent flow regime provides improved heat transfer relative to the case of laminar flow) as the "turbulent-flow effect".

The representative embodiment illustrated in FIGS. 5 and 6 is one of many possible embodiments of a device architecture that may comprise one or more of the following:

1. a heat conducting structure (e.g., "base plate" of the representative embodiment),
2. a heat transfer structure (e.g., "heat-sink-impeller" of the representative embodiment),
3. a gas filled region sandwiched between heat conducting and heat transfer structures, 4. element(s) adapted to impart rotation and/or translation to heat transfer structure,
5. element(s) adapted to control the axis of rotation of heat transfer structure,
6. one or more thermal loads in thermal contact with a heat conducting structure,
7. a surrounding medium to which, or from which, heat may be transferred, and may confer the benefits of the "direct-drive advantage" and/or the "boundary-layer thinning effect" and/or the "turbulent-flow effect", each of which is described above. Note that the above description of the "device architecture" is not meant to be limiting in any way. Rather, it is provided here as a point of reference for the description of alternative embodiments that follows.

Embodiments of an improved device architecture for air-cooled heat exchangers has been described above. Heat from a thermal load may be transmitted to a base plate by conduction through a suitable thermal interface material (e.g., thermally conductive grease), and this base plate functions as a heat spreader from which heat is transmitted from across a gas-bearing interface to a structure that functions as both a finned heat sink and impeller.

Regardless of the heat exchanger device architecture used, the use of a thermal interface material to create a low thermal resistance joint between a heat source and heat sink is widely practiced in the prior art. Such a thermal interface material usually takes the form of thermally conductive grease, paste, adhesive or a thin sheet of highly conformable, thermally conductive material. Without such a thermal interface material, when two solid surfaces are mated to form a joint, because of surface irregularities such as roughness and non-planarity, the area over which actual mechanical contact is achieved may only comprise ~1% of the geometric area of the joint. The purpose of the thermal interface material is to fill in the voids that would otherwise be present with one or more solid, semi-solid, or liquid materials having relatively high thermal conductivity.

Any such thermal joint must accommodate changes in the dimensions of both the heat sink and heat source as a function of temperature. For this reason, it is generally not possible to use an amount of thermal interface material merely equal to the total volume of the voids that would otherwise be present. Rather, a significant quantity of excess thermal interface material is used to create a somewhat thicker thermal joint capable of mechanical deformation to compensate for dimensional changes in the surrounding materials. The search for thermal interface materials with improved properties remains an active area of research because known materials with the appropriate rheological and wetting properties typically have relatively poor thermal conductivity.

Accordingly, another embodiment of the present invention is now described with reference to FIG. 10, directed in part toward eliminating or reducing the need for such a thermal interface material. In the representative embodiment of FIG. 10, a heat-sink-impeller 41 is located in close proximity to the thermal load, an integrated circuit package 42, without the need for a thermal interface material and base plate, as was shown in FIGS. 5 and 6. The heat-sink impeller 41 is one type of a heat transfer structure, as is generally described herein. In other embodiments, other heat transfer structures may be used. As described above, the heat-sink-impeller 41 may be supported by a gas bearing. The low-thermal-resistance interface between the heat source and the heat-sink impeller structure comprises the gas filled gap region 43 between the heat source and the heat-sink-impeller structure FIG. 10 further illustrates such an integrated circuit connected to a circuit board 44 by multiple solder joints 45, as is customary. It should be understood that a wide variety of heat loads other than integrated circuits could be cooled in a similar manner. Similarly, a surface of the integrated surface package 42, a surface of the heat-sink-impeller 41, or both, may define one or more grooves or other textured surface, to facilitate an upward force on the impeller, as described above with reference to FIG. 6.

As described above, a wide variety of means can be used to impart rotation, or other movement, to the heat-sink-impeller structure 41. Generally, as described herein, the heat transfer structure may be rotated or otherwise moved by a motor in some examples. The heat transfer structure, such as the heat-sink-impeller 41, may accordingly serve as or be coupled to a rotor. A corresponding stator structure may be provided to drive the motor. In one embodiment, the means for imparting rotation to the heat-sink-impeller structure may be incorporated directly into the integrated circuit package 42. Such means may include drive circuitry, electromechanical actuators such as stator coils, and one or more components adapted to maintain a substantially constant axis of rotation (as described herein). For example, coils forming all or a portion of a stator structure may be located within the integrated circuit package 42, and may for example be embedded in the integrated circuit chip within the package or in epoxy within the package. The drive circuitry used to operate a motor and move the heat-sink-impeller may be incorporated into the integrated circuit within the package 42. In another embodiment, some or all of the means for imparting rotation, or other movement, to the heat-sink-impeller structure may be incorporated into one or more components external to the integrated circuit package. In another embodiment, the heat-sink-impeller may function as the rotor of an induction motor, thereby eliminating the need to incorporate permanent-magnet and/or high-magnetic-permeability materials into the heat-sink-impeller structure.

A number of alternative embodiments are described below in which one or more of the above elements may differ from that shown in the representative embodiment of FIGS. 5, 6, and 10. These alternative embodiments are not intended to be exhaustive, and other variations may occur.

In the representative embodiment shown in FIGS. 5 and 6, a heat conducting structure 11 and/or a heat transfer structure 13 may be made out of MIC6® (Alcoa) aluminum alloy. However, other alloys of aluminum, metals other than aluminum, alloys of metal other than aluminum, or non-metal materials may be used without departing from claimed subject matter. Material features may include high-thermal-conductivity, low-density, high-stiffness, and favorable properties from the standpoint of fabrication, such as machining, casting, polishing, and the like. In small quantities, such structures may be machined out of a solid block of aluminum. For fabrication in large quantities, such a heat conducting structure and/or heat transfer structure may be fabricated as a monolithic die-cast aluminum part in which one or more surfaces may be subsequently subjected to a semi-precision planning/polishing operation. Die cast aluminum may enable low-cost fabrication and may allow the use of alloy formulations with especially high thermal conductivity. Other manufacturing processes, such as investment casting, forging, extruding, rolling, drawing, brazing, chemical milling, etc., may be used in part or whole to fabricate the heat conducting structure without departing from claimed subject matter. Fabrication may also entail finishing operations including but not limited to fly-cutting, grinding, polishing, etc., without departing from claimed subject matter.

Whether fabricated by machining, die-casting, or other techniques, on such a heat transfer structure it may be advantageous to use fins with a tapered cross-section. For example, in the case of die-casting, tapering of the fins in the vertical (z) direction may facilitate removal of the cast part from the mold. In the case of a machined heat transfer structure, fabrication with a tapered end mill may provide a better finish and facilitate chip extraction relative to the case of an untapered end mill. In addition, if during operation the internal heat flux is monotonically decreasing in the z direction, an optimized heat transfer structure may employ some degree of fin tapering in the z direction to eliminate unnecessary, excess material that may otherwise increase weight and drag. Although not shown in FIGS. 5 and 6, fillets at the base of each fin, where each fin intersects the disc-shaped base of the heat-sink-impeller, may also be used. The use of fillets may enhance mechanical strength and facilitate flow of heat between the fins and a disc-shaped base of such a heat transfer structure. Such a heat transfer structure may also incorporate structures such as spars, beams, gussets, fillets, etc., that may increase mechanical rigidity.

In the representative embodiment shown in FIGS. 5 and 6, a heat conducting structure is shown as having a square footprint. Many other shapes could be used without departing from claimed subject matter, however. In the representative embodiment shown in FIGS. 5 and 6, the heat transfer structure has a circular footprint. But many other shapes, such as a regular polygon, could be used. In the representative embodiment, the center of rotation of the heat transfer structure coincides with a center of the heat conducting structure, but this is not a requirement.

The surface finish specification for commercial air bearing components such as those shown in FIG. 9 may be about 0.4 μm rms (root mean square) roughness, although rougher surfaces may be used (cf. *Air Bearing Application and Design Guide*, www.newwayairbearings.com, New Way Air Bearings, Ashton, Pa.). Here, a heat conducting structure and/or heat transfer structure may be machined from precision cast aluminum plate such as MIC6® (Alcoa). The surface roughness specification of MIC6® has a maximum value of 0.5 μm rms and a typical value of ≤0.3 μm rms. Additional characteristics of MIC6® are excellent machinability and high thermal conductivity (142 $Wm^{-1}K^{-1}$).

Figure 10:
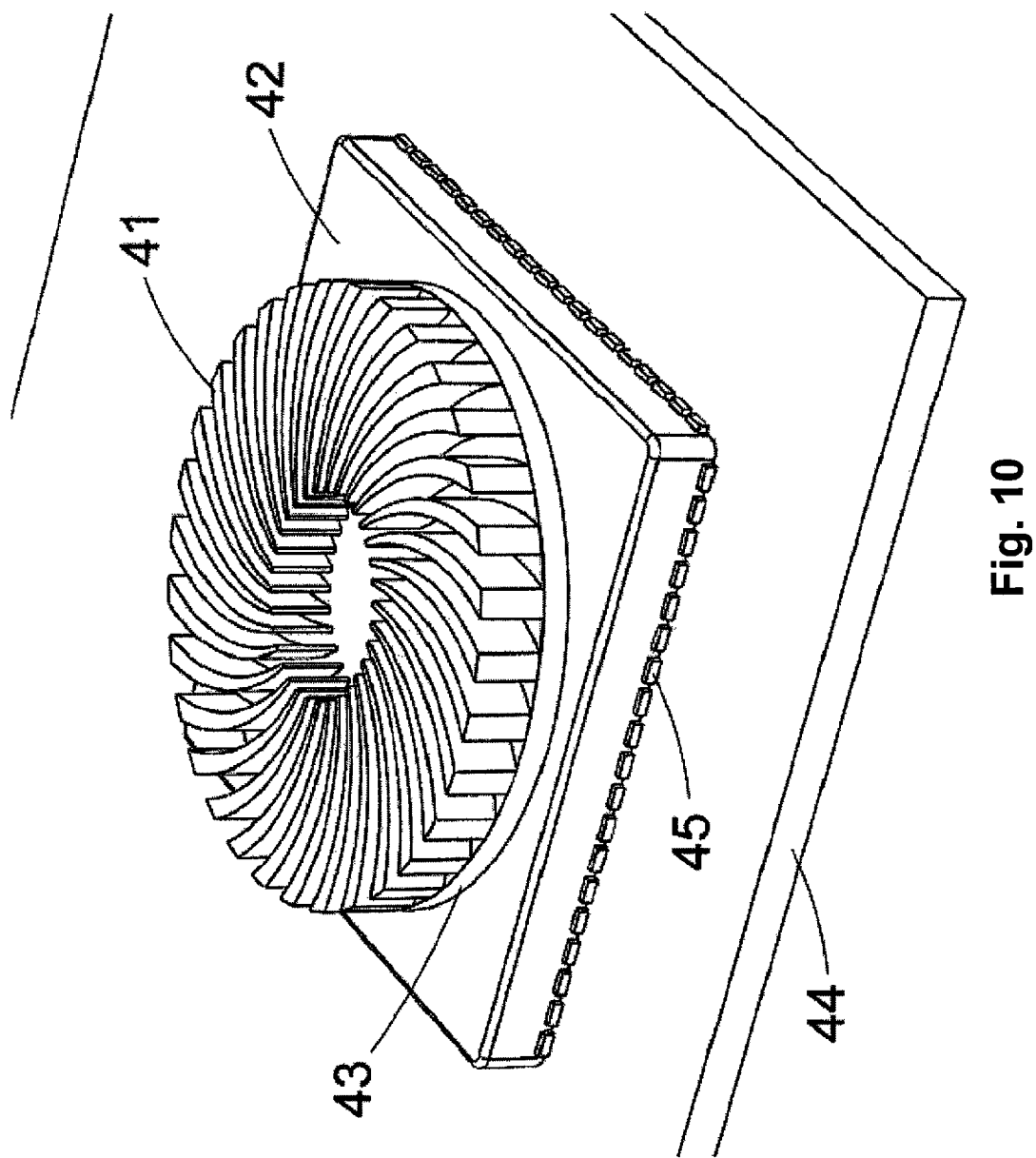
FIG. 10 shows a representative embodiment including an integrated circuit package.

In the representative embodiment shown in FIGS. 5, 6, and 10 surfaces of such a heat conducting structure and/or the heat transfer structure may be uncoated. However, one or more surfaces of such a heat conducting structure and/or the heat transfer structure could be coated to impart desirable attributes such as anti-friction, anti-wear, anti-corrosion, high emissivity, etc., and/or to provide an outer surface more suitable for one or more aspects of a fabrication process, such as polishing.

In the representative embodiment shown in FIGS. 5, 6, and 10 fins of the heat transfer structure take the form of swept, curved blades that project vertically and are designed to function in a manner similar to the vanes of a conventional impeller. However, a wide variety of other geometries could be used without deviating from claimed subject matter, including but not limited to non-curved blades, non-swept (i.e., radial) blades, forward-swept blades, backward-swept blades, blades incorporating curvature in a plane perpendicular to the plane of rotation, blades whose height along the axis of rotation is not constant as of radial position, blades whose cross-sectional area may vary as a function of height and/or radial position, etc., and various combinations thereof. The addition of stiffening members spanning multiple fins, or all of the fins, may be advisable under certain circumstances. However, other structures may be used instead of blades such as fins, pins, posts, vanes, channels, or ducts, or combinations thereof, and any such structure may also be slotted, perforated, textured, segmented, staggered etc. In addition, some of these projecting surfaces may be adapted to generation of wake vortices that interact with other portions of the heat transfer structure.

The extent to which such a rotating heat transfer structure imparts movement to a surrounding medium may vary substantially in different applications. For example, if such a heat transfer structure is similar in structure to an impeller, rotation of such a heat transfer structure may impart substantial motion to the surrounding medium in a manner similar to an impeller. On the other hand, in certain applications it may be desirable to entirely omit features such as blades, fins, posts, and the like, such that the rotating heat transfer structure takes the form of a flat disc or other shape with a smooth top surface.

If the primary objective is heat exchanger performance (e.g., low thermal resistance), the pressure/flow characteristics of a centrifugal pumping effect associated with rotation of such a heat transfer structure may be considered incidental and of no particular importance. But in other applications, design and optimization may be directed at obtaining both good heat exchanger performance, and an ability to force inlet and/or outlet air streams through duct work and/or other such flow restrictions.

For example, we may consider a cooling application such as a commercial data center or server farm, which may take the form of a large room containing hundreds or thousands of computers. Each of these computers may draw in ambient air and discharge it back into the room at elevated temperature. The room air may be kept cool by a large central air conditioning system. Such an air conditioning system may consume a considerable amount of electrical power. Alternatively, a device architecture such as that shown in FIGS. 5 and 6 may be adapted to efficiently extract waste heat from such a thermal load and dispose of it to the outside air without using an air conditioning system.

Figure 11:
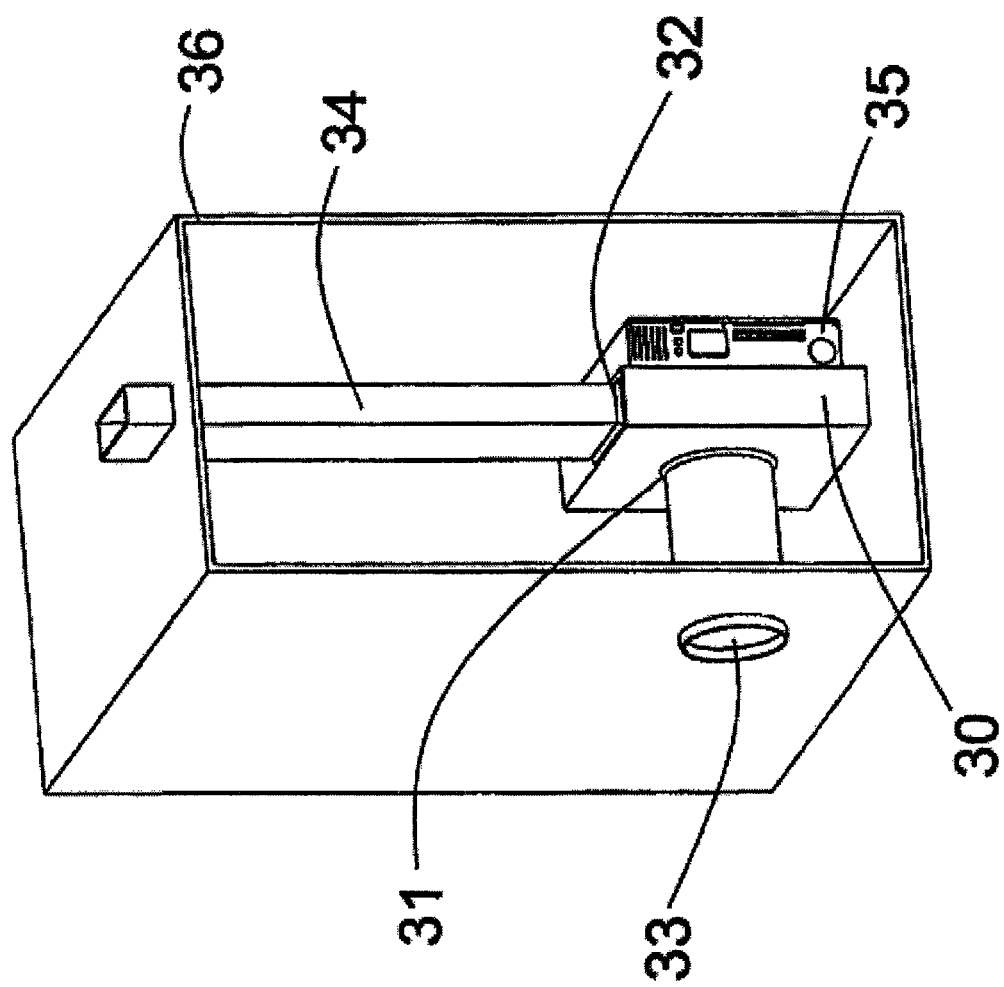
FIG. 11 illustrates a thermal management scheme based on one or more embodiments described herein.

In a thermal management scheme such as that shown in FIG. 11, a heat-sink-impeller may be enclosed in a manifold 30 whose geometry defines an inlet port 31 and an outlet port 32. Such an inlet port may be located above a center of rotation of such a heat-sink-impeller, where air may be drawn down into the impeller. Outside air (e.g., relatively cool air drawn from a location on the north side of a building) may be delivered through an air duct 33 plumbed directly to such an inlet port. Heated air discharged in the radial direction by such an impeller may be routed to such an output port. Such an output port may be plumbed to a second duct 34 that discharges to the outside air (e.g., on the roof of a building). In such a scheme, substantially none of the outside air and very little of the heat generated by the thermal load 35 may enter the building 36. This may substantially reduce or eliminate the need to process the large amount of waste heat generated in such a facility through such a building's air conditioning system.

Figure 12:
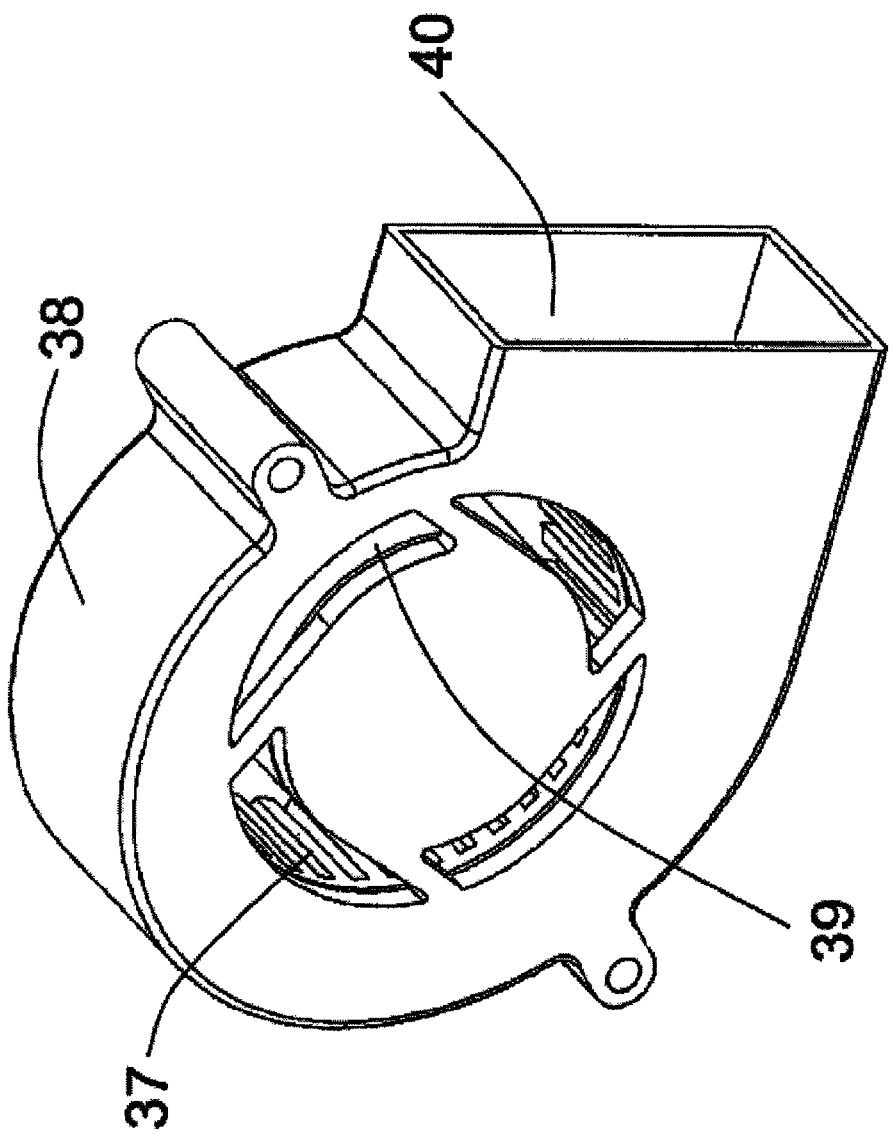
FIG. 12 illustrates a typical HVAC blower from the prior art.

Such a thermal management scheme exploits the fact that an impeller such as that shown in FIG. 5 may generate relatively high static pressures, comparable to (or greater than, if necessary) the centrifugal blowers widely used in commercial heating, ventilation, and air conditioning (HVAC) systems. A typical HVAC blower is shown in FIG. 12. Similar to the thermal management system described above, it takes the form of an impeller 37 enclosed in a manifold 38 whose geometry defines inlet 39 and outlet 40 ports that can be plumbed directly to air delivery and exhaust ducts, respectively. The above thermal management scheme also exploits the fact that the thermal resistance of such an air-cooled heat exchanger may be much lower than that of a traditional HSPF device. This much lower thermal resistance may mean that even if the outside air is significantly warmer than room temperature (e.g., 40° C. rather than 20° C.), such an air cooled heat exchanger can still perform its intended function of keeping the temperature of a thermal load below some predetermined value (e.g., 80° C.). It should be understood that more generally such a thermal management scheme may be applicable to any building, enclosure, or apparatus containing one or more thermal loads, including but not limited to a power plant, factory, computer data center, computer server farm, commercial building, laboratory, office, public space, residential dwelling, transport vehicle, instrument or machine.

In a particular embodiment, the thermal resistance of a heat exchanger comprising embodiments described herein may be adjusted by adjusting heat transfer structure speed of rotation and/or translation. In a further embodiment, such a heat exchanger having adjustable thermal resistance comprises a portion of a temperature control system.

In applications such as CPU cooling, air drawn into an inlet vent of a cooling system may contain a significant quantity of dust, particulate matter, and/or other contaminants, some of which may be deposited onto the surface of a finned heat sink. As a result, the performance of conventional CPU coolers based on the HSPF architecture may degrade over time, and eventually may lead to CPU malfunction. If the heat transfer structure rotates at high speed, an additional advantage over the prior art may be greatly reduced dust accumulation. To the extent that dust does accumulate, the direction of high speed rotation for such a heat transfer structure could also occasionally be reversed for a brief period of time, which may provide a "self-cleaning" mode of operation. Such a function could be controlled either in software (e.g., a computer operating system), hardware (e.g., a brushless motor driver circuit), or both. In applications where heat exchanger performance may be degraded by condensation and/or ice formation on a heat transfer structure, the use of a heat transfer structure that rotates at high speed may largely eliminate such problems. Lastly, if such a heat transfer structure is held in place by a magnet, rather than adhesive, heat sink paste, etc., this may facilitate easy removal of the finned heat transfer structure for extremely thorough cleaning if desired (e.g., cleaning in an ultrasonic bath).

In the representative embodiment shown FIGS. 5, 6 and 10, the gap region 12 and 43, respectively, may be filled with air. However, such a gap region may contain any mixture of gases, or alternatively, a pure gas. For example, the use of helium instead of air might be worthwhile in some applications because helium has approximately six times the thermal conductivity of air. In addition, such a system need not operate at or near atmospheric pressure. In some applications, operation above or below atmospheric pressure may confer certain advantages.

In the representative embodiment shown in FIGS. 5, 6 and 10, the shape of air gap region 12 and 43, respectively, between heat conducting structure 11 and heat transfer structure 13 and between IC package 42 and impeller structure 41 may be that of a cylinder with a very small height-to-diameter ratio. But an alternative gap region geometry may be used without departing from claimed subject matter (e.g., a non-cylindrical solid of revolution). For example, the heat conducting structure and heat transfer structure could be configured to have a substantially coaxial geometry, in which case the gap region may be described as having approximately the shape of a cylindrical shell. A gap region defined by a heat conducting structure and heat transfer structure separated by a distance that is substantially non-constant as a function of position may be used as well.

In particular embodiments, such a gap region may be adapted to provide substantially low thermal resistance. In this context, "substantially low thermal resistance" means that the thermal resistance between a heat conducting structure and a heat transfer structure is substantially less than the thermal resistance between said heat transfer structure and a surrounding medium, under certain operating conditions. For example, referring to FIG. 5, the thermal resistance between a heat-sink-impeller and a base plate may be substantially lower than the thermal resistance between said heat-sink-impeller and the surrounding air, if the heat-sink-impeller rotates at 1000 rpm. In particular embodiments, such a gap region may be adapted to provide substantially low-friction between a heat transfer structure and a heat conducting structure. In this context, "substantially low-friction" means that friction between a heat conducting structure and a heat transfer structure is substantially less than friction between said heat transfer structure and a surrounding medium, under certain operating conditions. For example, referring to FIG. 5, the amount of friction (e.g., resistance to rotation) between a heat-sink-impeller and a base plate may be substantially lower than the amount of friction between said heat-sink-impeller and the surrounding air, if the heat-sink-impeller rotates at 1000 rpm (e.g., because of aerodynamic drag).

In the representative embodiment shown in FIGS. 5, 6, and 10 a nominal air gap separation distance may be about 5 μm. However, there are situations in which this gap distance could be smaller or larger, depending on device size, operating environment, etc. For example, it may be possible to use submicron gap distances comparable to gas bearings used in certain classes of magnetic memory devices. The inclusion of structures adapted to generate convective mixing in the gas filled gap region may allow the use of considerably larger air gap distances. Thus the 5 μm separation distance cited for the representative embodiment herein is illustrative only and should not be construed as a rigid guideline or limitation.

In the representative embodiment shown in FIGS. 5 and 6, an interface between heat conducting structure 11 and heat transfer structure 13 may be configured as a hydrodynamic air bearing. Here, a wide variety of hydrodynamic gas bearing designs could be used instead of the Rayleigh Step Bearing illustrated in the representative embodiment. For example, particular embodiments illustrated above may use six identical grooves, each of which has a flat bottom, vertical walls, and a radial orientation. Any of these specifications may be changed without departing from claimed subject matter, however. With any such hydrodynamic gas bearing, instead of locating grooves on a surface of such a heat conducting structure, such grooves could be located on a surface of a rotating heat transfer structure, or such grooves could be included on both surfaces. Lastly, something other than a radial grooved structure, such as tangential grooves, combinations of radial and tangential grooves, or a textured (e.g., etched) rather than grooved surface may be used instead, or any combination thereof.

A hydrostatic (externally pressurized) air bearing could also be used. Such a hydrodynamic or hydrostatic gas bearing may also be equipped with one or more filters to prevent particulates and other sources of contamination from entering the gap region. Magnetic or electrostatic levitation bearings may be used as well. Lastly, a high-flow-rate hydrostatic bearing could be implemented such that a significant portion of the heat disposal provided by such a device is associated with the airflow through the narrow gap region.

In another embodiment, one or more lifting surfaces (fixed or variable airfoils) may be incorporated into a rotating transfer sink structure that may generate a lifting force in the positive z direction, or a downward restoring force in the negative z direction. In yet another embodiment, a rotor/stator assembly may be designed to generate a substantially non-zero magnetic force component along the z-axis that can be used as a lifting force in the positive z direction, or a downward restoring force in the negative z direction. In yet another embodiment, a downward restoring force in the negative z direction may be generated by substantial evacuation of a region between the heat conducting structure and the heat transfer structure using "vacuum preloading", in which a vacuum may be generated by an external pump, a pump integral to and powered by the rotating heat transfer structure, or both. Lastly, in a further embodiment, a gap distance is substantially zero, such that there is sliding contact between a surface of the heat transfer structure and a surface of the heat conducting structure, and wherein none, either or both, of these surfaces are either fully or partially treated with a lubricant and/or an anti-friction coating.

Gap distance may be passively regulated (e.g., by a balance of magnetic and pressure forces acting on a heat transfer structure, as in the representative embodiment shown in FIGS. 5 and 6), actively regulated (e.g., using a gap distance sensor and an actuator adapted to vary the gap distance), or unregulated (in which case gap distance may not be controlled, regulated or predetermined in any particular manner), depending upon the requirements of the particular application. Combinations of different regulation schemes may be used as well. One or more components or parameters that determine the gap distance may also be made adjustable. For example, in the representative embodiment shown in FIGS. 5 and 6), one or both of the rare earth magnets (14 and 15) could include a provision for adjusting the distance (and therefore the attraction force) between the two magnets. If a single permanent magnet and a piece of magnetic material such as high-magnetic permeability steel may be used, such an adjustment could be implemented in the form of a threaded steel plunger.

If a gas bearing system requires a mechanism to provide an auxiliary lifting force to maintain separation of a heat conducting structure and heat transfer structure at low rotational speed (e.g., during startup and shutdown) a wide variety of implementations are possible. Alternatively, such a lifting force could be applied on a continuous basis, and counteracted by an auxiliary downward force that may be applied at high rotational speed. Possible implementations may include, but are not limited to, use of a hydrodynamic foil/gas bearing (cf. Agrawal, G. L., "Foil/Gas Bearing Technology, An Overview," American Society of Mechanical Engineering, Publication 97-GT-347, 1997), use of an externally pressurized gas bearing, a means for providing an electromagnetic lifting force (incorporated into the motor and/or implemented as an independent structure), a transient repulsive force generated by applying a transient magnetic field that induces a transient eddy current in an electrically conductive structure (e.g., a heat transfer structure made of an electrically conductive metal) in accordance with Lenz's law (cf. Griffiths, D. G., Introduction to Electrodynamics, Prentice-Hall Inc., Englewood Cliffs, N.J., 1981), a centrifugally actuated auxiliary bearing, bushing, or other suitable structure that automatically deploys or retracts as the speed of rotation increases and/or decreases, and a wide variety of other automatically actuated or manually actuated mechanical devices, any equivalent structures, or combinations thereof.

In the representative embodiments illustrated in FIGS. 5, 6, and 10 there may be no mechanism adapted to provide translation of the heat transfer structure 13 or impeller 41 relative to the heat conducting structure 11 or package 42, respectively. In the representative embodiments illustrated in FIGS. 5, 6, and 10, a mechanism adapted for imparting rotation to the heat transfer structure may comprise a two phase, doubly salient, synchronous, variable reluctance motor. Such a motor may have four stator cores 16, four sets of stator windings 17, and four rotor teeth 18, incorporated directly into a heat conducting structure 11 and heat transfer structure 13, respectively. Stator cores and stator teeth may be fabricated from AISI 416 stainless steel, which has substantially high magnetic permeability, is corrosion resistant, and has excellent machinability. Each phase may comprise opposite stator pole pairs, and use alternating current waveforms approximately 90° out of phase to excite the two phases (cf. Chapman, S. J., Electric Machinery Fundamentals, 4th edition, McGraw-Hill, New York, 2005). An advantage of this design is its simplicity from the standpoint of fabrication. But this particular motor architecture does have some drawbacks; it is not self-starting (e.g., at rest, there are four rotor positions at which the net torque acting on the rotor is always zero) and the use of non-laminated stator cores and rotor blades may result in substantially large eddy current losses, especially if such a motor is operated at high speed (high excitation frequency).

It should be understood, however, that these are merely examples of how stators and rotors may be fabricated according to particular embodiments and that other rotors and stators, either fabricated from current or future techniques, may be used without deviating from claimed subject matter. For example, in other particular implementations, rotors may be fabricated from magnetically poled (e.g., a ring of magnetic material with alternating north and south pole segments), high electrical-resistivity and/or laminated material, and stators may be fabricated from high-electrical resistivity and/or laminated material. A magnetically poled rotor may allow construction of a simple two-phase motor that is self-starting from any initial position. Use of high-electrical resistivity and/or laminated stator and rotor poles may minimize eddy current losses. It should also be understood that a wide variety of other means for imparting rotation and/or translation to such a heat transfer structure may be used without departing from claimed subject matter. These include, but are not limited to, a motor integral to an assembly comprising a heat conducting structure and heat transfer structure of a different type than motors described herein, or the use of a non-integral, separate motor of any type, with torque transmitted to a heat transfer structure by any means. More generally, any source of mechanical actuation may be used, including, but not limited to, an electrical motor, an internal combustion engine, an air motor, a water-powered motor, etc., or any combination thereof.

Such a motor may also provide the additional functionality of a radial bearing, thrust bearing, or both. For example, a system that uses a hydrostatic gas bearing may incorporate spiral or other appropriately shaped grooves or channels into a bottom surface of a heat transfer structure, the interior region of a heat transfer structure, or both, to impart rotation to a heat transfer structure (cf. Satomi T. and Lin G., "Design Optimization of Spirally Grooved Thrust Air Bearings for Polygon Mirror Laser Scanners," JSME, International Journal, Series C, Vol. 36, No. 3, pp. 393-399, 1993).

In the representative embodiment illustrated in FIGS. 5 and 6, the axis of rotation may be maintained substantially constant by the attractive interaction of a first rare earth magnet 14 incorporated into the heat transfer structure 13, and a second rare earth magnet 15 (shown in FIG. 6) embedded in the heat conducting structure 11. This keeps the rotating heat transfer structure 13 approximately centered on the base plate 11, even if the base plate may be tilted or not mounted level. Alternatively, one rare earth magnet could be replaced with a piece of soft magnetic material, such as high-magnetic-permeability steel. In another embodiment, a hydrodynamic bearing may be configured as a hybrid thrust/radial gas bearing (e.g., by locating a rotating heat transfer structure in a close-fitting, grooved, cylindrical cavity). Such a mechanism adapted to maintain a substantially constant axis of rotation may also employ some form of radial bearing, including but not limited to, a conventional mechanical radial bearing, bushing or spindle, a hydrostatic or hydrodynamic radial gas bearing, an alternative form of magnetic radial bearing (e.g., different than that used in the representative embodiment), etc. In addition, such a radial bearing structure may also incorporate the function of a thrust bearing.

A thermal load may take any form, and may be thermally coupled to a heat conducting structure either directly (e.g., a CPU mounted directly to a heat conducting structure), or indirectly (e.g., a CPU mounted to the surface of a heat pipe structure, which in turn is mounted on a heat conducting structure). Such a thermal load may also be thermally coupled to the heat conducting structure by any means of heat transfer (e.g., conduction, convection, radiation, mass transfer, or any combination thereof). Flow of heat may be into or out of a thermal load, and embodiments described herein may be used in both cooling and heating applications. In particular embodiments, a heat conducting structure and the thermal load are separate elements connected by one or more low-thermal-resistance joints. In an alternative embodiment, a heat conducting structure and a thermal load may be constructed as a monolithic assembly, in which case there may be no requirement for such a low thermal resistance joint.

In the representative embodiments shown in FIGS. 5, 6, and 10 the medium surrounding the heat transfer structure 13 or 41 that provides a large thermal reservoir for heat disposal may comprise air. But such a thermal reservoir could also be any gas or gas mixture other than air, or a condensed-phase medium such as a liquid (e.g., water, oil, solvents, lubricants, etc.), a suspension, a slurry, a powder, or any other non-solid condensed-phase media or combinations thereof.

Particular values of parameters in the representative embodiment illustrated in FIGS. 5, 6, and 10 have been provided merely as examples according to a particular embodiment. It should therefore be understood that such parameters may take on other values depending on performance requirements, desired engineering tradeoffs, etc.

For example, in the particular device shown in FIG. 5, a heat-sink-impeller has 100 fins. But more generally, selection of a number of fins may involve a lengthy series of experimental measurements and/or flow field modeling in the vicinity of a rotating heat transfer structure. As with any heat exchanger, adding more fins may be desirable from the standpoint of increasing the total fin surface area. But at the same time, adding more fins may increase drag, and fin cross-sectional area in the x-y plane may not be large enough to provide adequate conduction of heat from the base of the fin to the top of the fin. An additional penalty that may be associated with increased drag is that operating at lower rpm may lessen the boundary-layer-thinning effect provided by placing the boundary layer in an accelerating frame of reference.

Experimental measurements and/or flow field modeling in the vicinity of a rotating heat transfer structure may also be required to determine an optimal fin "duty cycle". Here, fin duty cycle may be defined as a fin thickness divided by a fin-to-fin period in the azimuthal direction. In the device shown in FIG. 5, such a fin duty cycle is approximately 35%. Using fins thicker in an azimuthal direction to lower internal thermal resistance may reduce the width of air slots between fins, restricting the flow of air. Fin sweep angle and swept curvature geometry may also be altered for particular applications. The device shown in FIG. 5 has a sweep angle of 60° and a constant radius of sweep curvature in the x-y plane. Related to the question of fin geometry, another consideration is the fraction of the area on the rotating disk that is populated by fins. In the device shown in FIG. 5, an annular region containing fins corresponds to 80% of the total area of a rotating disk. Increasing fin areal coverage may provide better heat sinking. Again, however, the effects of restricting air intake in the center region of the impeller may need to be considered.

Experimental measurements and/or flow field modeling in the vicinity of a rotating heat transfer structure may also be required to optimize design parameters for a hydrodynamic gas bearing. For example, the number and geometry of the radial grooves used in the representative embodiment may not be optimal.

Embodiments of air bearing heat exchangers have accordingly been described above. The air bearing heat exchangers, by way of summary, generally include a heat conducting structure configured for thermal contact with a thermal load, a heat transfer structure coupled to the heat conducting structure to form a gas filled gap region between the heat conducting structure and the heat transfer structure. As described above, the heat transfer structure may be moveable relative to the heat transfer structure.

Figure 13:
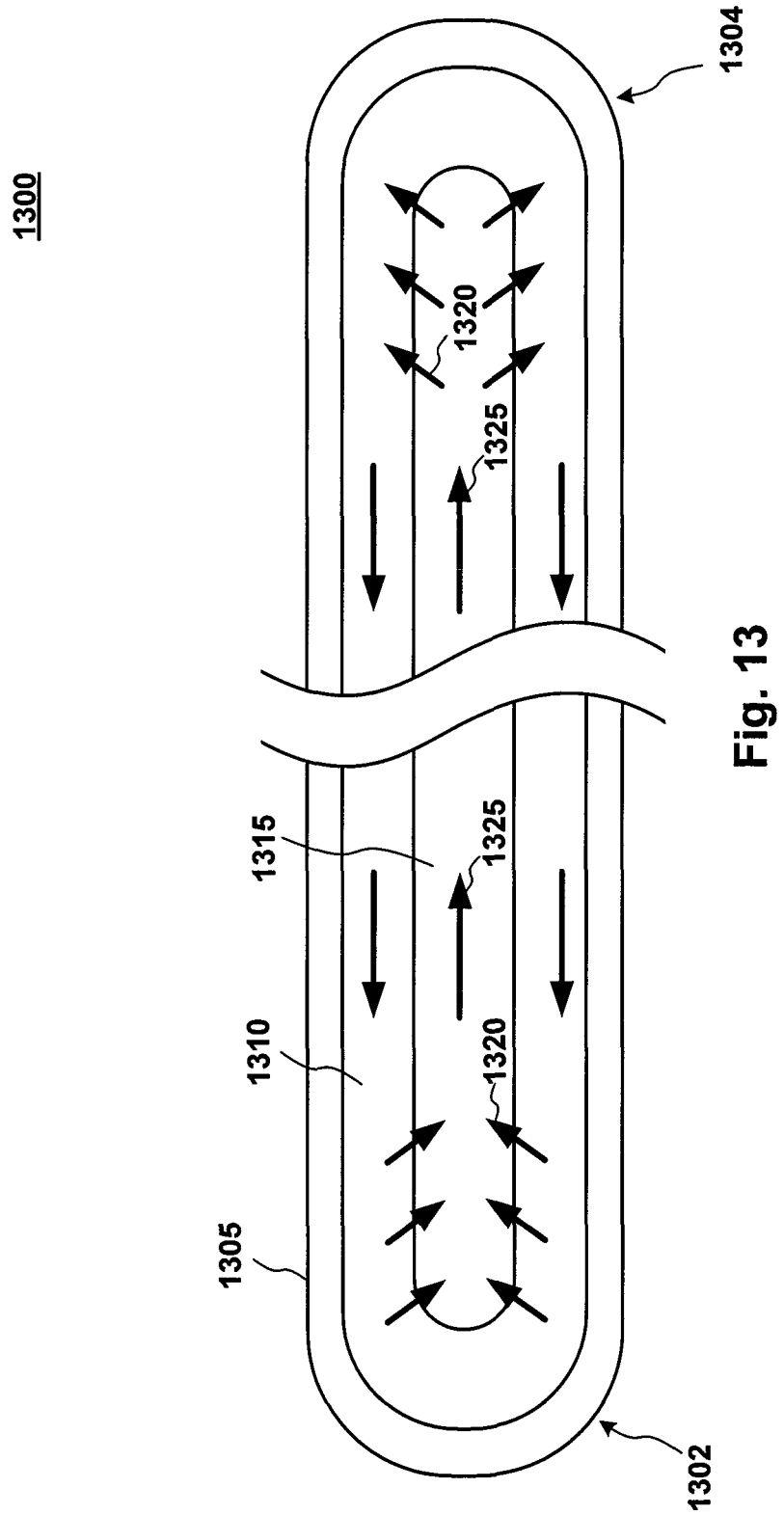
FIG. 13 is a schematic illustration of a heat pipe as known in the art.

Additional embodiments of the present invention may incorporate heat pipe technology. FIG. 13 is a schematic illustration of a heat pipe as known in the art. Heat pipes may also be referred to as vapor chambers. The heat pipe 1300 includes an enclosure 1305 and wicking material 1310 defining a cavity 1315. As is well known, the enclosure 1305 is typically evacuated, sealed, and contains a predetermined quantity of working fluid. The heat pipe 1300 has a higher temperature end 1302 and a lower temperature end 1304. At the higher temperature end 1302, heat from the thermal load causes the working fluid to evaporate to vapor, as shown by arrows 1320. The vapor may then travel along the heat pipe cavity 1315 as shown by arrows 1325. At the lower temperature end 1304 of the heat pipe, the working fluid vapor condenses, releasing the latent heat of vaporization of the working fluid. The vapor may be absorbed by the wicking material 1310, as shown by arrows 1330. The condensed working fluid subsequently flows back to the hot end of the heat pipe by gravity and/or capillary absorption through the wicking material or other suitable structure. Suitable enclosures, wicking materials, and working fluids, are known in the art. Typical working fluids include water, ethanol, and acetone. At reduced pressure, such fluids boil at relatively low temperatures, which may be advantageous for overall heat pipe performance. Heat pipes generally may provide a low thermal resistance conductive path and may be used to transport heat from thermal loads to heat exchangers. The effective thermal conductivity of such a heat pipe may be many tens of times that of solid copper metal. The enclosure 1305 and cavity 1315 may take substantially any form and may be configured to transport heat from a thermal load to a heat exchanger.

Recall that the heat conducting structure described above may be implemented as a solid, disk-shaped base plate fabricated from a material having substantially high thermal conductivity, such as copper. Embodiments described below include embodiments where the heat conducting structure described above may be implemented at least in part using a heat pipe.

Figure 14:
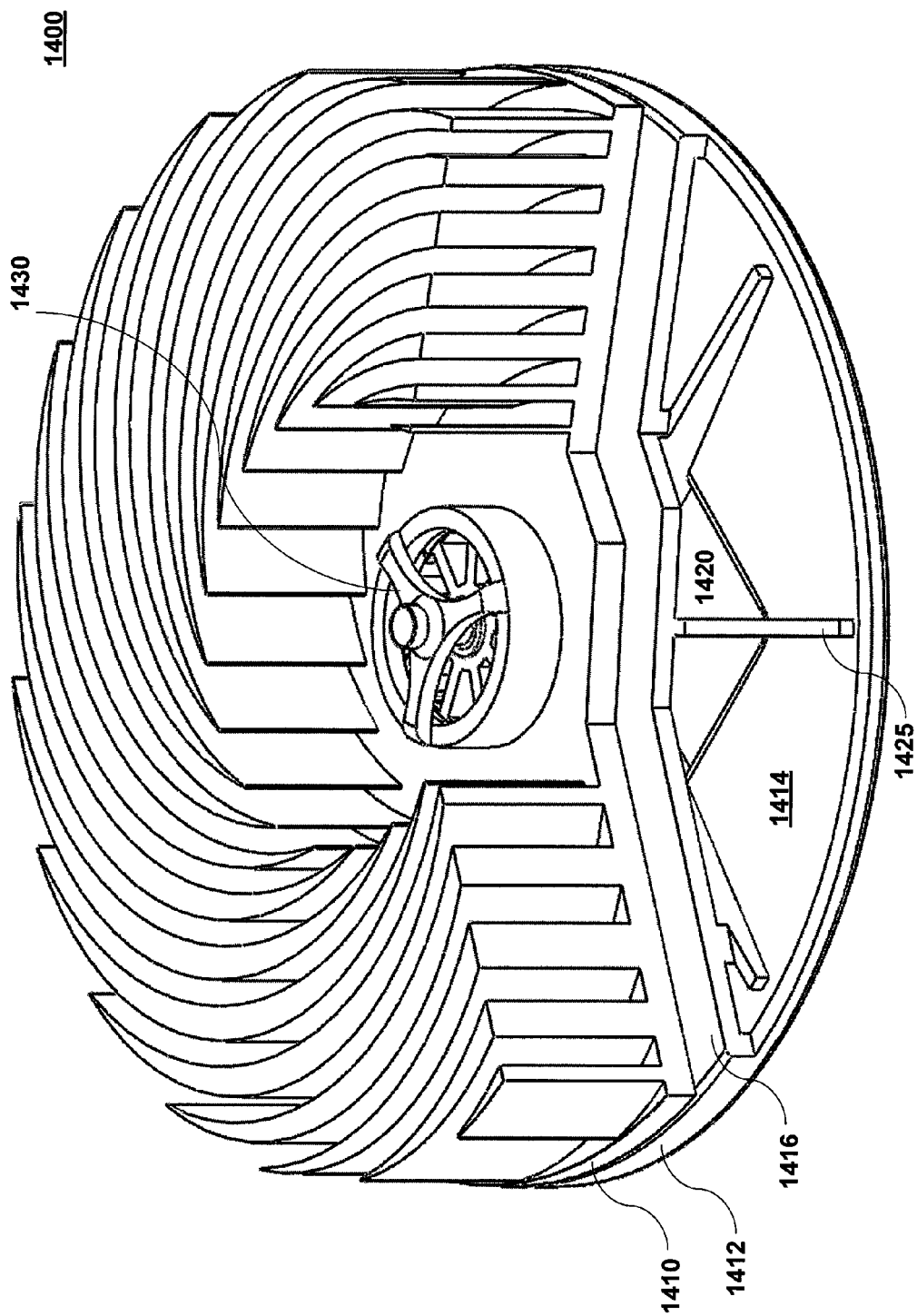
FIG. 14 is a schematic illustration of an air bearing heat exchanger 1400 according to an embodiment of the present invention.

FIG. 14 is a schematic illustration of an air bearing heat exchanger 1400 according to an embodiment of the present invention. Referring to FIG. 14, as in previous embodiments, a heat transfer structure 1410 (also referred to as a heat-sink-impeller) may be separated from a heat conducting structure 1412 by a small planar air gap region. Rather than comprising a solid block of thermally conductive material such as copper, however, the heat conducting structure 1412 defines an internal hollow cavity 1414, shown in a cut-out view in FIG. 14. This hollow cavity may be sealed, evacuated, and contain a working fluid. In this manner, the heat conducting structure 1412 may function as a heat pipe.

Utilizing a heat pipe as all or a portion of the heat conducting structure 1412 may advantageously minimize or reduce the thermal resistance associated with distribution of heat from one or more concentrated thermal loads mounted on the bottom and/or other exterior surface of the heat conducting structure at one or more locations, to a top surface 1416 of the heat conducting structure. Increased uniformity of heat distribution across the area of entire top surface 1416 of the heat conducting structure may improve transmission of heat across an air gap region of large cross-sectional area, so as to reduce the thermal resistance of the air gap region.

The hollow cavity 1414 of the heat conducting structure 1412 contains a working fluid, and may contain one or more structures adapted to transporting condensed working fluid from a lower temperature end of the heat pipe to a higher temperature end of the heat pipe (e.g. by capillary absorption). Materials such as sintered metal powder, cloth wick, or grooves inscribed in portions of the heat pipe structure exposed to vapor are representative of structures directed towards capillary absorption, but others may be used. Provided the heat pipe is in an appropriate orientation, gravity can also be used to transport condensed working fluid from the lower temperature end of the heat pipe to the higher temperature end of the heat pipe. Further, more than one such "fluid return mechanism" may be employed simultaneously. In FIG. 14, the working fluid and optional fluid return structure(s) have been omitted for clarity.

Figure 15:
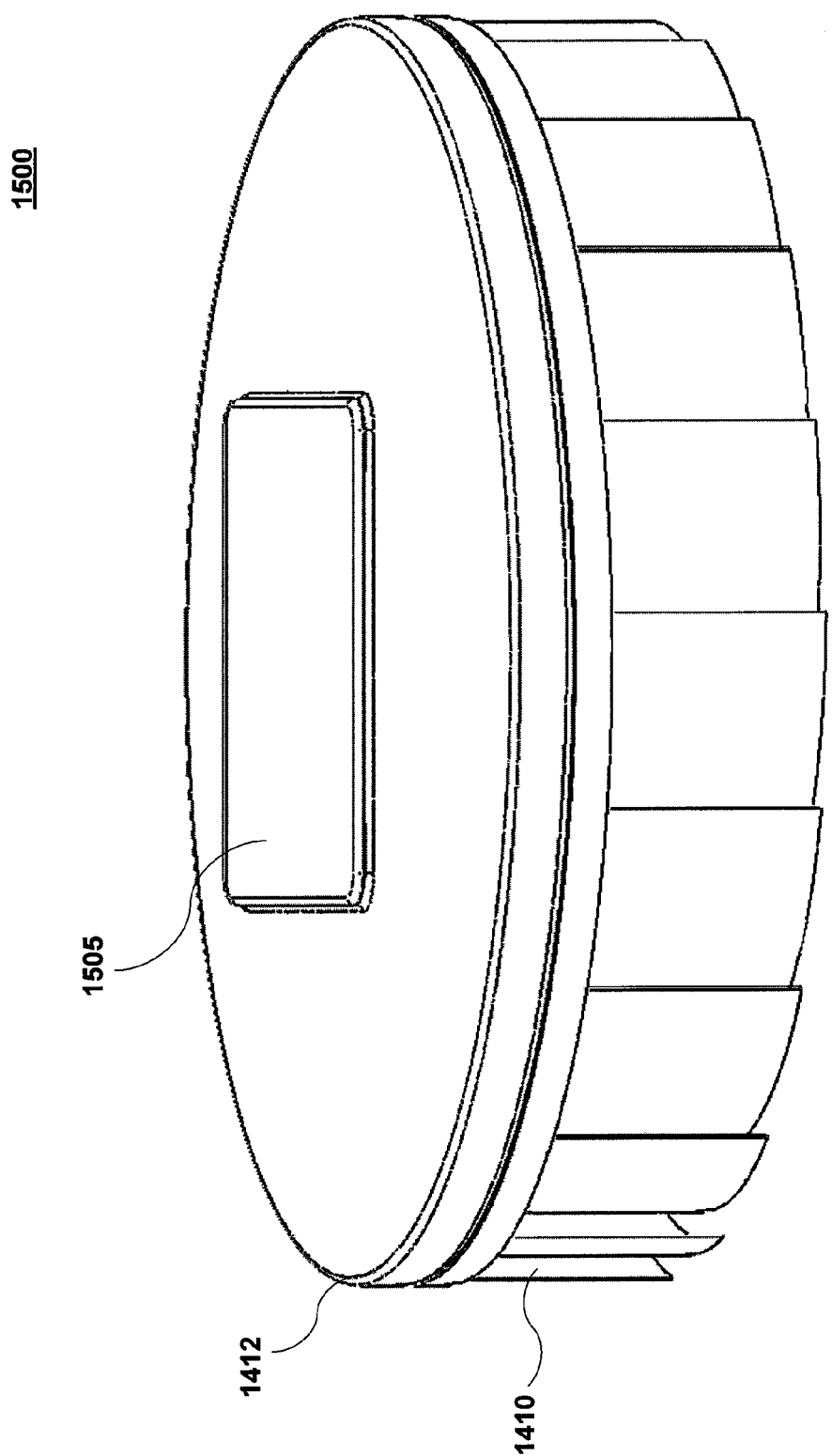
FIG. 15 is a schematic illustration of a bottom surface of the heat conducting structure shown in FIG. 14.

As illustrated in FIG. 14, such a heat conducting structure including a heat pipe structure may be designed to interface with a particular thermal load. In FIG. 14, a tapered hollow cavity is adapted to transport the heat from a CPU package having a 2"×2" square-shaped thermal interface (in thermal contact with a lower surface of the heat conducting structure 1412, shown as region 1420), to the top surface 1416 of the heat conducting structure, which has a circular footprint 4" in diameter. FIG. 15 is a schematic illustration of a bottom surface of the heat conducting structure 1412, illustrating a 2"×2" square-shaped thermal interface 1505 corresponding to the region 1420 on the interior of the heat pipe shown in FIG. 14. Although a 2"×2" thermal interface on the lower surface and 4" diameter circular top surface is shown by way of example, as in embodiments described above, a wide variety geometries may be contemplated for the bottom and/or side exterior surface(s) of the heat conducting structure 1412. The use of a heat pipe in the heat conducting structure 1412 may advantageously spread and/or relay heat from the thermal load to the surface 1416 with a low thermal resistance provided by the heat pipe.

Additional structural elements, such as element 1425 in FIG. 14, may be included that aid in mechanical reinforcement of the hollow cavity 1414 defined by the heat transfer structure 1412. Incorporation of such elements 1425 into the hollow cavity may advantageously minimize or reduce mechanical deflection of exterior surfaces upon evacuation of the cavity 1414. For example, downward mechanical deflection of the top surface 1416 of the heat conducting structure 1412 upon evacuation, may alter the geometry of the air gap region between the heat transfer structure 1410 and the heat conducting structure 1412 in a manner that is detrimental to heat transfer. A wide variety of such mechanical reinforcement structural elements 1425 may be used, including but not limited to, spars, posts, pillars, beams, or gussets. Such reinforcement structures may also be directed towards minimizing cavity wall thickness, so as to reduce thermal resistance, weight, and/or cost of the heat conducting structure 1412.

The reinforcement structures, such as element 1425, may be perforated or otherwise arranged so as to not impede the transport of liquid or vapor inside the hollow cavity 1414. Such reinforcement structures may also include grooves or other surface treatments intended to promote capillary absorption.

As will be shown further below, the hollow heat pipe structure 1414 may also incorporate features designed to accommodate other structures, such as components of brushless motor 1430. Alternatively, or in addition to incorporating such reinforcing structures, one or more exterior surfaces of the heat conducting structure may be machined or otherwise fabricated in manner to compensate for mechanical deflection. For example, following evacuation of the hollow cavity 1414, one or more exterior surfaces may be machined, ground, polished, etc, so as attain a desired geometry, such as a substantially flat surface. In some embodiments, the working fluid used in the hollow cavity 1414 may be selected to have a boiling point at 1 atmosphere comparable to anticipated operating temperature of the heat pipe, so as to reduce the pressure differential between the between the inside and outside of the heat pipe structure.

Figure 16:
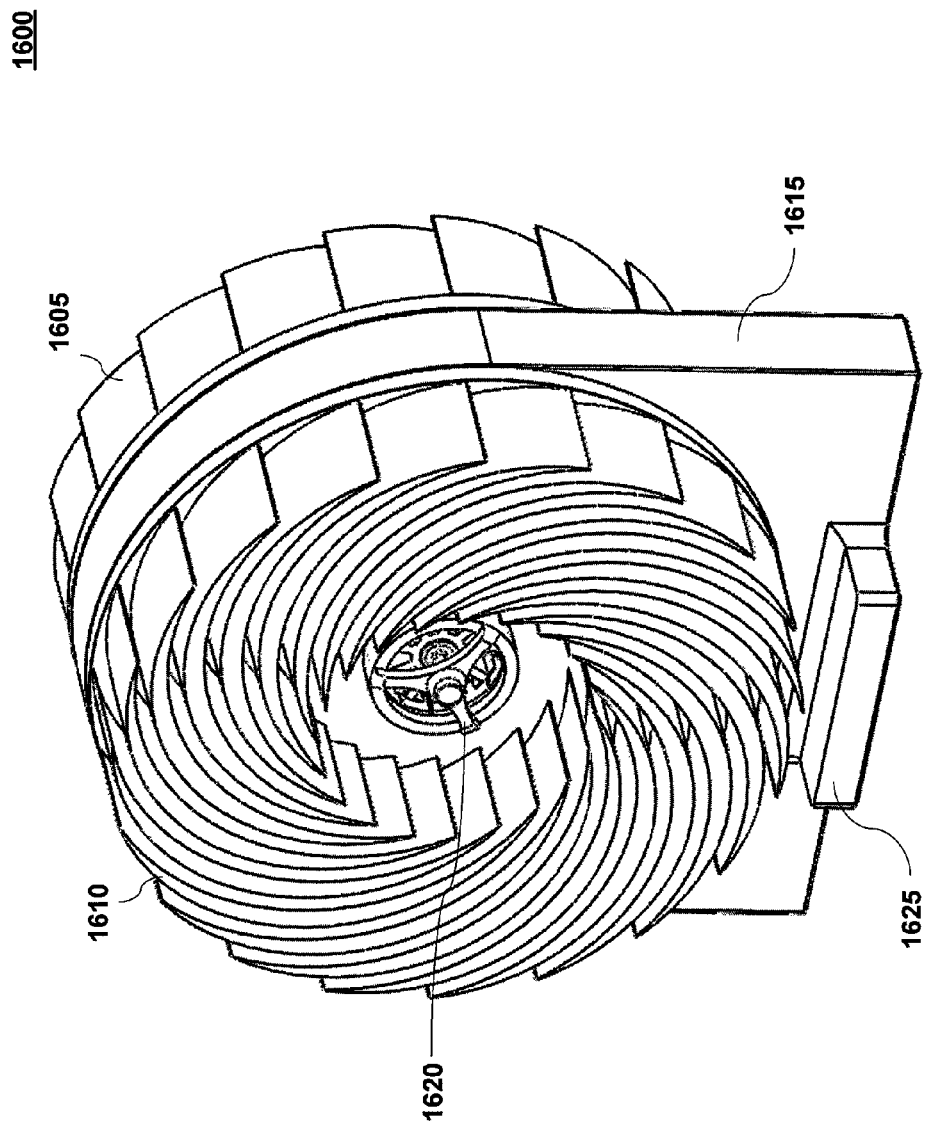
FIG. 16 is a schematic illustration of another embodiment of an air bearing heat exchanger according to the present invention.

FIG. 16 is a schematic illustration of another embodiment of an air bearing heat exchanger 1600 according to the present invention. A plurality of heat transfer structures 1605 and 1610 are provided. The heat conducting structure 1615 has a different geometry from embodiments of heat conducting structures illustrated previously. The use of multiple heat transfer structures may be advantageous in embodiments where the bottleneck for heat transport is the thermal resistance for heat transfer between the heat transfer structure and surrounding air. Although only two heat transfer structures are shown in FIG. 16, substantially any number may be included, and they may be positioned on a same or opposite sides of the heat conducting structure 1615. The heat conducting structure 1615 of FIG. 16 may comprise a solid block of material such as aluminum, copper, etc., or may include a hollow structure that incorporates the functionality of one or more heat pipes, as described above with reference to FIG. 14.

Multiple heat transfer structures, such as the heat transfer structures 1605 and 1610 may be driven by a single motor 1620, may rotate in the same or different directions, and may rotate at the same or different angular velocities. Alternatively, multiple heat transfer structures may be connected by elements including but not limited to belts, chains, gears, etc. so as to impart desired rotation.

The direction and speed of rotation of the various heat transfer structures may be chosen so as to minimize the angular momentum of the air-bearing heat exchanger as a whole (e.g., to minimize gyroscopic reaction torque in a rotating frame of reference). More generally, any embodiment of air-bearing heat exchanger, or group of air-bearing heat exchangers, having one or more heat transfer structures, may be mounted such that its net angular momentum vector is substantially parallel or anti-parallel to a predetermined axis of rotation, so as to minimize gyroscopic reaction torque generated upon rotation of said air-bearing heat exchanger, or group of air-bearing heat exchangers, about said axis of rotation.

As described above with reference to FIG. 14, the heat conducting structure 1615 of FIG. 16 may be adapted to incorporate structures such as 1625 so as facilitate extraction of heat from one or more objects having a thermal interface with a predetermined geometry, such as a CPU package. The structure 1625 may form a portion of a heat pipe cavity, as described above with reference to FIG. 14.

Figure 17:
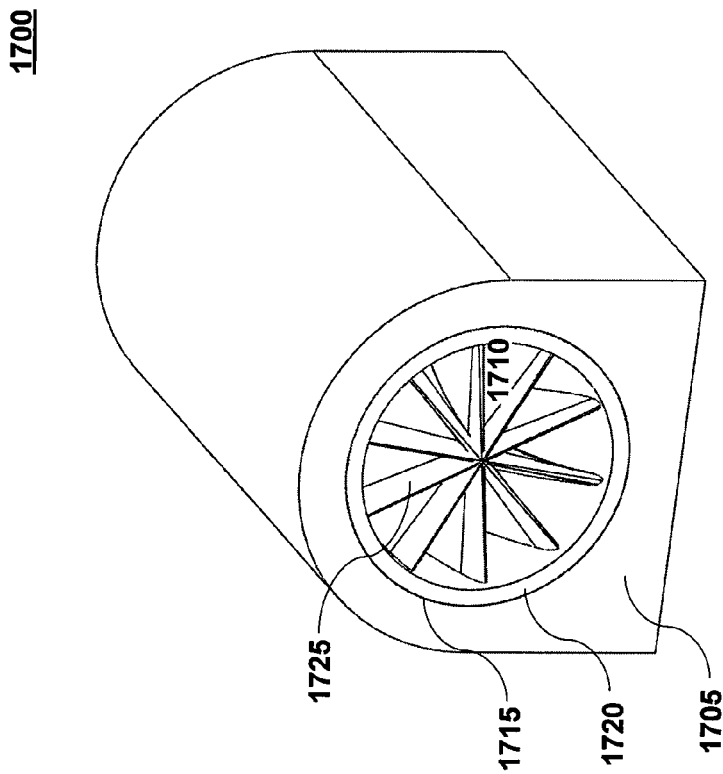
FIG. 17 is a schematic illustration of a front view of another air-bearing heat exchanger in accordance with an embodiment of the present invention.

FIG. 17 is a schematic illustration of a front view of another air-bearing heat exchanger 1700 in accordance with an embodiment of the present invention. The air-bearing heat exchanger 1700 is disposed in an axial, rather than a radial configuration, as has been shown in previous embodiments. Referring to FIG. 17, the air-bearing heat exchanger 1700 includes a heat conducting structure 1705 and heat transfer structure 1710 comprising a tubular enclosure 1720 surrounding a set of internal fins 1725. The heat conducting structure 1705 and heat transfer structure 1710 may be separated by a gas filled gap 1715. Although the geometry of the heat conducting structure 1705 and heat transfer structure 1710 differs from those described in previous embodiments, the principle of operation may remain the same. As in previously described embodiments, the heat conducting structure 1705 may comprise a solid structure, or a hollow structure that incorporates the functionality of a heat pipe. The air gap region 1715 between the coaxial heat conducting structure 1705 and heat transfer structure 1710, rather than having the shape of a thin circular disk as in previous embodiments shown above, assumes the shape of a thin-walled tube.

The axial-flow heat transfer structure 1710 comprising a tubular enclosure 1720 surrounding a set of internal fins 1725 may also be implemented as turbine blades, vanes, etc. As with the radial-flow heat transfer structures described above, the fins 1725 of the axial-flow heat transfer structure 1710 may function simultaneously as the fins of a heat sink and the vanes of an impeller, turbine, etc.

Figure 18:
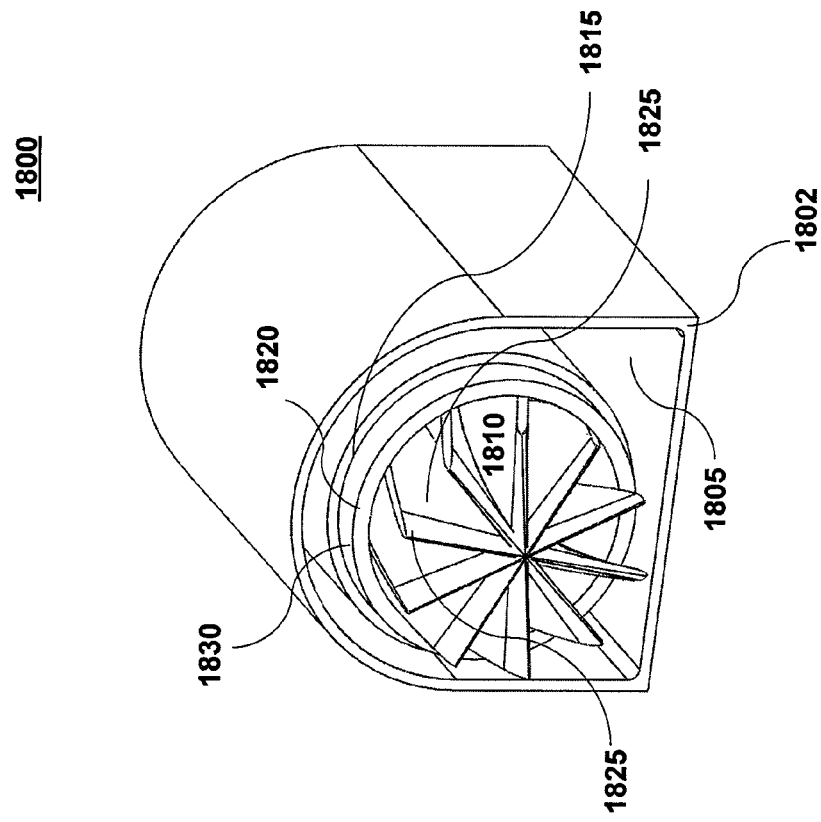
FIG. 18 is a schematic illustration of an axial flow air-bearing heat exchanger including a heat pipe structure in accordance with an embodiment of the present invention.

FIG. 18 is a cut-out view of an axial flow air-bearing heat exchanger 1800 in which the heat pipe structure 1805 of the heat conducting structure 1802 is shown explicitly.

Referring again to FIG. 18, in other embodiments the heat transfer structure 1810 comprising a tubular enclosure 1820 surrounding a set of internal fins 1825 may be implemented in the form of a hollow structure so as to incorporate the functionality of a heat pipe into the rotating heat transfer structure 1810. In such an embodiment, the higher temperature end of the heat pipe includes an exterior surface 1830 of the axial-flow heat transfer structure 1810, and the lower temperature end of the heat pipe may be distributed about the fins 1825 of the axial-flow heat transfer structure 1810. In one or more embodiments, centrifugal pumping occurring inside the hollow, rotating structure comprising the axial-flow heat transfer structure may be used for fluid return of condensed vapor from the lower temperature end of the heat pipe to the higher temperature end of the heat pipe.

Accordingly, axial flow air-bearing heat exchangers may be provided in embodiments of the present invention, such as those shown in FIGS. 17 and 18. A heat transfer structure such as 1710 generally imparts motion to the surrounding medium that is parallel to an axis of rotation of the heat transfer structure 1710. That is, air or other surrounding medium will be drawn through the center of the heat transfer structure 1710 as the structure rotates. This is in contrast to some embodiments described previously, for example with reference to FIGS. 5, 7, and 8, where the heat transfer structure may impart motion to a surrounding medium in a direction that is perpendicular, or other than parallel, to the axis of rotation of the heat transfer structure. By imparting motion to a surrounding medium in a direction perpendicular to the axis of rotation, herein is generally meant that the motion is substantially perpendicular to the axis of rotation in that the flow of the medium is for the most part in a direction perpendicular to the axis of rotation, but there may typically be some component of flow not strictly perpendicular to the axis of rotation, and even some component parallel to the axis of rotation. Nonetheless, as can be appreciated from FIG. 18, the flow of surrounding medium will generally be for the most part perpendicular to the axis of rotation.

Figure 20:
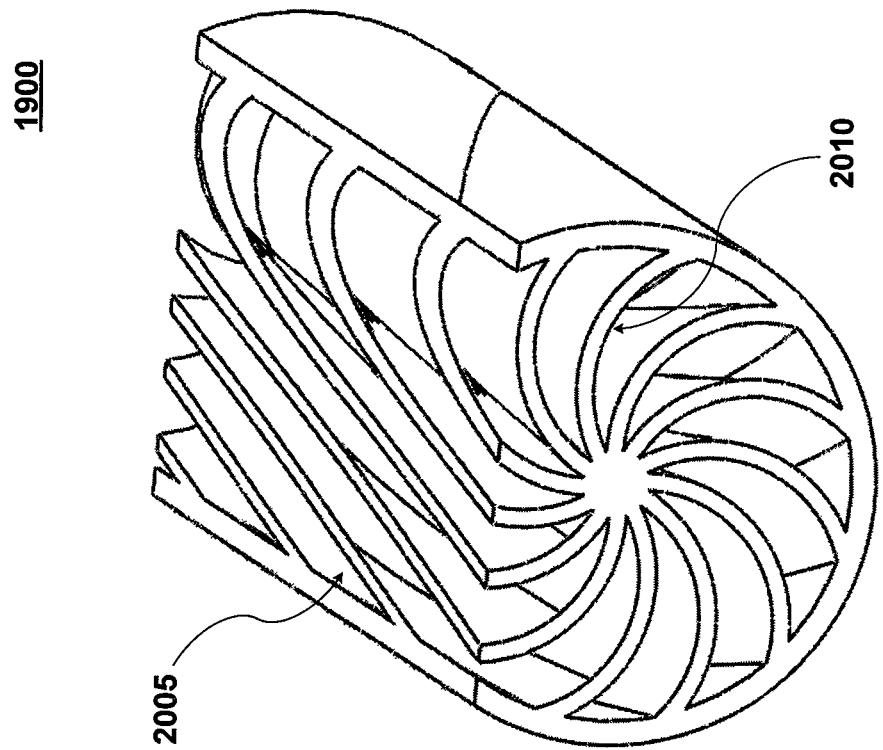
FIG. 20 is a schematic illustration of the axial flow heat transfer structure of FIG. 19 during a different stage of fabrication.
Figure 19:
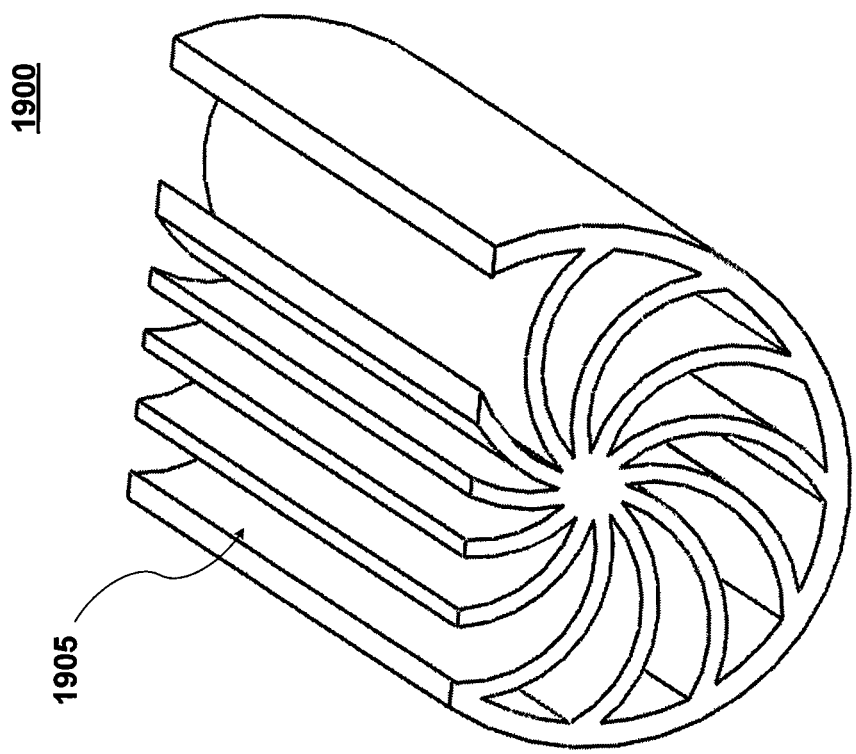
FIG. 19 is a schematic illustration of an axial flow heat transfer structure according to an embodiment of the present invention.

FIGS. 19 and 20 are schematic illustrations of an axial flow heat transfer structure 1900 according to an embodiment of the present invention during different stages of fabrication. The heat transfer structure 1900 may be used as the heat transfer structures 1710 and 1810 shown in FIGS. 17 and 18 in some embodiments. As illustrated in FIGS. 19 and 20, the axial-flow heat transfer structure 1900 may be fabricated from continuous, extruded stock (e.g. aluminum) having an appropriate cross-sectional geometry 1905, shown in FIG. 19. The axial-flow heat transfer structure 1900 may then be twisted so as to impart permanent inelastic deformation to achieve the cross section 2005 shown in FIG. 20. The leading edges of the fins 2010 may subsequently be tapered or otherwise modified to minimize aerodynamic drag, as may the trailing edges of such fins. In one or more embodiments, the rotor(s) of the electrical motor(s) used to impart rotation to the axial-flow heat transfer structure may be incorporated in or attached directly to the axial-flow heat transfer structure. Although a specific twisted fin structure is shown in FIG. 20, other structures may be used and may generate air flow upon rotation about an axis.

FIGS. 19 and 20 are representative of a wide variety of geometries that may be contemplated for such an axial-flow heat transfer structure, and should not be construed as limiting in any way. Other configurations may be used, analogous to those for heat transfer structures described previously with reference to FIGS. 5, 7 and 8. Accordingly, numerous geometric configurations and/or design strategies may be employed related to the operation and/or fabrication of the axial-flow heat transfer structure.

An axial-flow geometry may be advantageous for heat loads having geometries, aspect ratios, etc. not well suited to the use of a radial-flow air bearing heat exchanger. Such an axial-flow air bearing heat exchanger may also be advantageous from the standpoint of air circulation pattern. The radial-flow air bearing heat exchanger may draw in air from above the rotating heat transfer structure and exhaust air at a right angle, and in all directions. The straight-through air flow pattern provided by the axial-flow air bearing heat exchanger, such as those shown in FIGS. 17 and 18 may be advantageous from the standpoint of compatibility with an existing enclosure or air handling system, for example. For example, the axial flow air bearing heat exchanger may be well suited to HVAC applications, in which the axial-flow heat transfer structure may be adapted to provide a substantial portion or all of the pumping required to circulate air through the duct work of the HVAC system.

A potential disadvantage of the axial-flow configuration concerns the need to maintain tight mechanical tolerances at the air bearing interface. Recall that the distance across the planar air gap region of the radial-flow air bearing heat exchanger may be self-adjusting, described previously with reference to FIGS. 5 and 6. As discussed previously, the dimensions of the air gap may not be maintained by ensuring precise mechanical tolerances, but rather by a built-in negative feedback mechanism that governs the force balance between the pressurized air gap and the downward restoring force associated with magnetic attraction between the brushless rotor and stator (and/or downward force imparted by other means). Such a passive mechanism for maintaining an appropriate gap distance is enabled by the fact that the heat transfer structure has some freedom to move up/down along the rotation axis of the brushless motor.

This potential problem may be reduced or remedied in the axial-flow air bearing heat exchanger by designing the axial-flow heat transfer structure to function as a centrifugal flexure. Consider, for example, the structure 1900 shown in FIG. 20. Such a structure will to some extent undergo elastic deformation in the radial direction when rotated at high speed. The amount of symmetric radial expansion as a function of angular velocity is readily controlled by the mechanical design of the axial-flow heat transfer structure (e.g., by the wall thickness of the tubular enclosure). During operation, the opposing force of the pressurized air gap region eventually arrests further radial expansion of axial-flow heat transfer structure.

As in embodiments described above, a hydrostatic or hydrodynamic air bearing may be used to develop the gas filled gap 1715 or 1815 shown in FIGS. 17 and 18. In the case of a hydrodynamic air bearing, such a radial flexure arrangement also provides a simple passive mechanism to prevent mechanical contact between the air gap surfaces during start up and shut down, when the hydrodynamic bearing does not generate adequate pressure in the air gap region to suspend the heat conducting structure. For example, when the axial-flow heat transfer structure is at rest, no hydrodynamic pressure force may be generated, but the supporting spindle and/or bearings may be used to keep the heat transfer structure roughly centered with respect to the internal surface of the heat conducting structure. Under these circumstances, the air gap distance might be (for example) 0.1% of the radius of the axial-flow heat transfer structure, providing plenty of mechanical clearance. But if such a structure is designed to function as a centrifugal flexure that expands by >0.1% at its operating speed of 2000 rpm (for example), it may serve to automatically regulate the air gap distance at high speed and automatically retract at low speed. As discussed further below, in the case of the radial-flow air bearing heat exchanger, the implementation of such a passive mechanism may incorporate additional parts.

Other embodiments of the present invention may have one or more electronic components, such as a CPU, requiring thermal management housed inside the heat pipe cavity of a heat conducting structure. Placing a thermal load inside the heat pipe cavity may reduce or substantially eliminate problems related to establishing and maintaining a low-thermal-resistance interface between the heat load(s) and the heat conducting structure(s). Such problems include the poor thermal conductivity of available heat sink pastes, greases, etc. in conjunction with the fact that a relatively thick layer of heat sink paste must be used in some embodiments to accommodate thermal expansion/contraction, thereby introducing substantial unwanted series thermal resistance. Further, the need for precise mechanical mating between the heat conducting structure and all of the electrical components that must be heat sunk may be problematic because the mechanical tolerances for mounting of electrical components to a printed circuit board may be relatively loose. Additionally, the tendency for thermal joint integrity to be compromised over time due to vibrations, mechanical stress, and/or thermal cycling may hamper efforts to maintain a low-thermal-resistance interface between a heat load and heat conducting structure.

Figure 21:
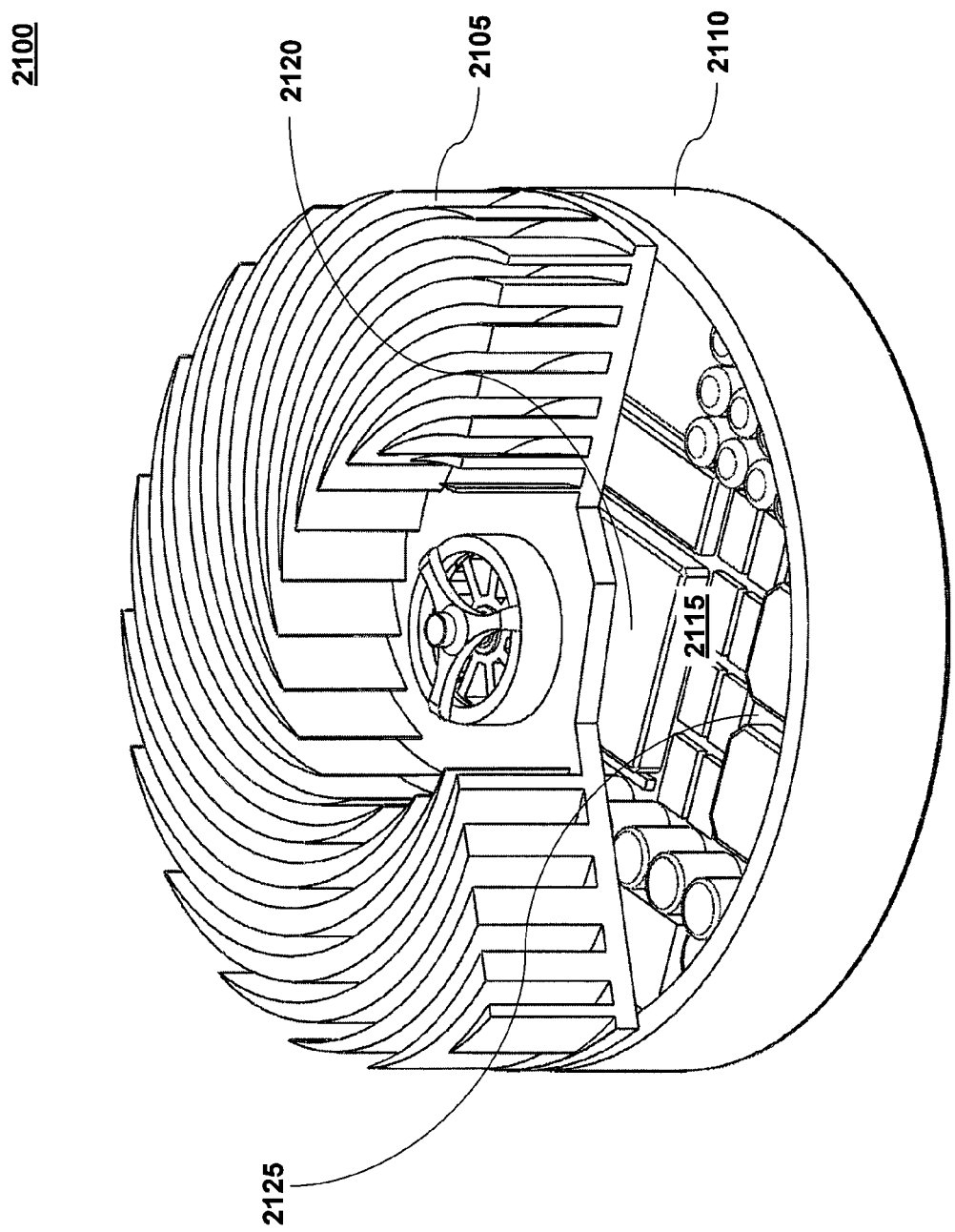
FIG. 21 is a schematic illustration of an air-bearing heat exchanger including a thermal load within a heat pipe cavity according to an embodiment of the present invention.

FIG. 21 is a schematic illustration of an air-bearing heat exchanger 2100 including a thermal load within a heat pipe cavity according to an embodiment of the present invention. The heat exchanger 2100 includes a heat transfer structure 2105 and heat conducting structure 2110 separated by a gas filled gap region, analogous to the heat transfer structures described above with reference to, for example, FIG. 14. As was described with reference to FIG. 14, the heat conducting structure 2110 may define a cavity 2115 used as a heat pipe. The wicking material and fluid used in the heat pipe are not shown in FIG. 21. One or more electronic components, such as a CPU 2120 requiring thermal management are housed inside the heat pipe cavity 2115 of the heat conducting structure 2110. As discussed generally above, the need for thermal management of certain electrical components may stem from considerations related to the potential for component failure and/or lifetime reduction at high temperature, and/or performance improvements that may be realized by maintaining such components at low operating temperature (e.g. the ability to over-clock a CPU to ~2× its nominal clock speed). Substantially any electrical components that are desired for thermal management may be placed within the cavity 2115.

Figure 22:
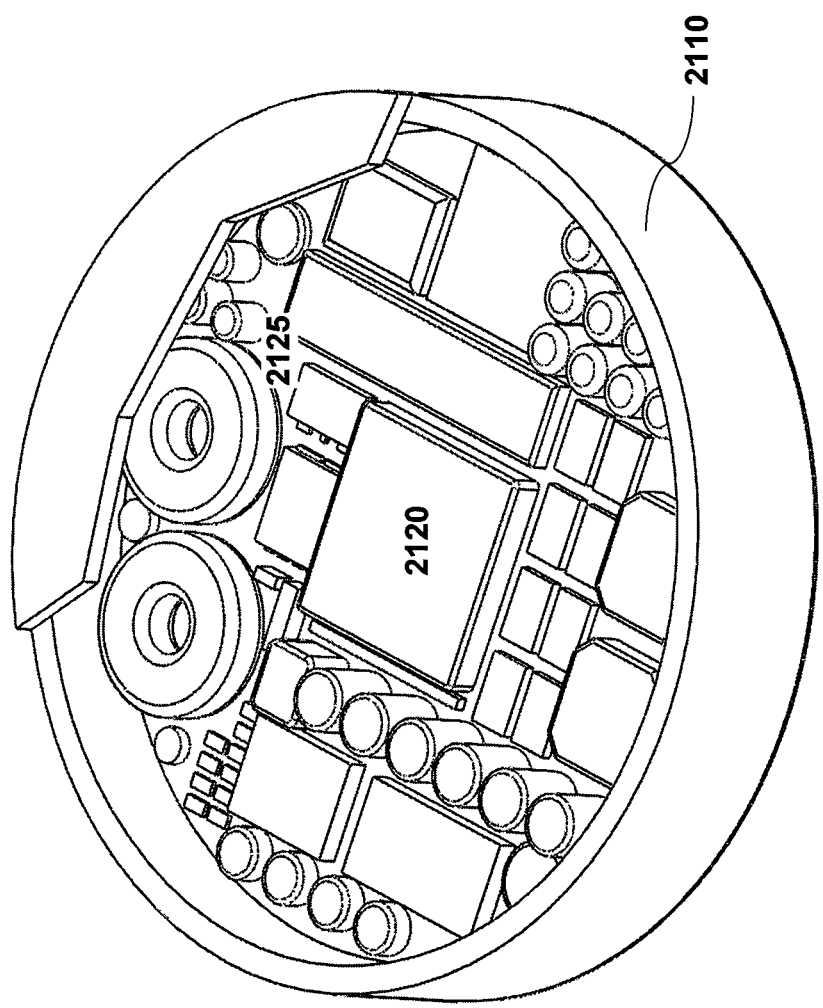
FIG. 22 is a schematic illustration of a top-down view of the heat conducting structure shown in FIG. 21.

The heat sensitive components placed inside the cavity 2115 may be mounted on one or more printed circuit boards, such as the printed circuit board 2125 shown in FIG. 21. Other electrical components, such as those that should be located in very close proximity to such heat sensitive components to ensure signal integrity, may also be placed in the cavity 2115. FIG. 22 is a schematic illustration of a top-down view of the heat conducting structure 2110 with the top surface cut away so the components placed inside are visible, such as the CPU 2120 mounted on the circuit board 2125.

Figure 23:
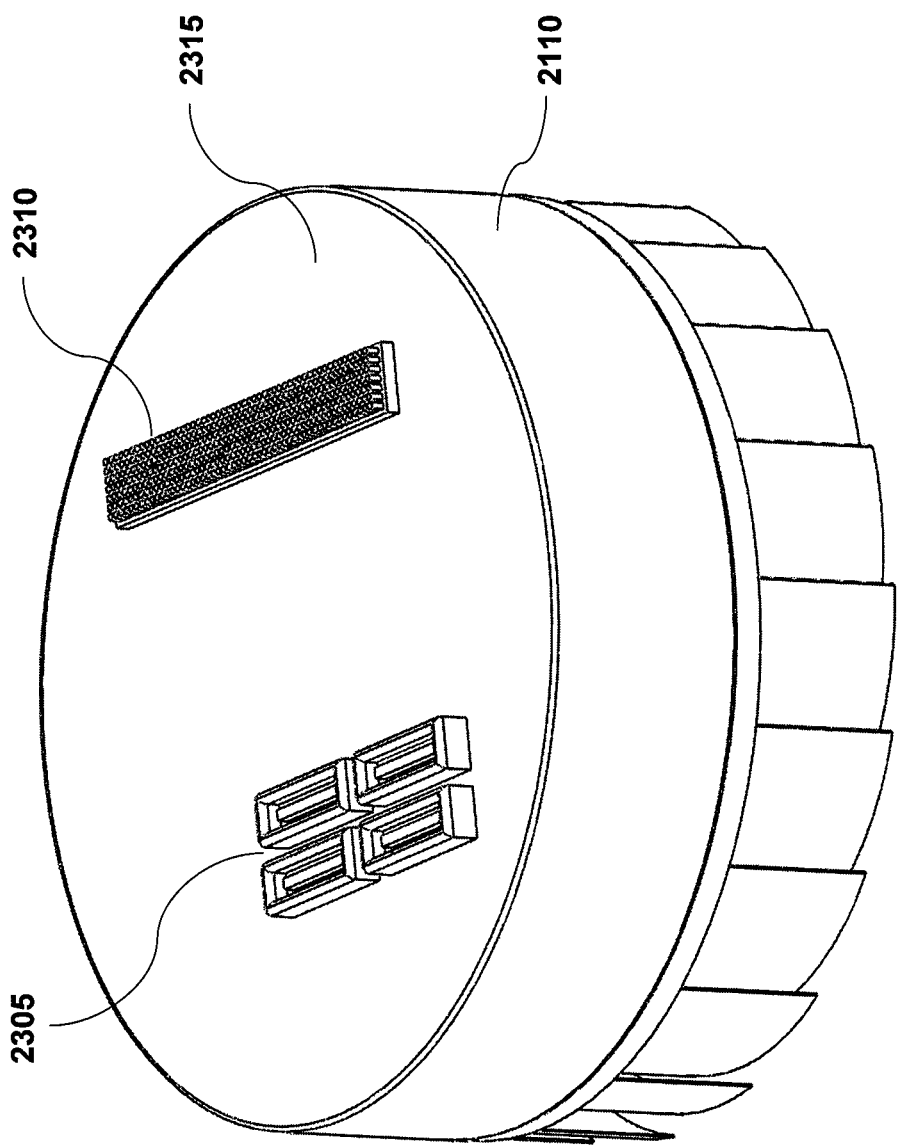
FIG. 23 is a schematic illustration of a view of the heat conducting structure of FIG. 21 showing an exterior surface of the structure in accordance with an embodiment of the present invention.

FIG. 23 is a schematic illustration of a view of the heat conducting structure 2110 showing an exterior surface of the structure in accordance with an embodiment of the present invention. One or more hermetically sealed electrical feed-throughs 2305, 2310 may be used to route power and signal input/output (I/O) connections through the exterior surface 2315 of the heat pipe enclosure to the components mounted on the circuit board 2125 shown in FIGS. 21 and 22. These feed-throughs 2305, 2310 may allow for electrical connections between components inside the heat pipe cavity and those outside. For example, the embodiment illustrated in FIG. 23 may be designed to plug directly into the motherboard of a computer (not shown in FIG. 23). Alternatively such power and signal I/O may be routed through bulkhead connectors that provide receptacles for standard connectors such as USB, FireWire, fiber-optic connectors, etc. Examples of such vacuum feedthroughs include those manufactured by Insulator Seal of Sarasota, Fla.

Electrical components placed within a heat pipe of the heat conducting structure 2110 may be immersed in the working fluid and/or kept in direct contact with an absorptive material that retains, and may be saturated with, such a working fluid. Placing thermal load components inside a heat pipe formed by the heat conducting structure 2110 may alleviate the above-described problems associated with conventional thermal interfaces, may be readily adapted to components having irregular geometries, and may reduce thermal resistance between thermal loads and the top exterior surface of the heat conducting structure to negligible levels. The addition of vacuum feedthroughs, while unconventional, may nonetheless be practical in many applications.

In certain embodiments, the working fluid may be selected for proven compatibility with electrical components and other desirable properties such as dielectric strength, chemical inertness, etc. For example, Methyl Nonafluorobutyl Ether ($CF_3$—$CF_2$—$CF_2$—$CF_2$—O—$CH_3$), known commercially as HFE-7100, has been determined to be well suited to direct cooling of electronic components (See for example, I. Mudawar, Mudawar Thermal Systems, Inc.; D. Bharathan, K. Kelly, and S. Narumanchi, Two-phase spray cooling of hybrid vehicle electronics, NREL report number CP-540-42389). HFE-7100 has a boiling point of 61° C. at atmospheric pressure, a vapor pressure of 202 mm Hg at 25° C., and a heat of vaporization comparable to CFC-113 (1,1,2-Trichloro-1,2,2-trifluoroethane or $Cl_2FC$—$CClF_2$), one of the most popular CFC refrigerants prior to being phased out under the Montreal Protocol. HFE-7100 is therefore well suited to heat pipe applications. It should be understood however that a wide variety of working fluids may prove to be suitable for this application, and that the above discussion pertaining to HFE-7100 is in no way meant to be limiting. In other embodiments, one or more surface treatments may be applied to sensitive electronic components to ensure working fluid compatibility. In further embodiments, one or more surface treatments may be used on components and/or surfaces inside the heat pipe cavity to promote nucleation, so as to ensure more even boiling and inhibit superheating of the working fluid.

Figure 24:
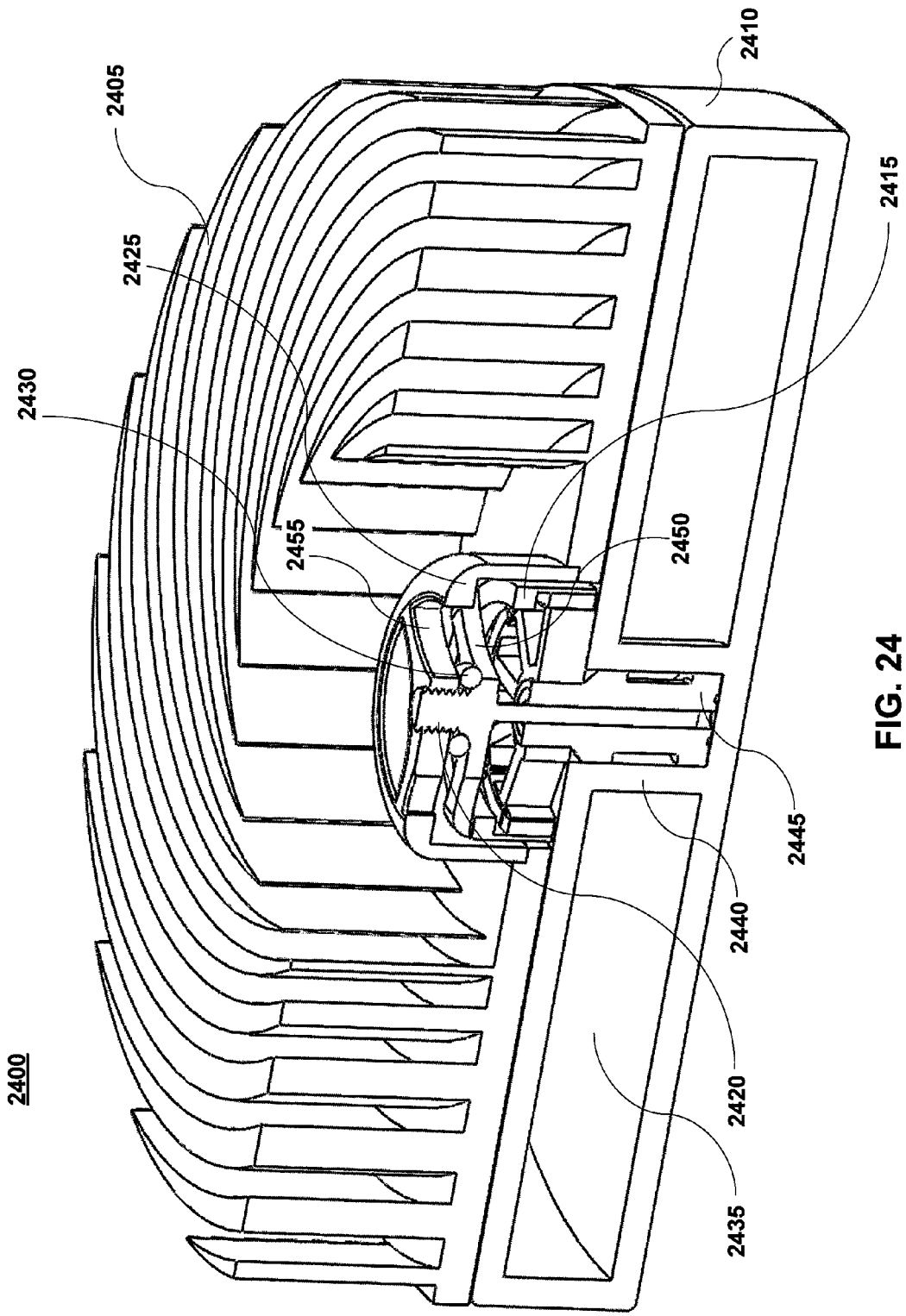
FIG. 24 is a schematic illustration of a radial-flow air-bearing heat exchanger 2400 in accordance with an embodiments of the present invention.

Embodiments of the present invention may also provide a passive mechanism to prevent unwanted mechanical contact between the air gap surfaces in embodiments of a radial-flow air bearing heat exchanger employing a hydrodynamic air bearing. During start up and shut down (e.g., at low angular velocity), the hydrodynamic air bearing may not generate adequate pressure in the air gap region to provide levitation of the rotating heat transfer structure. FIG. 24 is a schematic illustration of a radial-flow air-bearing heat exchanger 2400 in accordance with embodiments of the present invention. The air-bearing heat exchanger 2400 may include a retraction mechanism adapted to provide mechanical separation of a bottom surface of a heat transfer structure 2405 and a top surface of a heat conducting structure 2410.

As has been described previously, an external rotor permanent magnet brushless motor may be included in the air-bearing heat exchanger 2400. Accordingly, the geometry of the particular motor shown in part influenced the design and layout of the retraction mechanism which is further described below. But it should be understood that the principles described in conjunction with FIG. 24 may be applied to a wide variety of air bearing heat exchanger geometries, including those in which an alternative to an external rotor permanent magnet brushless motor is used to impart rotation to the heat conducting structure.

Referring now to specific elements of FIG. 24, the external rotor 2415 of the brushless motor is not connected directly to the heat transfer structure 2405. Rather, a threaded spindle 2420 engages a threaded end bell 2425, wherein rotation of end bell 2425 with respect to the spindle 2420 may occur with substantially low friction, so as not to interfere with operation of the retraction mechanism described herein.

During normal operation, the heat transfer structure 2405 may rotate at a constant angular velocity ($\omega$) of $\omega_0$, where $\omega_0$ may be of order several thousand rpm. When operating at a constant angular velocity of $\omega_0$, the torque delivered by the spindle 2420 of the brushless motor may be balanced by the aerodynamic counter-torque required to rotate the heat transfer structure 2405 through a viscous medium such as air. This counter-torque tends to tighten the threaded assembly comprising 2420 and 2425, thereby decreasing the air gap distance (between the bottom surface of the heat exchanger structure 2405 and/or top surface of the heat conducting structure 2410).

The downward tightening force acting on the heat transfer structure 2405 associated with the aerodynamic counter-torque may be counterbalanced by two upward forces. The first of these forces is the upward pressure force exerted by the hydrodynamic bearing, which may be negligible at large gap distances, but may increase very steeply at small gap distances. The second of these two forces is the upward force exerted by a compression spring 2430, which may be squeezed between the top surface of the external rotor 2415 and the bottom surface of end bell 2425 as the threaded assembly tightens. During normal operation, the balance of these three forces may determine or influence the equilibrium air gap distance as a function of $\omega$.

If the power to the brushless motor is turned off, the angular velocity of the rotating heat transfer structure may decay gradually from $\omega=\omega_0$ to $\omega=0$. As the angular velocity decreases, the aerodynamic counter torque decreases, and the tightened threaded assembly 2420, 2425 may begin to loosen; the compression spring 2430 may relax and the equilibrium air gap distance may increase. At $\omega=0$, the equilibrium air gap distance may be dictated simply by the design of threaded-spindle-compression-spring assembly including 2420, 2425 and may be very large compared to the air gap distance associated with operation at $\omega=\omega_0$ (e.g. 200 microns vs. 20 microns in some embodiments). That is, when the heat transfer structure 2405 is not rotating, or is rotating at a sufficiently slow angular velocity, the gap between the heat conducting structure 2410 and the heat transfer structure 2405 may be determined by the geometries and tolerances of the threaded assembly connecting the motor to the heat transfer structure. Upon reapplication of power the above process of mechanical retraction is reversed.

During acceleration from an angular velocity of $\omega=0$ to $\omega=\omega_0$, the threaded assembly may be subject to an additional, transient, tightening torque of magnitude $\tau=I\alpha$, where I and $\alpha$ are the moment of inertia and angular acceleration of the rotating heat transfer structure, respectively. In certain embodiments, the rate of increase of angular velocity may be limited (e.g. electronically, at the brushless motor controller) so as to limit the magnitude of this transient torque term. In such embodiments, ramping up the angular velocity gradually may be directed towards preventing or reducing premature closure of the air gap region. In this context, "premature" refers to closure of the air gap region at relatively low angular velocity, such that the lifting force generated by the hydrodynamic bearing is insufficient to prevent mechanical contact of the air bearing surfaces. In further embodiments, the rate of angular deceleration (slowing down) may also be limited by identical or similar mechanisms.

Referring again to FIG. 24, in some embodiments, the heat conducting structure 2410 may include a hollow cavity 2435 so as to incorporate the functionality of a heat pipe, as has been described above. Portions of the heat conducting structure 2410 such as indent 2440 may also be adapted to accommodate components such as the brushless motor bearing assembly 2445 shown in FIG. 24. The compression spring 2430 shown in the representative embodiment of FIG. 24 may be implemented using an elastomeric compression spring of circular cross section having geometry similar to an o-ring. It should be understood that many different spring shapes, materials, and mechanical arrangements are possible, and that the representative embodiment depicted in FIG. 24 should in no way be construed as limiting. In further embodiments, threaded spindle 2420 may incorporate a mechanical stop to limit upward travel of the end bell 2425 relative to external rotor 2415.

Embodiments of the present invention may utilize polymer solvent welding processes to make a joint between components of the air-bearing heat exchanger, such as between a thermal load and a bottom surface of a heat conducting structure. So, for example, referring back to FIG. 15, a thermal load (such as a CPU) may be joined to the heat conducting structure 1412 at the area 1505 using a polymer solvent welding process. Generally, the poor thermal conductivity of available heat sink pastes, greases, etc. and the fact that a relatively thick layer of heat sink paste must be used to accommodate thermal expansion/contraction, introduces substantial unwanted series thermal resistance in embodiments employing pastes or greases between the thermal load and the heat conducting structure. The tendency for thermal joint integrity to be compromised over time due to vibrations, mechanical stress, and/or thermal cycling may also be disadvantageous. Accordingly, embodiments of the present invention may employ a thermal joint having substantially reduced thickness, substantially increased mechanical strength, and/or enough flexibility to relieve thermo-mechanical stress using polymer solvent welding. However, not all embodiments employing polymer solvent welding may exhibit all, or even any, of these advantages.

Polymer welding is generally described, for example, at http://www.twi.co.uk/content/ksrw002.html, and involves making polymer chains at the surface of one component mobile enough to entangle with the polymer chains of a second component. In conventional welding of thermoplastics, heat is applied to raise the temperature of the polymer above the appropriate transition temperature, e.g. the glass transition temperature, $T_g$, for amorphous thermoplastic polymers, or the melting temperature, $T_m$, for semi-crystalline polymers. Above these transition temperatures, polymer chains are mobile, and if two components are brought into intimate contact, polymer chain entanglement will proceed, resulting in a weld.

In solvent welding, a solvent is applied which can temporarily dissolve the polymer, typically at room temperature. When this occurs, the polymer chains are free to move in the liquid and can entangle with other similarly dissolved chains in the other component. Given sufficient time, the solvent will permeate through the polymer and out into the environment, so that the polymer chains lose their mobility. The resulting solid mass of entangled polymer chains constitutes a solvent weld. For example, in a classic demonstration of solvent welding, following the application of a few drops of methylene chloride ($CH_2Cl_2$), two sheets of plexiglas (poly methyl methacrylate) are laid on top of each other and pressed together. The resulting solvent weld may be nearly invisible, extremely thin, and free of voids.

In various embodiments of the present invention, the surfaces to be joined are pre-coated (e.g. during manufacture) with a thin layer of one or more solvent-weldable polymers. For example, the surface of a thermal load such as a CPU and all or a portion of a surface of a heat conducting structure, such as the heat conducting structure 1412 of FIG. 15, may be coated with a thin layer of one or more solvent-weldable polymers. The components may then be joined together using a solvent welding process. Such a process may be well adapted to providing a thin, highly reproducible thermal joint. The modulus of elasticity of the polymer(s) used for such a joint may be chosen to provide good mechanical strength while also permitting some degree of elasticity, so as to relieve thermo-mechanical stress and/or fatigue associated with temperature cycling. In further embodiments, such polymers may contain additives adapted to improved thermal conductivity and/or improved mechanical properties such as adhesion strength, elasticity, etc.

In some embodiments, joint formation may involve the entanglement of polymer chains with microscopic surface features of one or more surfaces to be joined. For example, instead of pre-coating the bottom surface of the heat conducting structure with a polymer suitable for solvent welding, such a surface could be etched chemically, mechanically, electrochemically, etc. In alternative embodiments, the chemical and/or physical properties of one or more surfaces to be joined may be such that no surface texturing is required. In related embodiments, a polymer/solvent system specifically adapted to solvent welding to the plastic, ceramic, or metal materials used for electronics packaging may be employed.

In other embodiments, a polymer preform, including a thin sheet of solvent-weldable polymer of substantially uniform thickness may be wetted with an appropriate solvent or solvent mixture, and may be sandwiched between two or more surfaces to be joined. Such a sheet of polymer constitutes a "preform" in that it may provide a predetermined and/or highly uniform joint thickness. In certain embodiments the polymer preform may be implemented using a die-cut sheet. Alternatively, an over-sized preform whose dimensions in the plane of the thermal joint exceed that of the thermal joint may be used, wherein excess preform material adjacent to the thermal joint may later be trimmed away or removed by other means if desired.

Embodiments of the present invention may also include one or more structures adapted to the circulation of cooling air through a motor such as 1430 of FIG. 14. For example, in certain embodiments components such as the external rotor 2415 and end bell 2425 of FIG. 24 may incorporate slots, perforations, or other features adapted to centrifugal pumping of air through portions of the motor assembly. In the case of a radial-flow air bearing heat exchanger such as that shown in FIG. 24, air entering the brushless motor assembly may flow substantially parallel to the axis of rotation of the heat transfer structure 2405, and in a substantially downward direction into the end bell 2425. Air exiting the brushless motor assembly may flow substantially perpendicular to the axis of rotation of the heat transfer structure 2405 (flow in the radial direction) through the aforementioned slots, perforations, etc. incorporated to the external rotor 2415, end bell 2425, and/or other structures that might otherwise impede air flow through the motor assembly. In related embodiments, the spokes 2450 and 2455 of the external rotor 2415 and/or end bell 2425 may incorporate features and/or alternative geometries adapted to provide the functionality of a fan blade or propeller, thereby increasing the flow rate of cooling air through the motor assembly.

Figure 25:
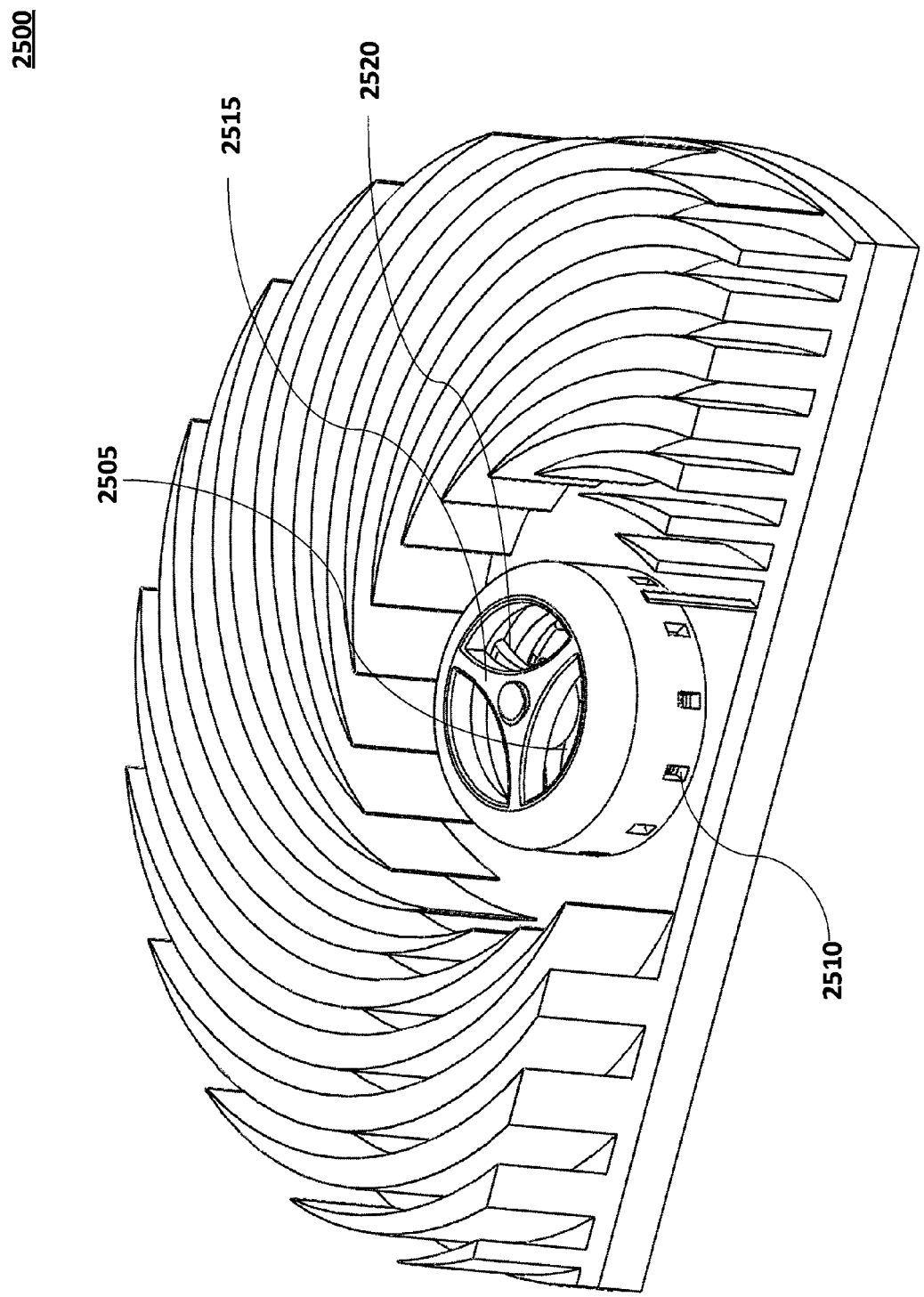
FIG. 25 is a schematic illustration of another embodiment of a radial-flow air-bearing heat exchanger arranged in accordance with an example of the present invention.

FIG. 25 is a schematic illustration of another embodiment of a radial-flow air-bearing heat exchanger 2500 arranged in accordance with an example of the present invention. The radial-flow air-bearing heat exchanger in FIG. 25 is similar to the embodiment shown in FIG. 4, however, the radial-flow air-bearing heat exchanger 2500 includes openings, including opening 2510, in the end bell of the motor assembly. Any number or shape of openings may be provided to allow air to exit (or enter) the motor assembly. During operation, the heat exchanger 2500 may circulate air through portions of the motor assembly. For example, air may be drawn into one or more openings 2505 as the motor operates. The air may flow down through the interior of the motor assembly, and may pass over the motor windings. Air may exit the motor assembly through one or more openings 2510 in the end bell. The pumping mechanism for air passing through the motor assembly may be centrifugal force. In other embodiments, the geometry of spokes 2515 and/or 2520 may be configured to incorporate the functionality of a fan blade, propeller, or other air-moving structure, so as to provide air flow through the motor housing.

Finally, to the extent necessary to understand or complete the disclosure herein, all publications, patents, and patent applications mentioned herein are expressly incorporated by reference therein to the same extent as though each were individually so incorporated.

Having thus described exemplary embodiments of the present application, it should be noted by those skilled in the art that the disclosures herein are exemplary only and that various other alternatives, adaptations, and modifications may be made within the scope of the present application. Accordingly, the present application is not limited to the specific embodiments as illustrated herein, but is only limited by the following claims.

What is claimed is:

1. An apparatus comprising:
   a heat conducting structure thermally coupled to a thermal load, wherein said thermal load is coupled to said heat conducting structure using a polymer solvent weld;
   a heat transfer structure immersed in a surrounding medium and rotatably coupled to said heat conducting structure; and
   a gas bearing between said heat conducting structure and said heat transfer structure, the gas bearing forming a gap between abutting surfaces of the heat transfer structure and heat conducting structure when the heat transfer structure is rotated at or above a threshold speed relative to the heat conducting structure during operation of the apparatus, the abutting surfaces being in physical contact when the heat transfer structure is stationary.

2. The apparatus of claim 1, wherein said heat conducting structure includes a heat pipe.

3. An apparatus comprising:
   a heat conducting structure thermally coupled to a thermal load, wherein said heat conducting structure defines, at least in part, a hollow cavity, wherein said thermal load is disposed in said hollow cavity;
   electrical feed throughs coupled between the thermal load and an exterior surface of the heat conducting structure;
   a heat transfer structure immersed in a surrounding medium and rotatably coupled to said heat conducting structure; and
   a gas bearing between said heat conducting structure and said heat transfer structure, the gas bearing forming a gap between abutting surfaces of the heat transfer structure and heat conducting structure when the heat transfer structure is rotated at or above a threshold speed relative to the heat conducting structure during operation of the apparatus, the abutting surfaces being in physical contact when the heat transfer structure is stationary.

4. The apparatus of claim 3, further comprising a printed circuit board disposed within said hollow cavity and wherein said thermal load is at least partially supported by said printed circuit board.

5. The apparatus of claim 3, wherein said heat conducting structure includes a structural element provided to reinforce said hollow cavity.

6. The apparatus of claim 3, wherein at least a portion of a surface defining said hollow cavity includes a surface treatment to reduce super-heating of a working fluid within said hollow cavity.

7. The apparatus of claim 3, wherein said thermal load comprises a CPU.

8. An apparatus comprising:
   a heat conducting structure for thermally coupling the apparatus to a thermal load; and
   a heat transfer structure immersed in a surrounding medium and rotatably coupled to said heat conducting structure; and
   a gas bearing between said heat conducting structure and said heat transfer structure, the gas bearing forming a gap between abutting surfaces of the heat transfer structure and heat conducting structure when the heat transfer structure is rotated at or above a threshold speed relative to the heat conducting structure during operation of the apparatus, the abutting surfaces being in physical contact when the heat transfer structure is stationary,
   wherein said heat transfer structure is a first heat transfer structure and said gas bearing is a first gas bearing, the apparatus further comprising a second heat transfer structure and a second gas bearing between said heat conducting structure and said second heat transfer structure, the second gas bearing forming a second gap between abutting surfaces of the second heat transfer structure and the heat conducting structure when the second heat transfer structure is rotated relative to the heat conducting structure during operation of the apparatus.

9. The apparatus of claim 8, wherein said first heat transfer structure is coupled to a first side of said heat conducting structure and said second heat transfer structure is coupled to a second side of said heat conducting structure, different than the first side of said heat conducting structure.

10. The apparatus of claim 8,
    wherein said first heat transfer structure is coupled to a first side of said heat conducting structure and said second heat transfer structure is coupled to as second side of said heat conducting structure, different than the first side of said heat conducting structure; and
    wherein said first and second sides of said heat conducting structure are opposite sides of said heat conducting structure.

11. The apparatus of claim 1, wherein said heat transfer structure is rotatable about an axis of rotation, and wherein rotation of said heat transfer structure causes said surrounding medium to flow at least partially along the axis of rotation.

12. The apparatus of claim 11, wherein said heat transfer structure includes a heat pipe.

13. An apparatus comprising:
    a heat conducting structure liar thermally coupling the apparatus to a thermal load;
    a heat transfer structure immersed in a surrounding medium, said heat transfer structure being coupled to said heat conducting structure using a gas filled gap region which forms between said heat conducting structure and said heat transfer structure during operation of the apparatus, said heat transfer structure being movable relative to said heat conducting structure, and wherein the heat transfer structure is supported by the gas filled gap region during operation of the apparatus, and wherein said heat transfer structure is supported by the gas filled gap region during operation of the apparatus;
    wherein said heat transfer structure is rotatable about an axis of rotation, and wherein said heat transfer structure, when rotating, imparts motion to said surrounding medium in a direction substantially parallel to the axis of rotation; and wherein said surrounding medium comprises air, and said heat transfer structure provided to generate air flow through a duct of an HVAC system.

14. An apparatus comprising:
a heat conducting structure for thermally coupling the apparatus to a thermal load, the heat conducting structure comprising a first cylindrical tube;
a heat transfer structure immersed in a surrounding medium and rotatably coupled to said heat conducting structure, the heat transfer structure comprising a second cylindrical tube surrounding a plurality of interior fins, the second cylindrical tube disposed inside the first cylindrical tube, the heat transfer structure is rotatable about an axis or rotation, and wherein rotation of said heat transfer structure cause said surrounding medium to flow substantially along the axis of rotation;
a gas bearing between said heat conducting structure and said heat transfer structure, the gas bearing comprising a gas-filled gap between abutting surfaces of the heat transfer structure and heat conducting structure when the heat transfer structure is rotated, wherein the heat transfer structure further includes a centrifugal flexure to, at least in part, regulate a dimension of said gas bearing.

15. The apparatus of claim 14, wherein said heat transfer structure includes, at least in part, a hollow cavity containing a working fluid, and wherein centrifugal force generated by motion of said heat transfer structure pumps said working fluid in a radially outward direction.

16. The apparatus of claim 14, wherein said plurality of interior fins are twisted along a length of the cylindrical tube.

17. An apparatus comprising:
a heat conducting structure;
a heat transfer structure immersed in a surrounding medium, said heat transfer structure being coupled to said heat conducting structure using a as filled gap region which forms between said heat conducting structure and said heat transfer structure during operation of the apparatus, said heat transfer structure being movable relative to said heat conducting structure, and wherein the heat transfer structure is supported by the gas filled gap region during operation of the apparatus;
a threaded end bell coupled to said heat transfer structure;
a motor to move said heat transfer structure relative to said heat conducting structure; and
a threaded spindle coupled to the motor and positioned to thread into and out of said threaded end bell during operation, such that a height of said gas filled gap region is set by a geometry of the threaded end bell and the threaded spindle when the heat transfer structure has substantially low angular momentum.

18. The apparatus of claim 17, wherein said threaded end bell at least partially defines an opening to circulate air through at least a portion of said motor.

19. A method of dissipating heat from a thermal load, wherein the thermal load is in thermal contact with a heat conducting structure, the method comprising:
providing a first gas bearing between a first heat transfer structure and the heat conducting structure, the first gas bearing forming a gap between abutting surfaces of the first heat transfer structure and heat conducting structure when the first heat transfer structure is rotated at or above a threshold speed relative the heat conducting structure, the abutting surfaces being in physical contact when the first heat transfer structure is stationary;
transferring heat from the heat conducting structure to the first heat transfer structure across the gap;
maintaining the gap by rotating the first heat transfer structure relative to the heat conducting structure at a speed equal to or above the threshold speed;
providing a second gas bearing between a second heat transfer structure and the heat conducting structure; and
moving the second heat transfer structure through the surrounding medium relative to the heat conducting structure.

20. The method of claim 19, wherein the first heat transfer structure is rotated about a common center axis of the heat transfer structure and the heat conducting structure.

21. The method of claim 20, wherein the heat transfer structure, when rotated, moves the surrounding medium in a direction substantially perpendicular to the axis of rotation.

22. The method of claim 20, wherein the heat transfer structure, when rotated, moves the surrounding medium in a direction substantially parallel to the axis of rotation.

23. The method of claim 19, wherein the first heat transfer structure is rotated in a first direction and moving the second heat transfer structure comprises moving the second heat transfer structure in a second, different, direction.

24. The method of claim 19, further comprising circulating a working fluid through a hollow cavity defined, at least in part, by the heat conducting structure.

* * * * *